(12) United States Patent
Xiong et al.

(10) Patent No.: US 11,904,389 B2
(45) Date of Patent: Feb. 20, 2024

(54) SCALABLE ELECTRICALLY CONDUCTIVE NANOWIRES BUNDLE-RING-NETWORK FOR DEFORMABLE TRANSPARENT CONDUCTOR

(71) Applicant: NANYANG TECHNOLOGICAL UNIVERSITY, Singapore (SG)

(72) Inventors: Jiaqing Xiong, Singapore (SG); Pooi See Lee, Singapore (SG)

(73) Assignee: NANYANG TECHNOLOGICAL UNIVERSITY, Singapore (SG)

(*) Notice: Subject to any disclaimer, the term of this patent is extended or adjusted under 35 U.S.C. 154(b) by 760 days.

(21) Appl. No.: 16/977,994

(22) PCT Filed: Mar. 8, 2019

(86) PCT No.: PCT/SG2019/050129
§ 371 (c)(1),
(2) Date: Sep. 3, 2020

(87) PCT Pub. No.: WO2019/172851
PCT Pub. Date: Sep. 12, 2019

(65) Prior Publication Data
US 2021/0016349 A1 Jan. 21, 2021

(30) Foreign Application Priority Data
Mar. 8, 2018 (SG) ............................ 10201801967Q

(51) Int. Cl.
*B22F 3/00* (2021.01)
*B22F 5/00* (2006.01)
(Continued)

(52) U.S. Cl.
CPC ................ *B22F 3/002* (2013.01); *B05D 5/00* (2013.01); *B22F 5/006* (2013.01); (Continued)

(58) Field of Classification Search
CPC .................................. B82Y 40/00; B05D 5/00
See application file for complete search history.

(56) References Cited

U.S. PATENT DOCUMENTS

2018/0251370 A1    9/2018 Maurer et al.

FOREIGN PATENT DOCUMENTS

| CN | 105271110 A | 1/2016 |
|---|---|---|
| KR | 10-2018-0004585 A | 1/2018 |
| WO | WO-2017/042094 A1 | 3/2017 |

OTHER PUBLICATIONS

Lim G-H, et al., Curbing silver nanowires using liquid droplets for highly stretchable and durable percolation networks, Nanoscale, 2017, 9, 8938.*

(Continued)

*Primary Examiner* — James M Mellott
(74) *Attorney, Agent, or Firm* — Alston & Bird LLP

(57) ABSTRACT

A method of producing a transparent conductive electrode is provided. The method comprises spraying a suspension of electrically conductive nanowires on a polymer substrate to form droplets thereon, wherein each of the droplets has a periphery which is in contact with one or more peripheries of another droplet, wherein the suspension comprises a polar solvent, wherein the polymer substrate and the polar solvent produce a surface tension which directs the electrically conductive nanowires to accumulate at the periphery of each of the droplets to form a network of connected ring structures, and removing the polar solvent from the polymer substrate to form a micromesh comprising the electrically conductive nanowires which are retained in the form of the network of connected ring structures. The transparent conductive electrode and its uses are also provided.

18 Claims, 71 Drawing Sheets

(51) Int. Cl.
   *B05D 5/00* (2006.01)
   *B82Y 40/00* (2011.01)
(52) U.S. Cl.
   CPC .................. *B22F 2304/054* (2013.01); *B22F 2304/056* (2013.01); *B82Y 40/00* (2013.01)

(56) References Cited

OTHER PUBLICATIONS

Cheong et al., *Silver Nanowire Network Transparent Electrodes with Highly Enhanced Flexibility by Welding for Applicant in Flexible Organic Light-Emitting Diodes*, ACS Appl. Mater. Inter. 2014, 6, 7846.
Yu et al. *Silver Nanowire-Polymer Composite Electrodes for Efficient Polymer Solar Cells*, Adv. Mater. 2011, 23, 4453.
Khaligh et al., *Silver nanowire transparent electrodes for liquid crystal-based smart windows*, Sol. Energy Mater. Sol. Cells 2015, 132, 337-341.
Han et al., *Uniform Self-Forming Metallic Network as a High-Performance Transparent Conductive Electrode*, Adv. Mater. 2014, 26, 873-877.
Hayes et al., *Letters to Nature*, Nature 2003, 425, 383-385.
Sannicolo et al., *Metallic Nanowire-Based Transparent Electrodes for Next Generation Flexible Devices: a Review*, Small 2016, 12, 6052-6075.
Hecht et al., *Emerging Transparent Electrodes Based on Thin Films of Carbon Nanotubes, Graphene, and Metallic Nanostructures*, Adv. Mater. 2011, 23, 1482-1513.
Hellstrom et al., *Polymer-Assistend Direct Deposition of Uniform Carbon Nanotube Bundle Networks for High Performance Transparent Electrodes*, ACS Nano 2009, 3, 1423-1430.
Bae et al., *Roll-to-roll production of 30-inch graphene films for transparent electrodes*, Nat Nano, Aug. 2010, vol. 5, 574-578.
Wu et al., *A transparent electrode based on a metal nanotrough network*, Nat Nano, Jun. 2013, vol. 8, 421-425.
Van De Groep et al., *Transparent Conducting Silver Nanowire Networks*, Nano Lett. 2012, vol. 12, 3138-3144.
De, S. et al., *Silver Nanowire Networks as Flexible Transparent, Conducting Films: Extremely High DC to Optical Conductivity Ratios*, ACS Nano 2009, vol. 3, No. 7, 1767-1774.
Hu, L. et al., *Scalable Coating and Properties of Transparent, Flexible, Silver Nanowire Electrodes*, ACS Nano 2010, 4, 2955-2963.
Gao, J.W. et al., *Transparent Nanowire Network Electrode for Textured Semiconductors*, Small 2013, 9, No. 5, 733-737.
Leem, D-S. et al., *Efficient Organic Solar Cells with Solution-Processed Silver Nanowire Electrodes*, Adv. Mater. 2011, 23, 4371-4375.
Yang, L. et al., *Solution-Processed Flexible Polymer Solar Cells with Silver Nanowire Electrodes*, ACS Appl. Mater. Inter. 2011, 3, 4075-4084.
Tokuno, T. et al., *Transparent Electrodes Fabricated via the Self-Assembly of Silver Nanowires Using a Bubble Template*, Langmuir 2012, 28, 9298-9302.
Layani. M. et al., *Transparent Conductive Coatings by Printing Coffee Ring Arrays Obtained at Room Temperature*, ACS Nano 2009, 3, 3537-3542.
Peng, Q. et al., *Colossal Figure of Merit in Transparent-Conducting Metallic Ribbon Networks*, Adv. Mater. Technol. 2016, 1-4.
Xian, Z. et al., *A Practical ITO Replacement Strategy: Sputtering-Free Processing of a Metallic Nanonetwork*, Adv. Mater. Technol. 2017, 1-6.
Klemm, D. et al., *Nanocelluloses; A New Family of Nature-Based Materials*, Chem. Int. Edit. 2011, 50, 5438-5466.
Kang, W. et al., *Highly Transparent Conducting Nanopaper for Solid State Foldable Electrochromic Devices*, Small 2016, 12, No. 46, 6370-6377.
Nogi, M. et al., *Optically Transparent Nanofiber Paper*, Adv. Mater. 2009, 21, 1595-1598.
Huang, J. et al., *Highly Transparent and Flexible Nanopaper Transistors*, ACS Nano 2013, vol. 7, No. 3, 2106-2113.
Fujisaki, Y. et al., *Transparent Nanopaper-Based Flexible Organic Thin-Film Transistor Array*, Adv. Funct. Mater. 2014, 24, 1657-1663.
Leger, L. et al., *Liquid Spreading*, Rep. Prog. Phys. 1992, 55, 431-486.
Toivakka, M., *Numerical investigation of droplet impact spreading in spray coating of paper*, presented at Spring Advanced Coating Fundamentals Symposium, 2003, 1/14-14/14.
Levich, V. et al., *Surface-Tension-Driven Phenomena*, Annu. Rev. Fluid Mech. 1969, 1, 293.
Dussan, E. B., *On The Spreading Of Liquids On Solid Surfaces: Static And Dynamic Contact Lines*, Annu. Rev. Fluid Mech. 1979, 11, 371-400.
Svitova, T. et al., *Trisiloxane Surfactants: Surface/Interfacial Tension Dynamics and Spreading on Hydrophobic Surfaces*, Annu. Rev. Fluid Mech. 1979, 11, 371-400.
Zhang, X. et al., *Dynamic Surface Tension Effects in Impact of a Drop with a Solid Surface*, Journal of Colloid Interface Science 1997, 187, 166-178.
Lin, S.P. et al., *Drop And Spray Formation From A Liquid Jet*, Annu. Rev. Fluid Mech. 1998, 30, 85-105.
Rein, M., *Phenomena of liquid drop impact on solid and liquid surfaces*, Fluid Dynamics Research 1993, 12, 61-93.
Blaber, M. et al., *Search for the Ideal Plasmonic Nanoshell: The Effects of Surface Scattering and Alternatives to Gold and Silver*, J. Phys. Chem. C 2009, 113, 3041-3045.
Gall, D. et al., *Electron mean free path in elemental metals*, J. Appl. Phys. 2016, 119, 085101.
Ye, Y. et al, *Resonant scattering of green light enabled by Ag@Tio2 and its application in a green light projection screen*, Nanoscale 2018, 5, 2438-2446.
Berciaud, S. et al., *Observation of Intrinsic Size Effects in the Optical Response of Individual Gold Nanoparticles*, Nano Lett. 2005, vol. 5, No. 3, 515-518.
Lim, G-H. et al., *Curving silver nanowires using liquid droplets for highly stretchable and durable percolation networks*. Nanoscale, Jun. 7, 2017, vol. 9, pp. 8938-8944.
Wang, X. et al., *Transparent arrays of silver nanowire rings driven by evaporation of sessile droplets*, Journal of Physics D: Applied Physics, Oct. 13, 2017, vol. 50, No. 45, pp. 455302.
Seong, B. et al., *Self-Assembly of Silver Nanowire Ring Structures Driven by the Compressive Force of a Liquid Droplet*, Langmuir, Mar. 13, 2017, vol. 33, No. 14, pp. 3367-3372.
Koga, H. et al., *Uniformly connected conductive networks on cellulose nanofiber paper for transparent paper electronics*, NPG Asia Materials, Mar. 21, 2014, vol. 6, No. e93, pp. 1-8.
Xiong, J. et al., *A Deformable and Highly Robust Ethyl Cellulose Transparent Conductor with a Scalable Silver Nanowires Bundle Micromesh*, Advanced Materials, Jul. 13, 2018, vol. 30, No. 36, pp. 1802803.

* cited by examiner

| Size of AgNWs | 20 nm, 20 μm | 30 nm, 20-50 μm | 40 nm, 20-50 μm | 50 nm, 20-50 μm | 100 nm, 20-50 μm |
|---|---|---|---|---|---|
| Sheet resistance (ohm/sq) | 26-32 | 27-38 | 22-32 | 22-35 | 25-37 |

A

B

C

SCALABLE ELECTRICALLY CONDUCTIVE NANOWIRES BUNDLE-RING-NETWORK FOR DEFORMABLE TRANSPARENT CONDUCTOR

CROSS-REFERENCE TO RELATED APPLICATIONS

The present application is a national phase entry of PCT/SG2019/050129, filed on 8 Mar. 2019, which claims the benefit of priority of Singapore Patent Application No. 10201801967Q filed on 8 Mar. 2018, the content of it being hereby incorporated by reference in its entirety for all purposes.

TECHNICAL FIELD

The present disclosure relates to a transparent conductive electrode and its method of production.

BACKGROUND

Transparent conductive electrodes with high electrical conductivity and optical transmittance are essential for modern optoelectronic devices, such as light emitting diode (LED)-based light sources, solar cells, smart windows, displays, electronic paper devices, etc. Further, these display applications need the transparent electrodes to be optically uniform and dense with low optical haze. Currently, doped metal oxide films, such as tin-doped indium oxide (ITO) and fluorine-doped tin oxide (FTO), dominate the industry. While they may be chemically stable and may form continuous transparent conductors, they still suffer from several drawbacks, which include fluctuating prices, scarcity of materials, brittleness, high processing temperatures, etc. In addition, the next generation of optoelectronic devices requires transparent conductive electrodes to be highly conductive and transparent with low haze, and also mechanically flexible and foldable, and feasible for large-scale manufacturing. To address one or more of these issues, various nanomaterials, such as carbon nanotubes, graphene, metallic nanowires and metallic grids have been developed, of which metallic nanowires possess optoelectronic advantages with low-cost manufacturing, rendering it a likely substitute for ITO.

Tremendous efforts have brought about significant improvements in the performance of metallic nanowire networks. In particular, silver networks have been proposed for applications in touch-screen displays and photovoltaic devices. Silver metallic networks are normally deposited as a thin film from solution to simply form a conductive layer. Several problems, however, such as the poor balance between optical and electrical conductivity, non-uniformity of the nanoparticles (and nanowires) and their poor distribution in a film, poor electrical contact between the nanoparticles (and nanowires) themselves as well as between the metallic network and a substrate, remain. Techniques have thus been developed to fabricate the metallic network structures, such as the bubble template, the coffee-ring effect template, and self-cracking template.

Unfortunately, these techniques are complicated due to the dependence on the various templates or poor surface adhesion. Moreover, the metallic network based on the bubble template was non-uniform and has weak adhesion with a substrate. The coffee-ring effect template was achieved by inkjet printing of metallic nanoparticles. However, poor inter-connections tend to occur between the nanoparticles, resulting in high junction resistance, which make the nanoparticles less attractive for fabricating high quality transparent conductor compared to nanowires. As for inkjet printing, it may not be effective for printing of nanowires, due to the larger dimensions of the nanowires. The self-cracking template (e.g. $TiO_2$, polymer sol-gel CA600, egg white, etc.) is a general technique to metallic crack-nanonetwork. It is realized by a tedious and non-economic process, including pre-coating, sacrificial layer coating and its self-cracking, plasma etching for selective removal of pre-coating, followed by sputtering and/or evaporation, electroplating, or electroless deposition, and full removal of the pre-coat, and finally using casting and transferring to obtain the transparent electrode. While the resultant transparent electrode from a self-cracking template shows good optoelectronics performance, the cost of manufacturing through such a template is undesirably higher compared to using ITO. Therefore, it remains a huge challenge to economically achieve scalable metallic nanowires network with good adhesion on flexible and/or foldable substrates for use in transparent conductor applications.

Apart from the conductive metallic nanowires network, a flexible and/or foldable substrate with optical properties suitable for supporting the conductive metallic nanowires network, is a vital component for forming the transparent conductive electrode. Conventionally, plastics, such as polyimide, polycarbonate (PC), or polyethylene terephthalate (PET), have been adopted for fabricating flexible transparent conductive electrode substrates.

More recently, use of nanocellulose for paper electronics has gained interest due to its numerous advantages, such as sufficient mechanical strength, ubiquitous abundance, biocompatibility, and tunable surface properties, etc., and especially its small dimension, which is way much smaller than the visible light wavelength that greatly reduces the forward and backward light scattering, rendering a dense nanopaper much more transparent than conventional paper. In addition, the excellent thermal stability and low thermal expansion coefficient render nanopaper compatible for manufacturing conditions that cannot be applied to traditional plastics.

There is thus a need to provide for a solution that ameliorates one or more of the limitations mentioned above. The solution should at least provide for a cellulose based transparent conductor that is deformable and serves as a promising replacement for ITO. The solution should also provide for a method of producing such a cellulose based transparent conductor at low cost.

SUMMARY

In one aspect, there is provided for a method of producing a transparent conductive electrode, the method comprising:

spraying a suspension of electrically conductive nanowires on a polymer substrate to form droplets thereon, wherein each of the droplets has a periphery which is in contact with one or more peripheries of another droplet, wherein the suspension comprises a polar solvent, wherein the polymer substrate and the polar solvent produce a surface tension which directs the electrically conductive nanowires to arrange at the periphery of each of the droplets to form a network of connected ring structures; and removing the polar solvent from the polymer substrate to form a micromesh comprising the electrically conductive nanowires which are retained in the form of the network of connected ring structures.

In another aspect, there is provided a transparent conductive electrode comprising:

a micromesh coated on or embedded in a transparent substrate, wherein the micromesh comprises electrically conductive nanowires arranged to form of a network of connected ring structures, wherein each of the ring structures is connected to at least one other ring structure by one or more knots, wherein each of the one or more knots is defined by an entanglement of the electrically conductive nanowires extending from each of the ring structures which are connected.

BRIEF DESCRIPTION OF THE DRAWINGS

The drawings are not necessarily to scale, emphasis instead generally being placed upon illustrating the principles of the invention. In the following description, various embodiments of the present disclosure are described with reference to the following drawings, in which:

FIG. 1A can also be used to demonstrate how a polymer substrate with AgNWs micromesh coated thereon can be fabricated (i.e. without transferring to the EC substrate). Specifically, FIG. 1A shows the forming mechanism of the AgNWs micromesh conductor. Inset is a schematic of spray-assisted self-assembly of AgNWs bundles from droplets of AgNWs.

FIG. 1H shows a SEM planar view image of AgNWs. Scale bar denotes 20 μm.

FIG. 1K shows photos demonstrating evaporation process of an AgNWs droplet (4 μL).

FIG. 2A shows micrographs of AgNWs network based on various diameters of AgNWs. The length of AgNWs are the same (20 μm). Scale bar denotes 10 μm.

Figure 2:
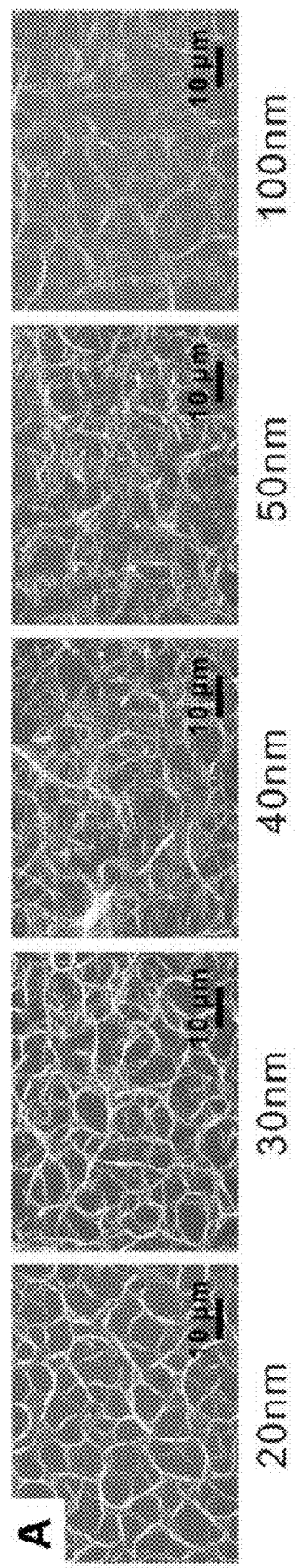
FIG. 2A shows the dependence of AgNWs micromesh on the AgNWs size. Specifically.
FIG. 2B shows networks of varying diameters of AgNWs prepared with similar sheet resistance for comparison of optoelectronic performance. The data is tabulated in the table.
FIG. 2C shows transmittance spectra of networks with varying AgNWs diameters. The transmittance measurement excludes the substrate.
FIG. 2D shows the transmittance taken at 550 nm wavelength for networks with varying diameters of AgNWs. The transmittance measurement excludes the substrate.
FIG. 2E shows the haze for networks with varying diameters of AgNWs. The haze measurement excludes the substrate.
FIG. 2F demonstrates the full transferability of AgNWs micromesh. Specifically, the top left image shows a half bare PET substrate after peeling of EC film with retention of half AgNWs micromesh. Scale bar denotes 20 μm. The top right image is a high-magnification image of the AgNWs micromesh with clear boundary for showing the complete transferability. Scale bar denotes 10 μm. The bottom left shows an atomic force microscopy (AFM) image of a typical AgNWs bundle micromesh. Scale bar denotes 5 μm. The bottom right graphs show the thickness of the AgNWs (1) bundles and (2) knot.
FIG. 2G shows SEM tilted image of the EC conductor with embedded AgNWs micromesh. Scale bar denotes 10 μm. The inset is a high resolution SEM image of an AgNW bundle. Scale bar denotes 200 nm.
FIG. 2H is an AFM image of the EC conductor with the corresponding surface roughness. Inserted curve represents the surface height across the marked white line. Scale bar denotes 4 μm.
FIG. 2I is a plot of $R_s$ and transmittance of micromesh as a function of the AgNWs density.
FIG. 2J shows the surface morphologies of random AgNWs network (left) and AgNWs micromesh (right). Scale bars denote 1 μm and 10 μm, respectively.
FIG. 2K is a plot of $R_s$ of the AgNWs micromesh and random AgNWs network as a function of the AgNWs density.
FIG. 2L is a plot of the transmittance (left) and haze (right) of the two conductive networks as a function of sheet resistance.
FIG. 2M shows the optoelectronic performance of AgNWs micromesh compared to reported works of transparent conductors, which include device-grade ITO, PEDOT:PSS, Ag film, AgNWs, Ag nanotrough, single-walled carbon nanotubes (SWCNTs), graphene, CuNWs, Ag grid, and Ag mesh.
FIG. 2N shows simulation models of random AgNWs network and AgNWs bundle (micromesh). The rightmost image in FIG. 2N is a top-down perspective of the AgNWs bundle (micromesh) shown in the center image, wherein the center image is a side view of the AgNWs bundle (micromesh).
FIG. 2O shows the simulation and measurement of transmittance of both conductive networks (micromesh structure (ring) and random network) in the visible wavelength range.
FIG. 2P shows the energy-dispersive X-ray spectroscopy (EDS) element mapping of EC conductor. Top left shows a SEM planar view image of AgNWs micromesh. Top right, bottom left, and bottom right images, represent those of carbon, oxygen and silver elements, respectively. Scale bars denote 20 μm. The Ag micromesh pattern in the top left image shows the clear conductive paths and the abundant open area for providing good optical performance.
FIG. 2Q shows comparison of the optoelectronic performance of PET and EC conductors with AgNWs micromesh. The top left is a SEM planar view image of the EC conductor with embedded AgNWs micromesh. The bottom left shows a SEM planar view images of PET conductor with sprayed/unembedded AgNWs micromesh. The top right and bottom right graphs show the transmittance and haze of the PET conductor and EC conductor, respectively. Transmittance and haze measurements include the substrates, with the aim to examine the optical advantages of the embedded micromesh with better flatness. Scale bars denote 10 μm.
Figure 2:
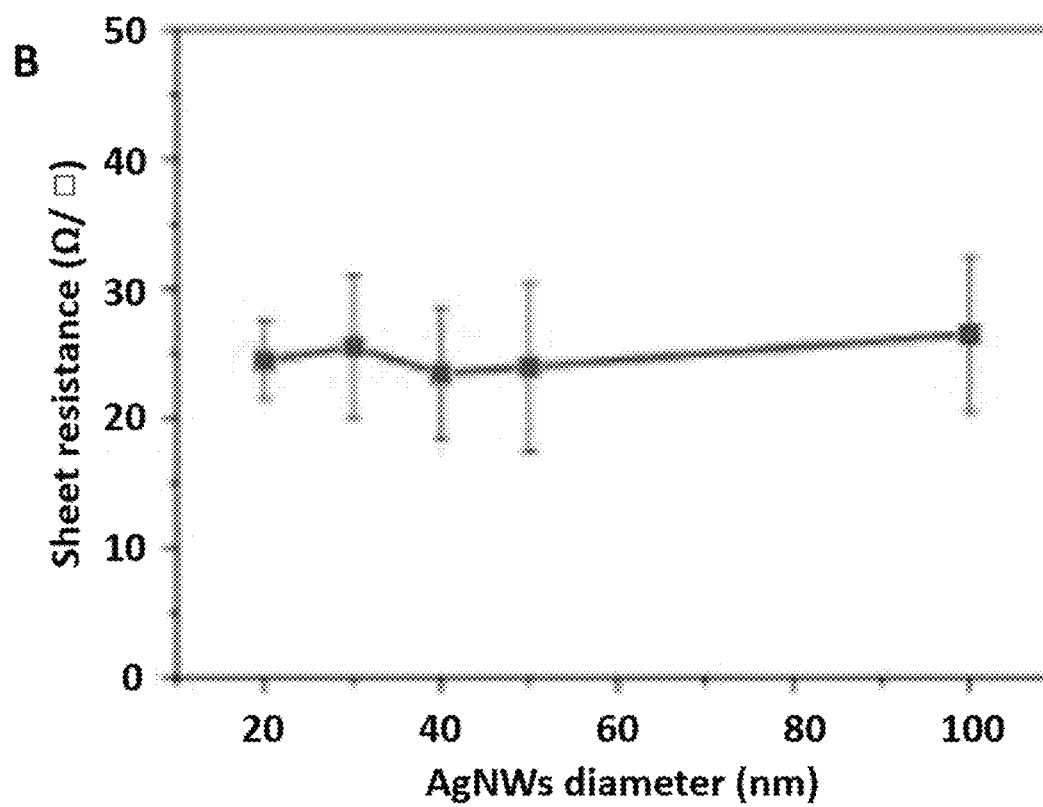
Figure 2:
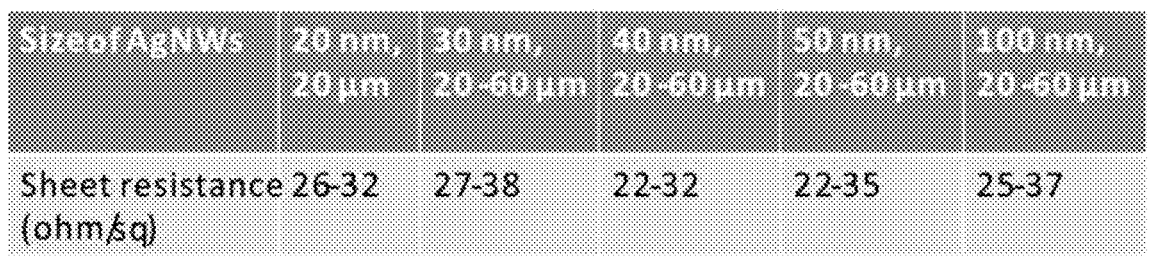
Figure 2:
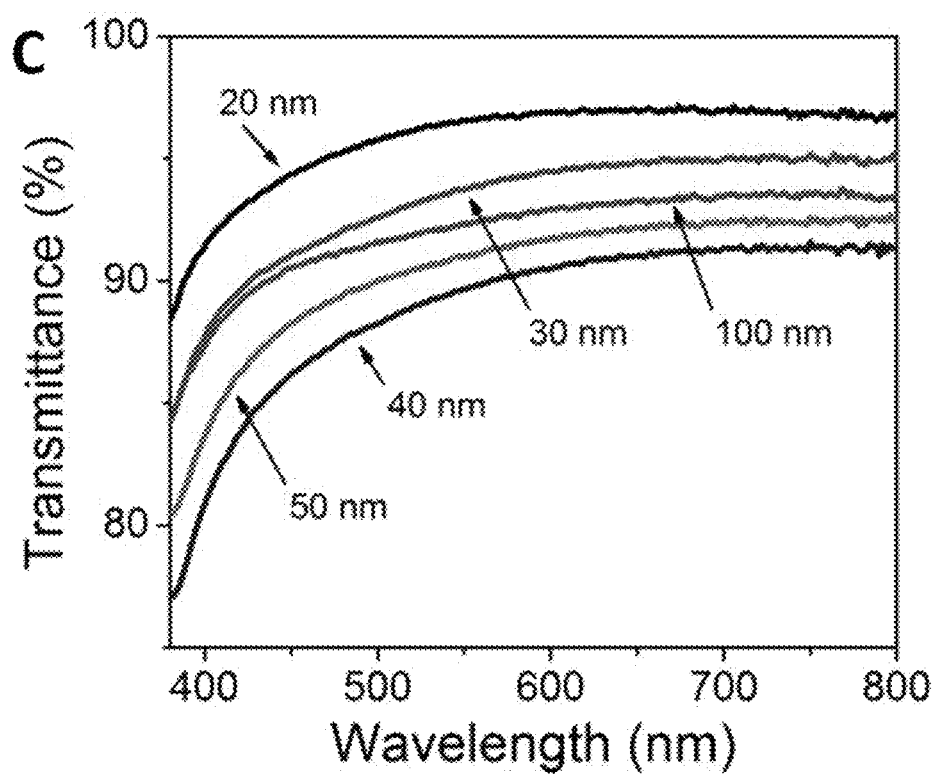
Figure 2:
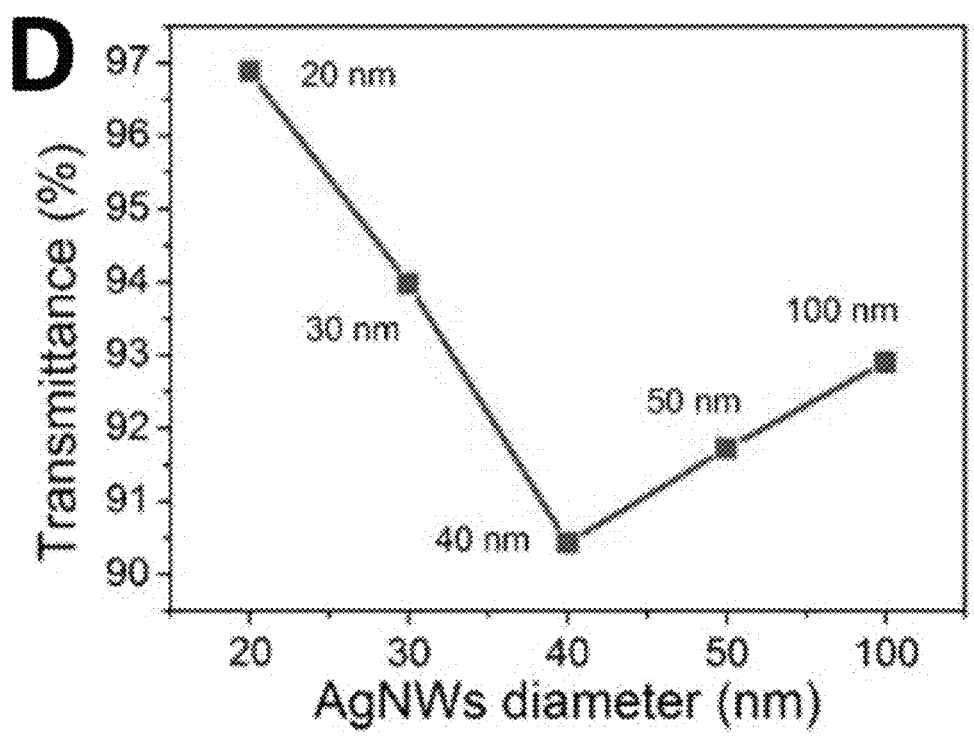
Figure 2:
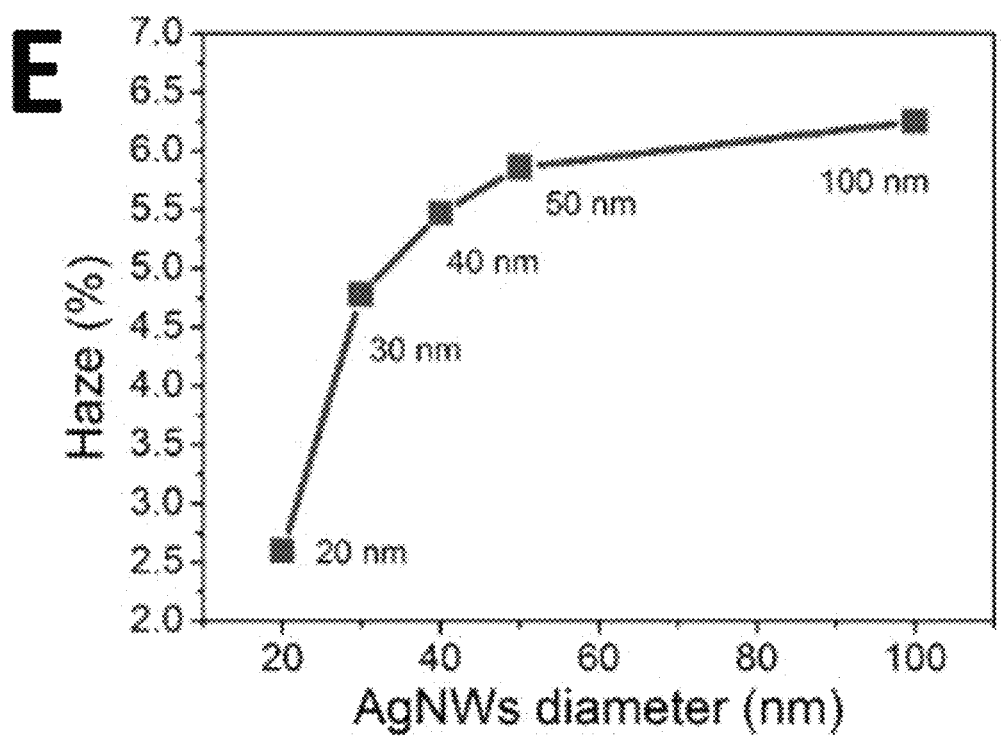
Figure 2:
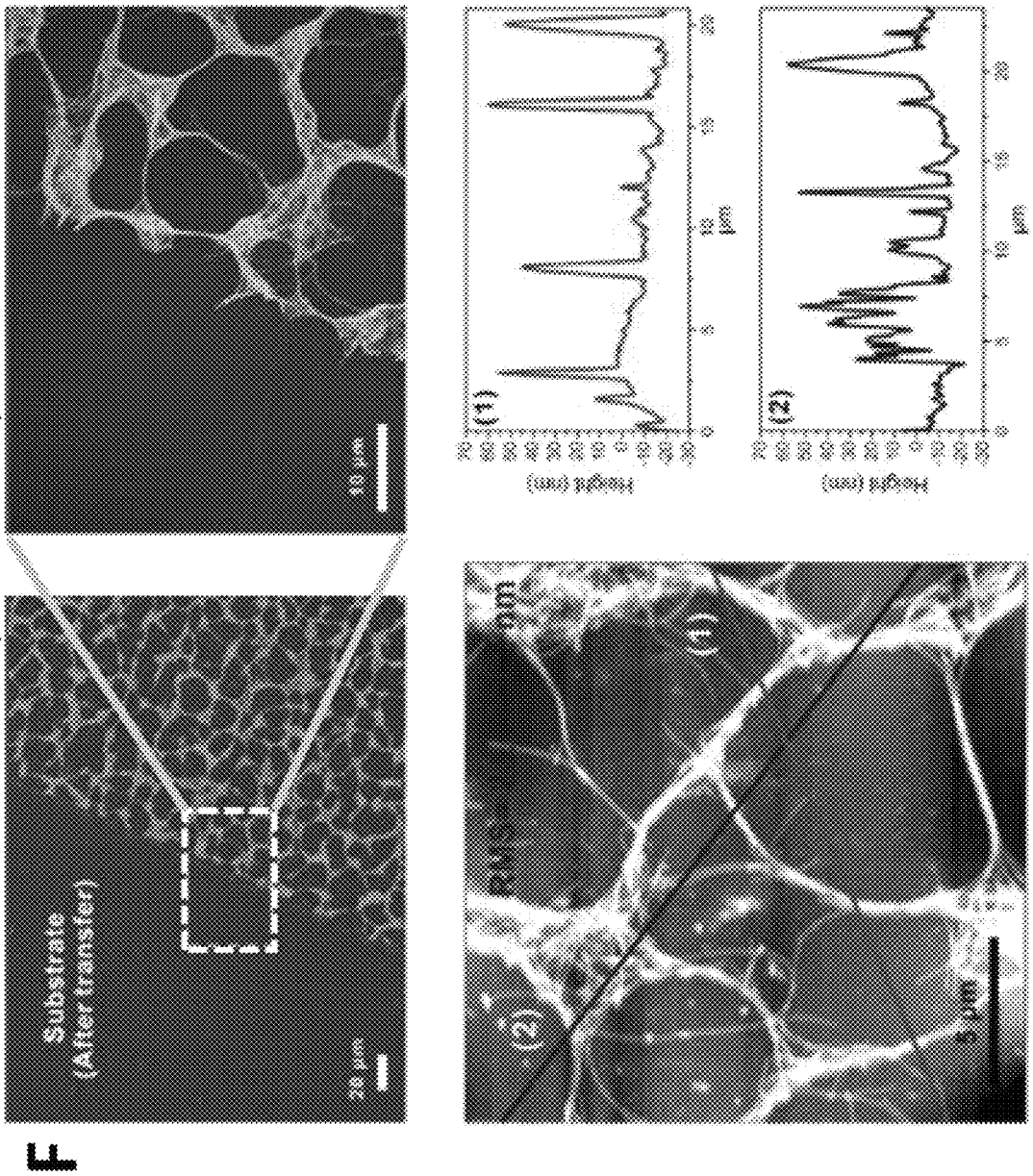
Figure 2:
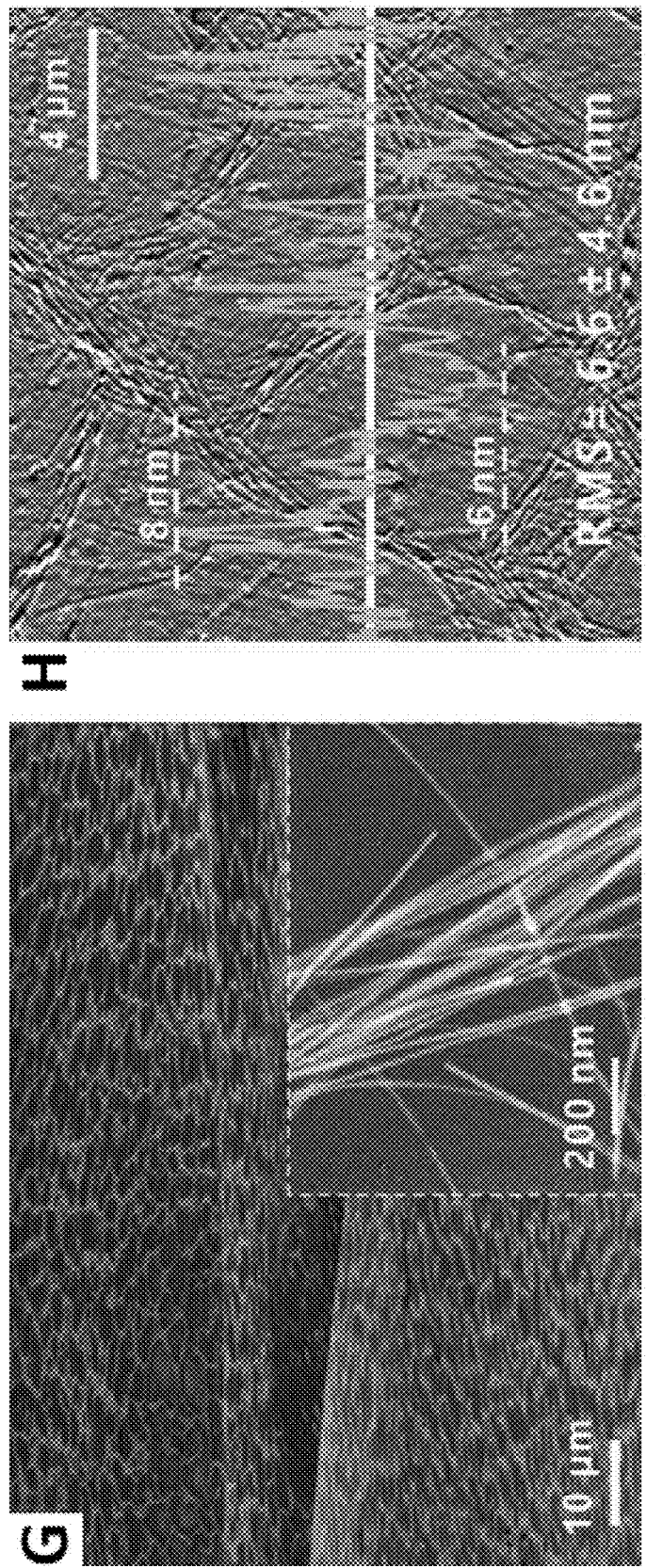
Figure 2:
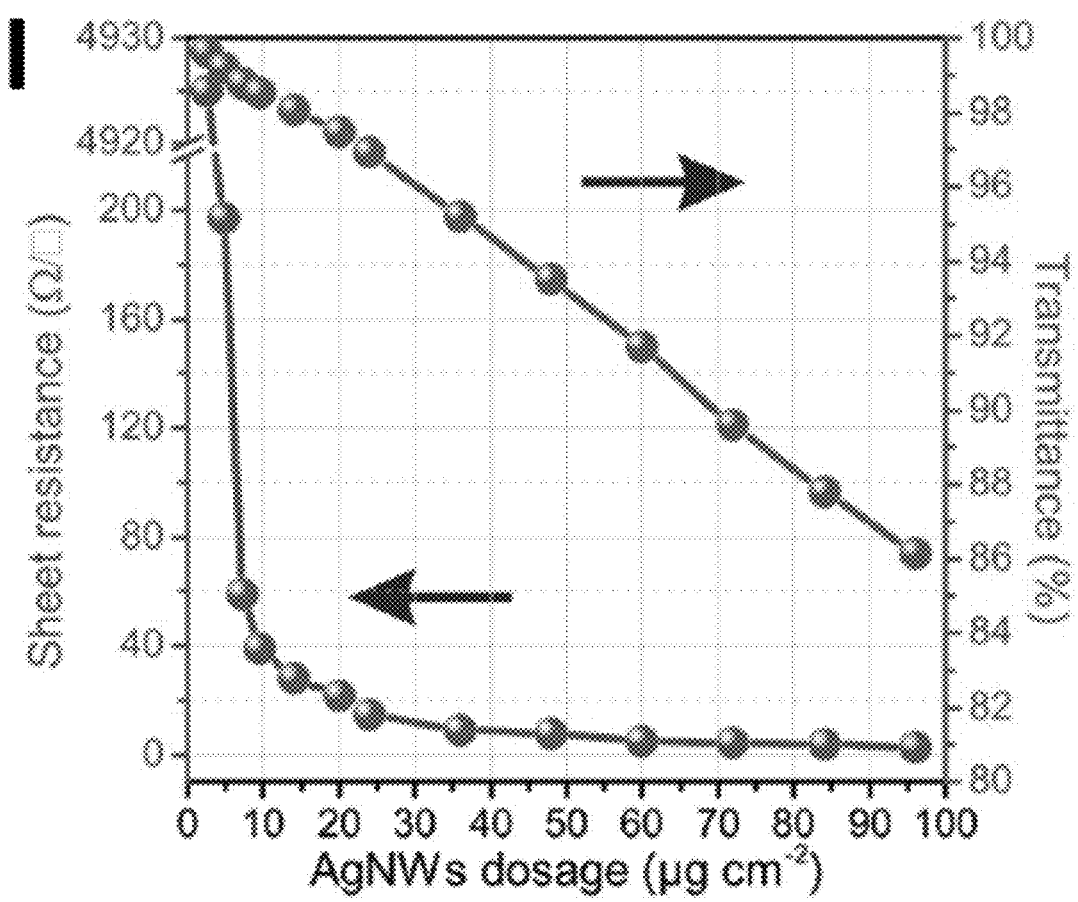
Figure 2:
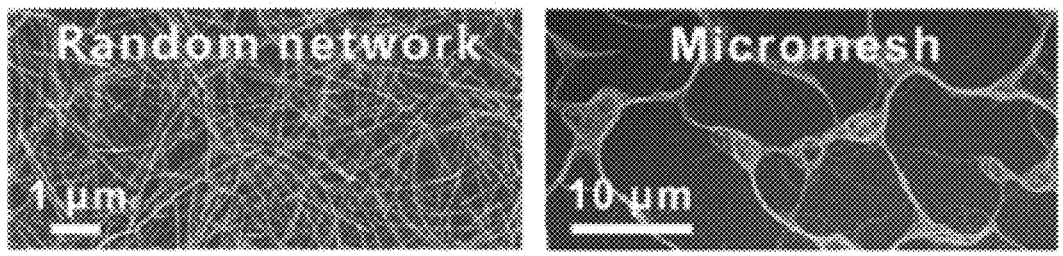
Figure 2:
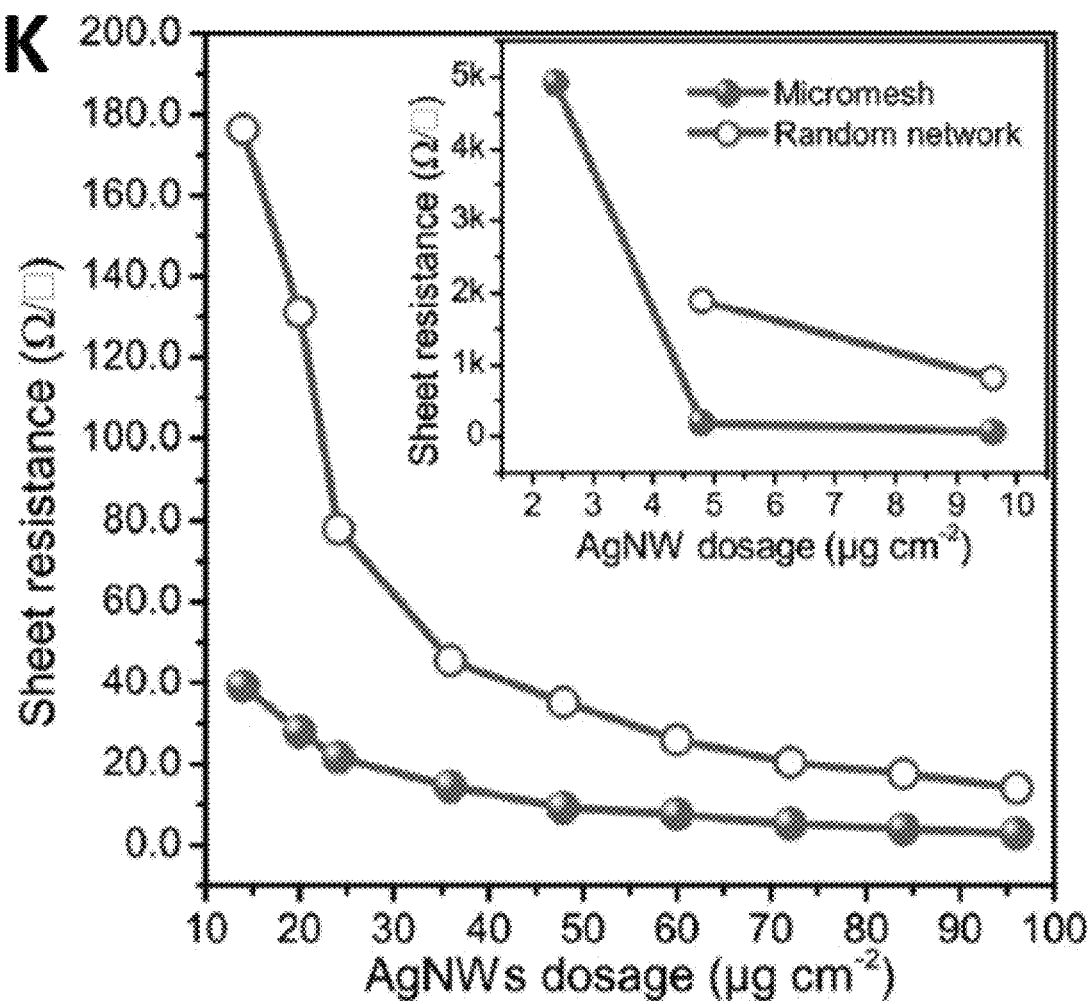
Figure 2:
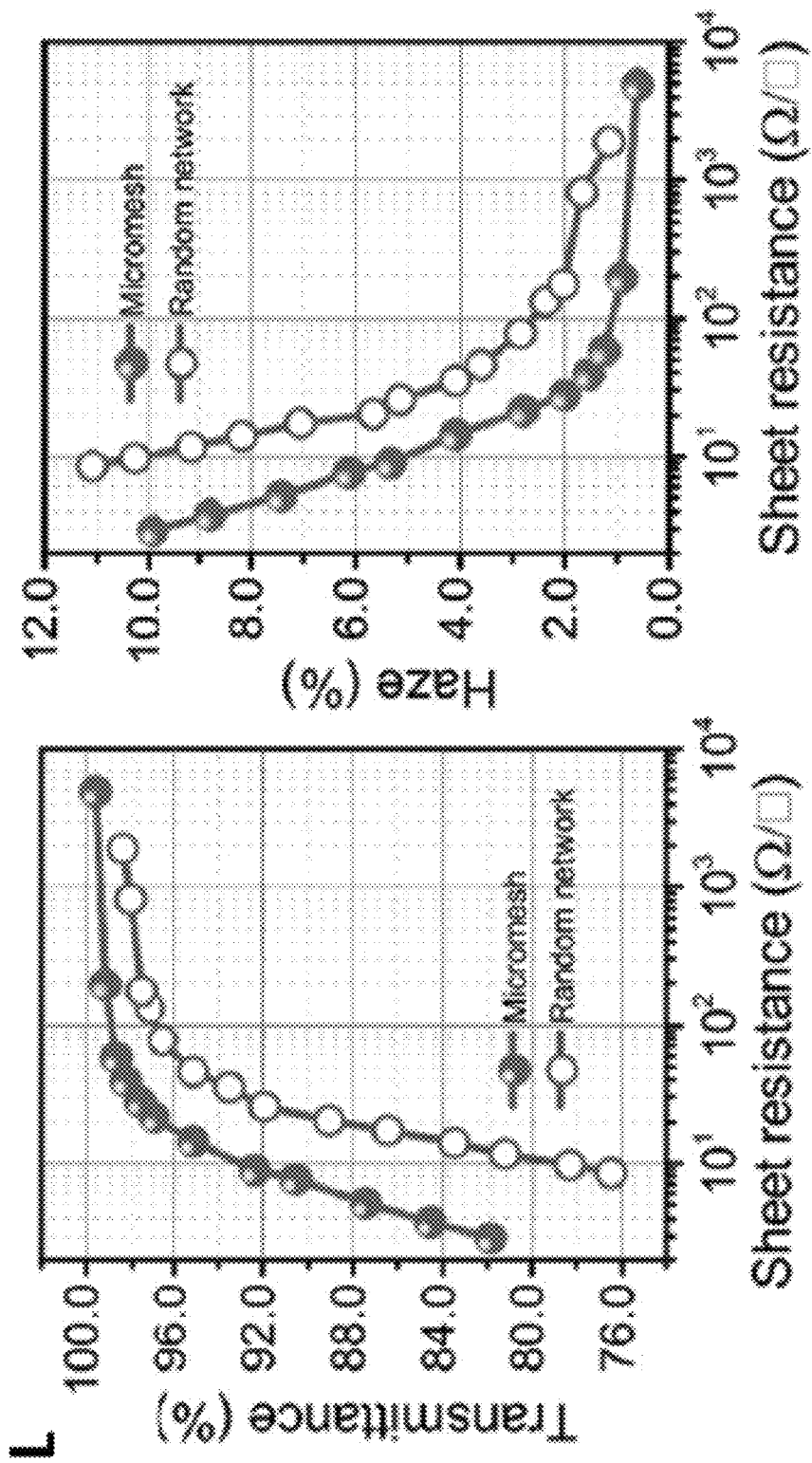
Figure 2:
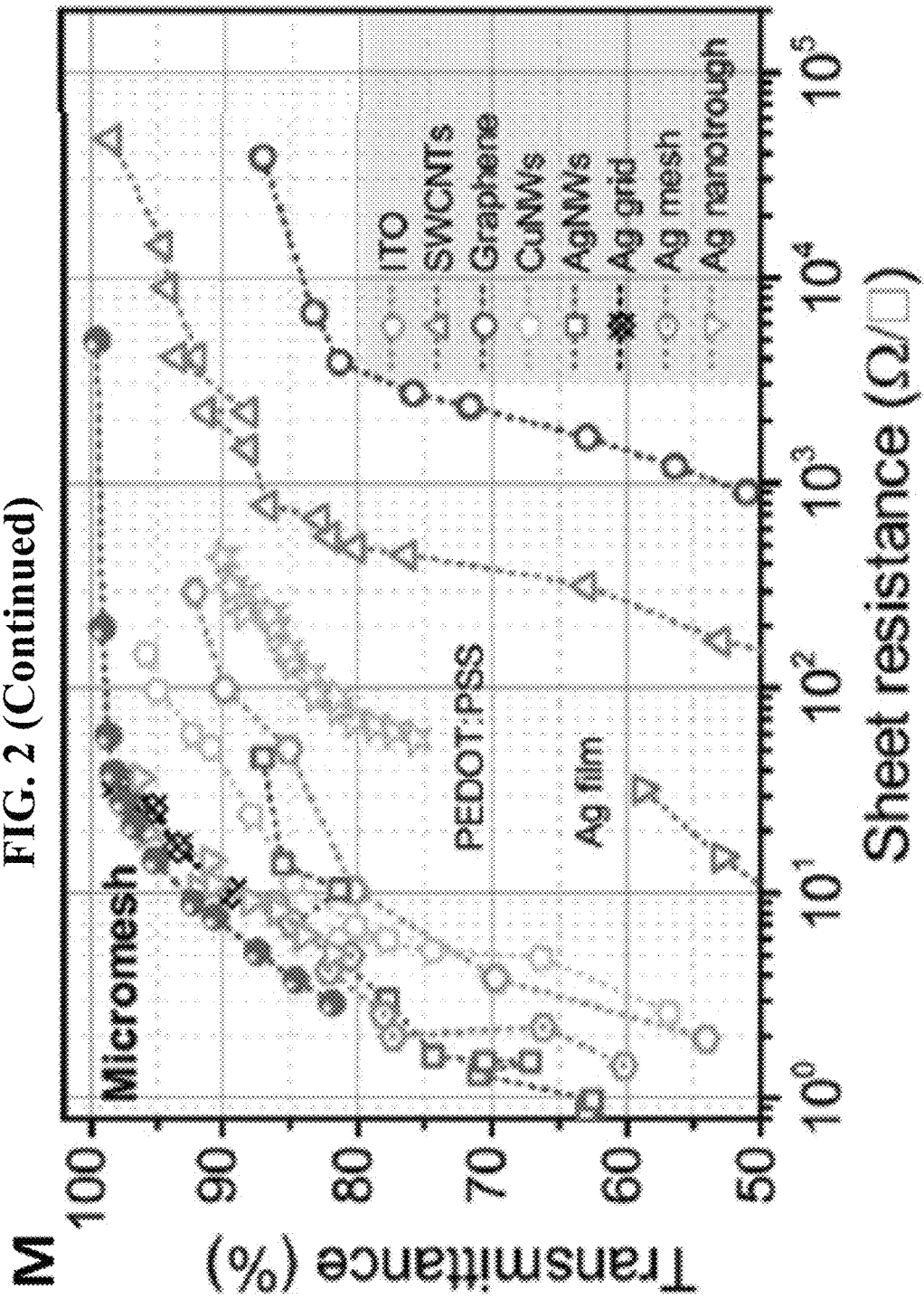
Figure 2:
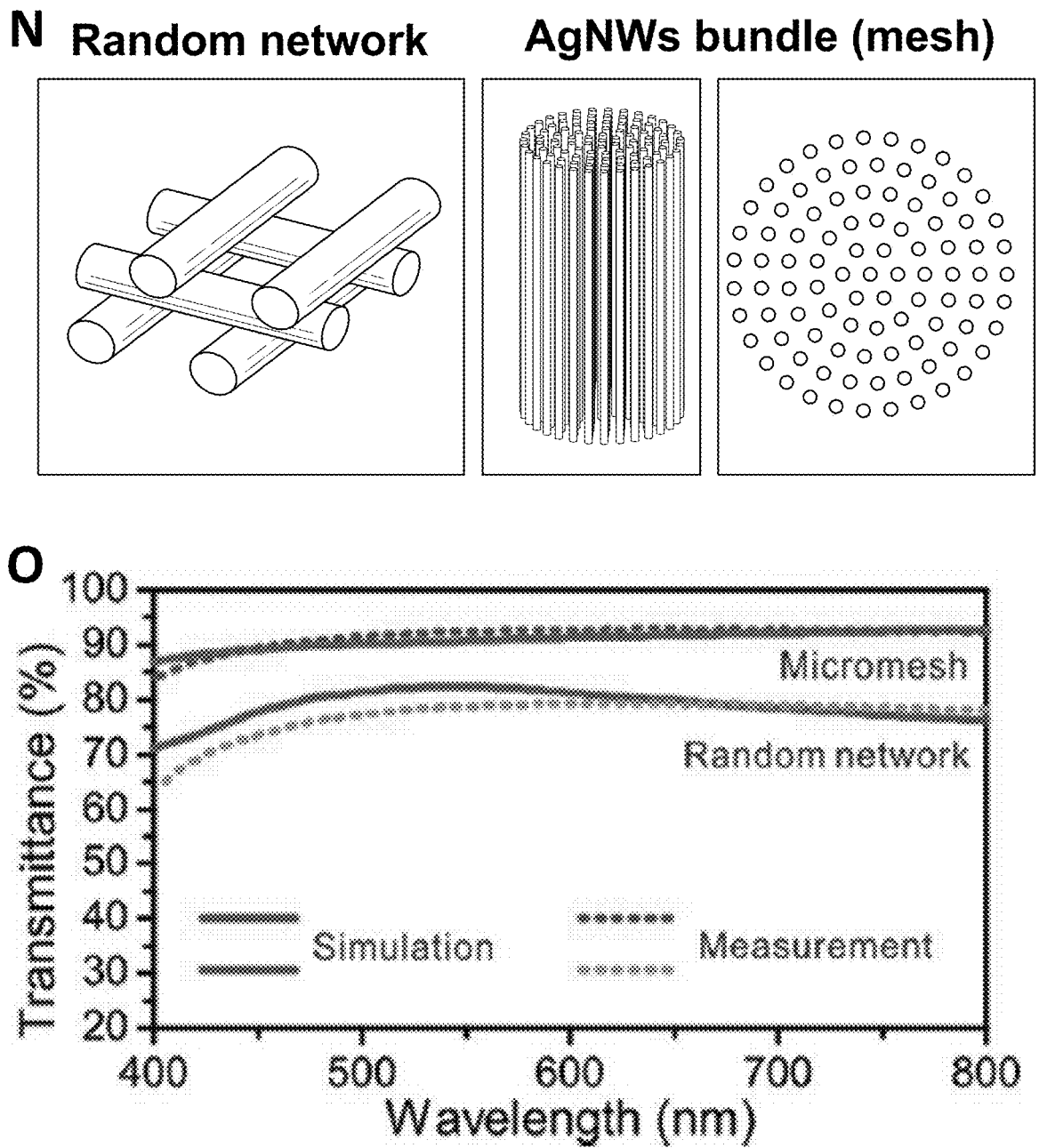
Figure 2:
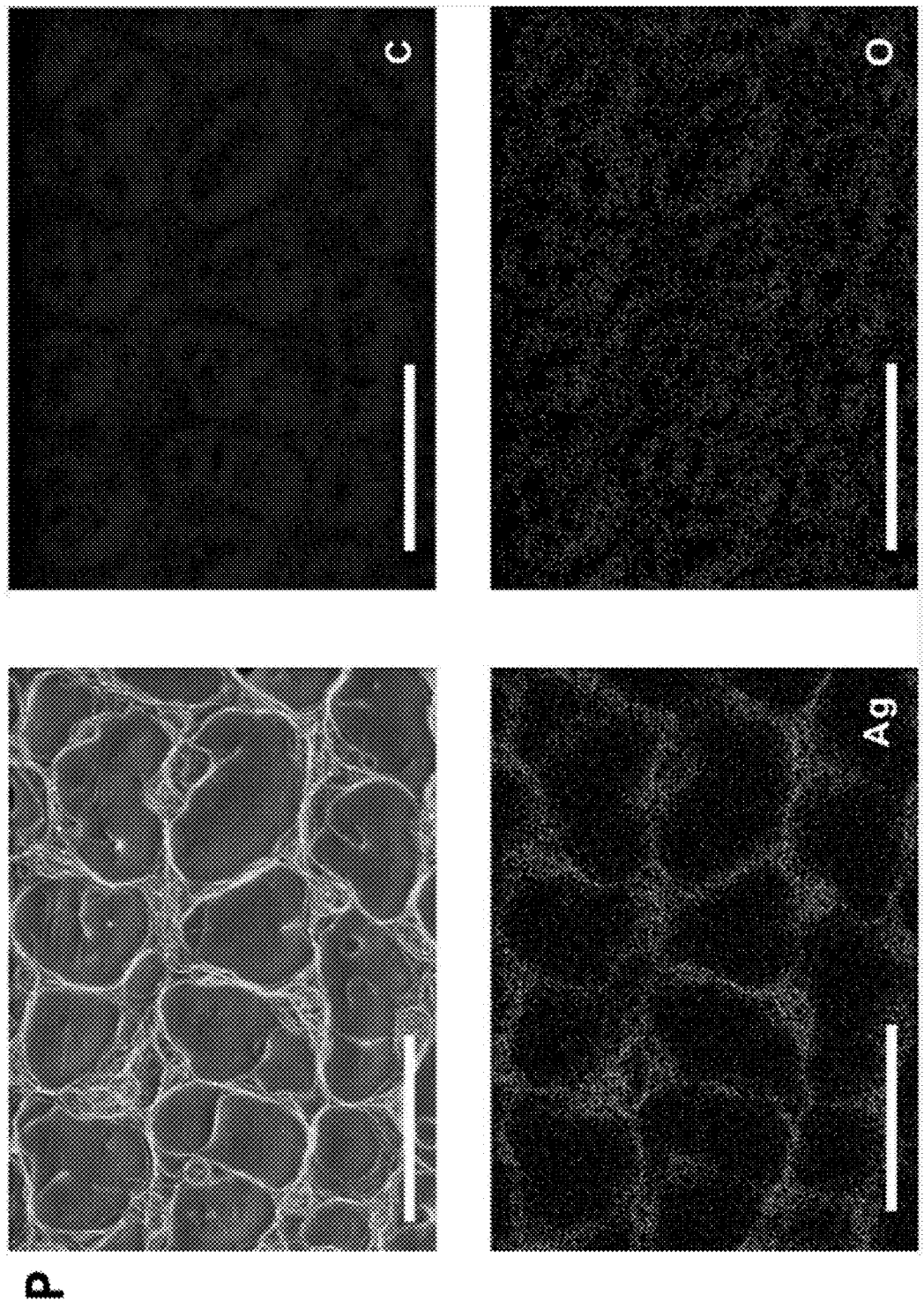
Figure 2:
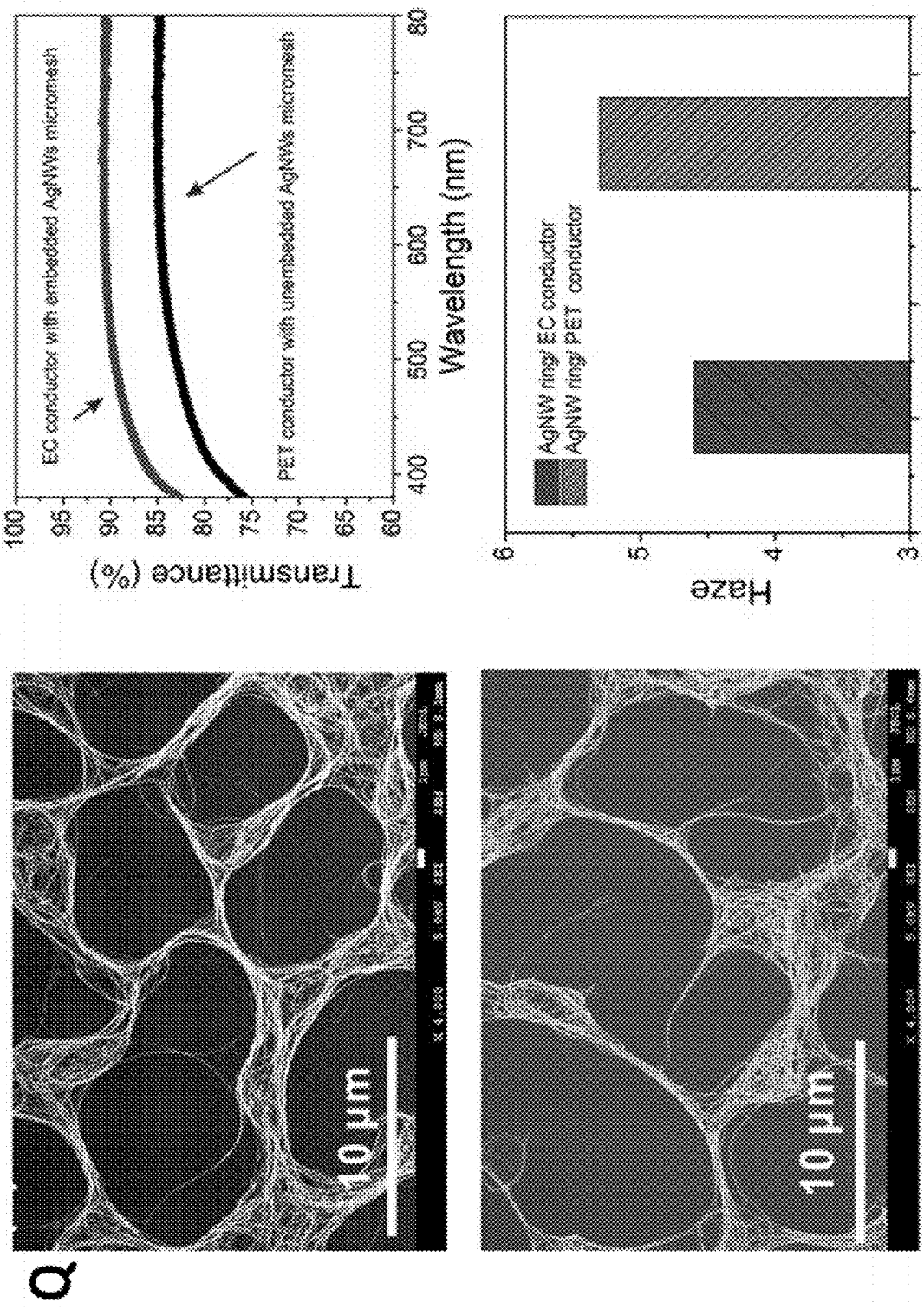

The droplet size can be controlled by tuning the spraying velocity, achieving the AgNWs bundle mesh with various optoelectronic performances. By consuming the same amount of AgNWs, the controllable spraying velocity can result in meshes with different optoelectronic performances. Nevertheless, the most effective way to tune the mesh performance is by controlling the dosage of AgNWs, as shown in FIG. 2I and FIG. 3K.

Figure 3:
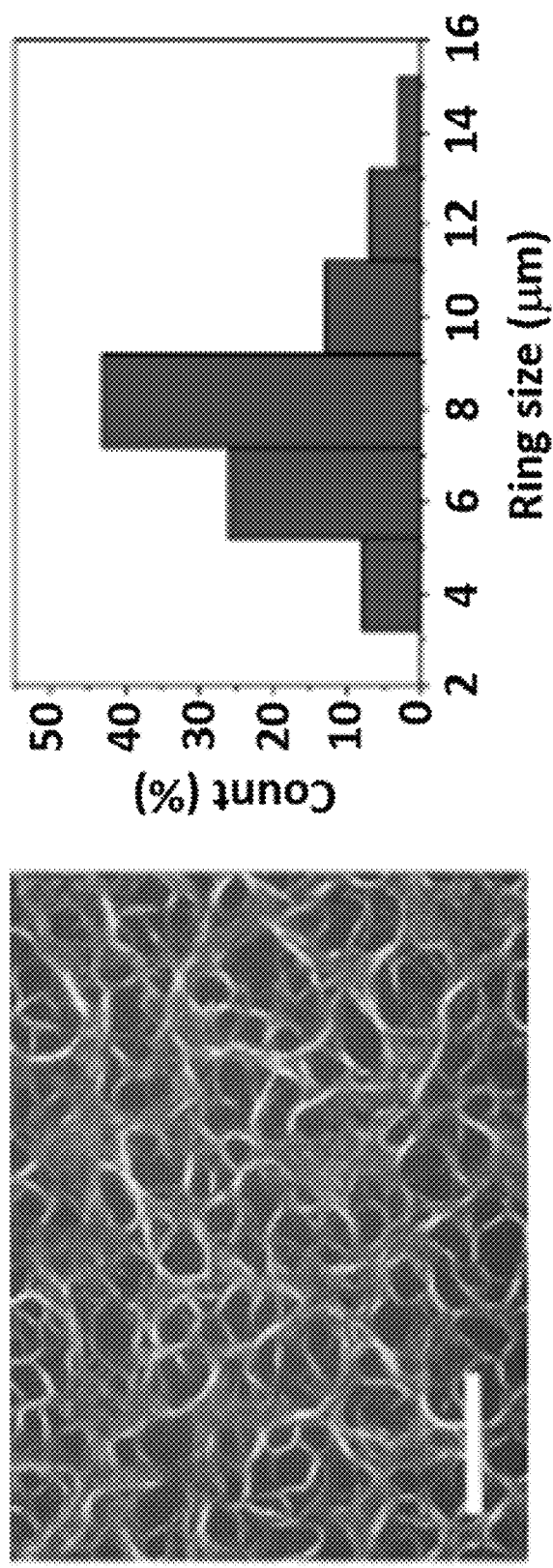
FIG. 3A shows a micrographs of AgNWs (20 nm) micromesh obtained using a spray velocity of 2 μL/s and the corresponding distribution of ring size. Scale bar denotes 20 μm.
FIG. 3B shows a micrographs of AgNWs (20 nm) micromesh obtained using a spray velocity of 5 μL/s and the corresponding distribution of ring size. Scale bar denotes 20 μm.
FIG. 3C shows a micrographs of AgNWs (20 nm) micromesh obtained using a spray velocity of 10 μL/s and the corresponding distribution of ring size. Scale bar denotes 20 μm.
FIG. 3D shows a micrographs of AgNWs (20 nm) micromesh obtained using a spray velocity of 15 μL/s and the corresponding distribution of ring size. Scale bar denotes 20 μm.
FIG. 3E shows a micrographs of AgNWs (20 nm) micromesh obtained using a spray velocity of 20 μL/s and the corresponding distribution of ring size. Scale bar denotes 20 μm.
FIG. 3F shows transmittance spectra of AgNWs micromesh fabricated via various spraying velocity. Transmittance measurements exclude the substrate.
FIG. 3G is a plot of sheet resistance of AgNWs micromesh based on the various spaying velocity. The sheet resistance ($R_s$) is highly affected by the opening ring size, and the controllable mesh size can be attained by tuning the droplet size via changing the spraying velocity. Spray-assisted self-assembly of the present method was realized based on an improved coffee-ring effect. Spraying can accelerate the evaporation of droplets, providing a stronger capillary flow to suppress the Marangoni effect, driving migration of AgNWs to the rim of the droplet, thereby achieving the AgNWs bundles deposited at the edges. As the coffee-ring effect continuously occurs in each droplet, a continuous conducting mesh could be generated. During this process, the AgNWs size concentration and solvent, spray temperature, and substrate can be fixed, then the droplet size becomes the factor that determines opening size of the mesh.
Figure 3:
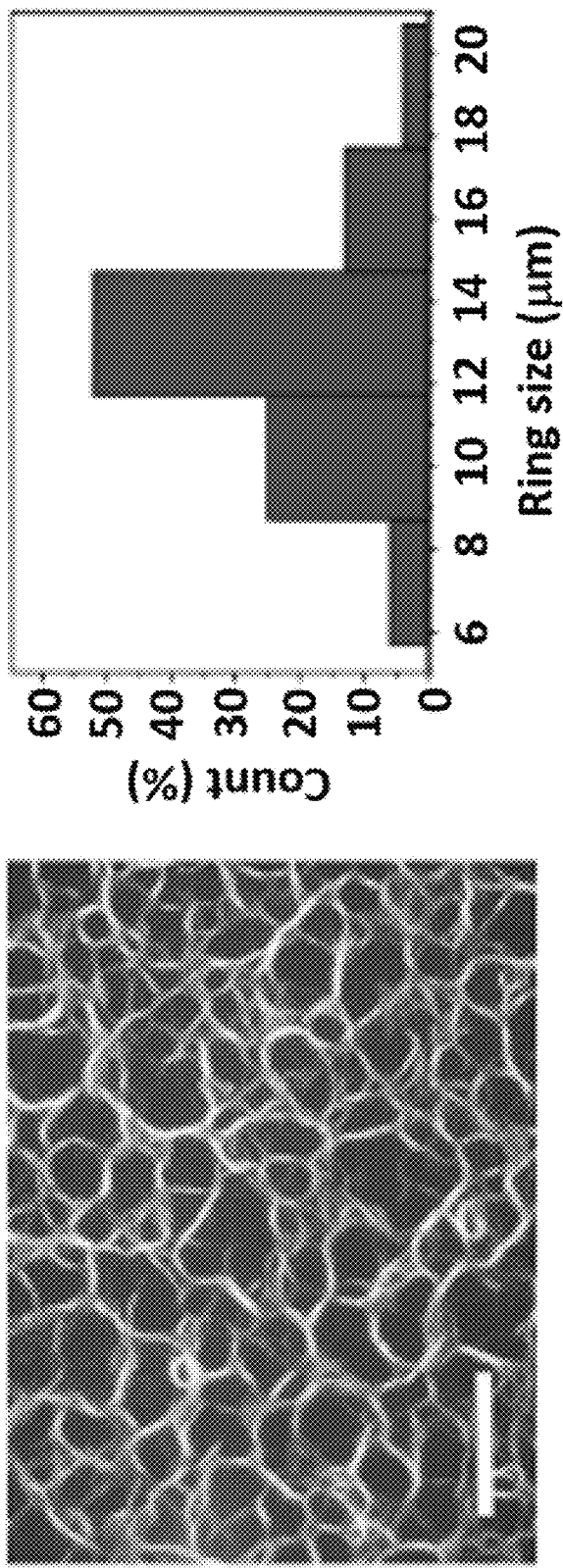
Figure 3:
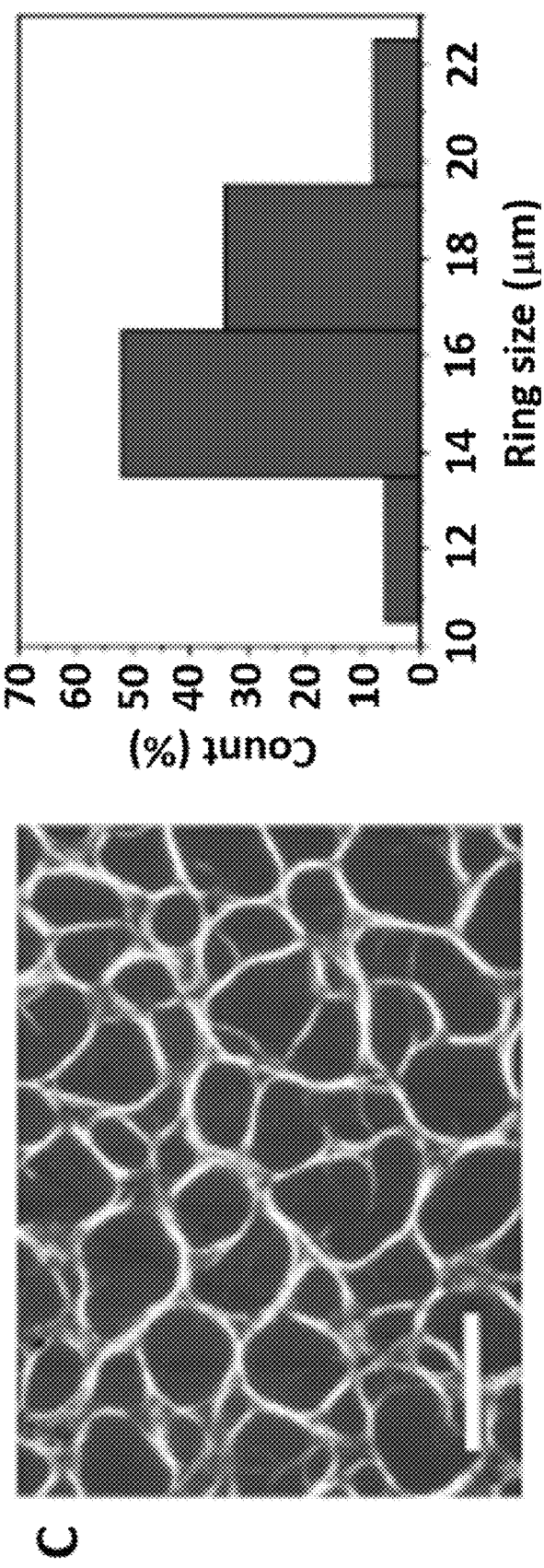
Figure 3:
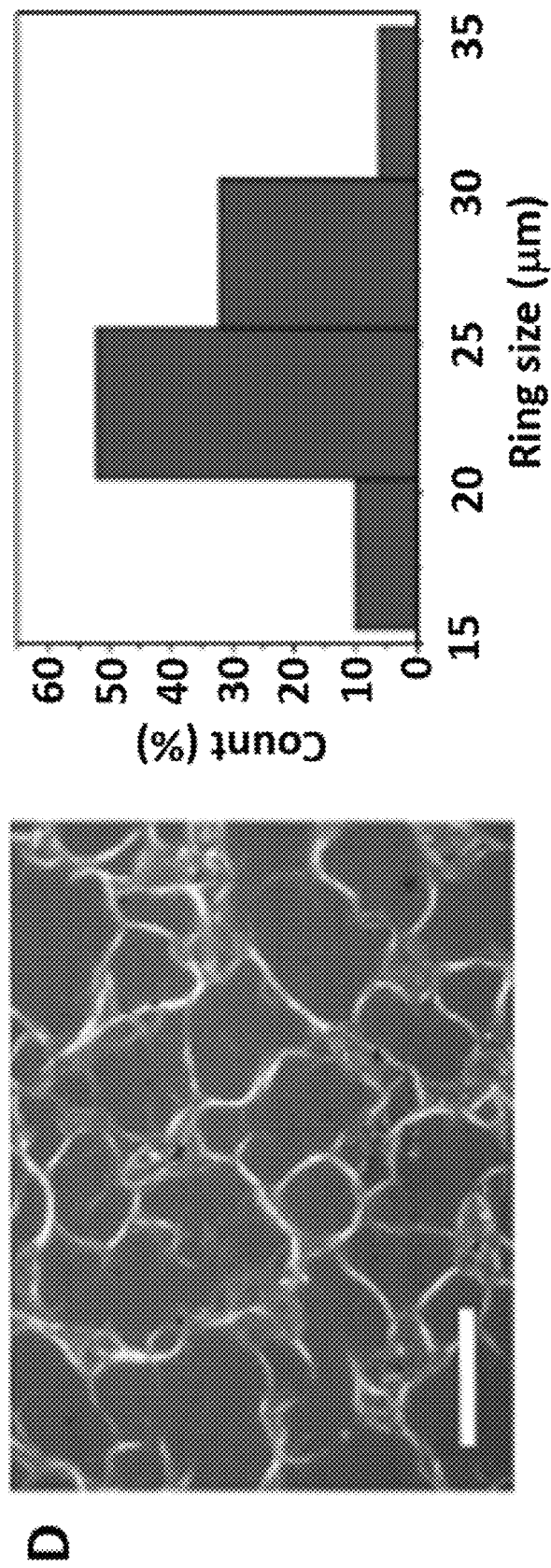
Figure 3:
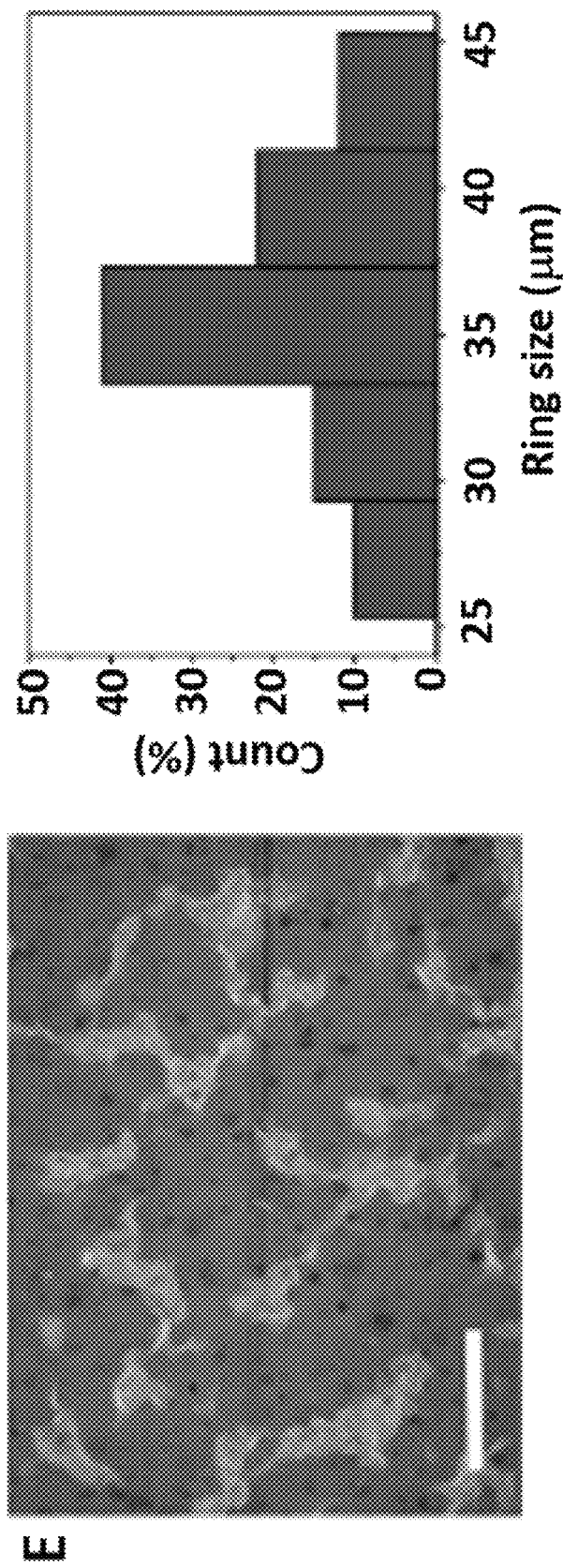
Figure 3:
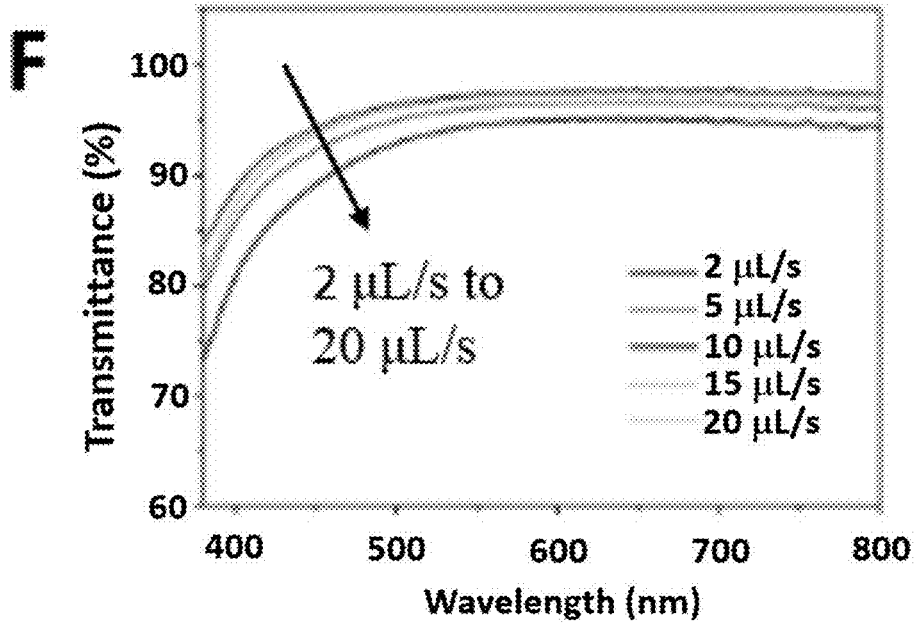
Figure 3:
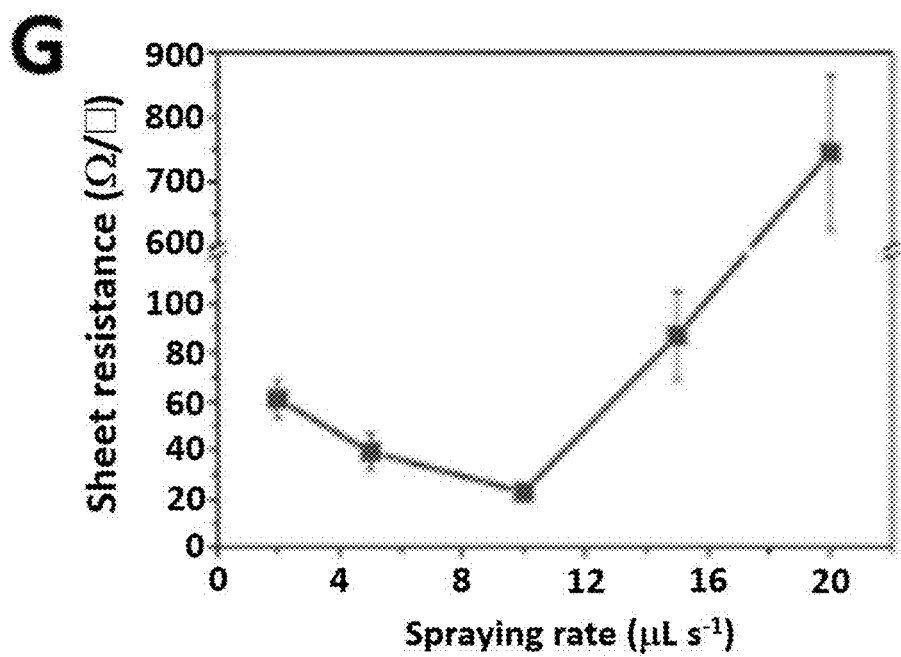
Figure 3:
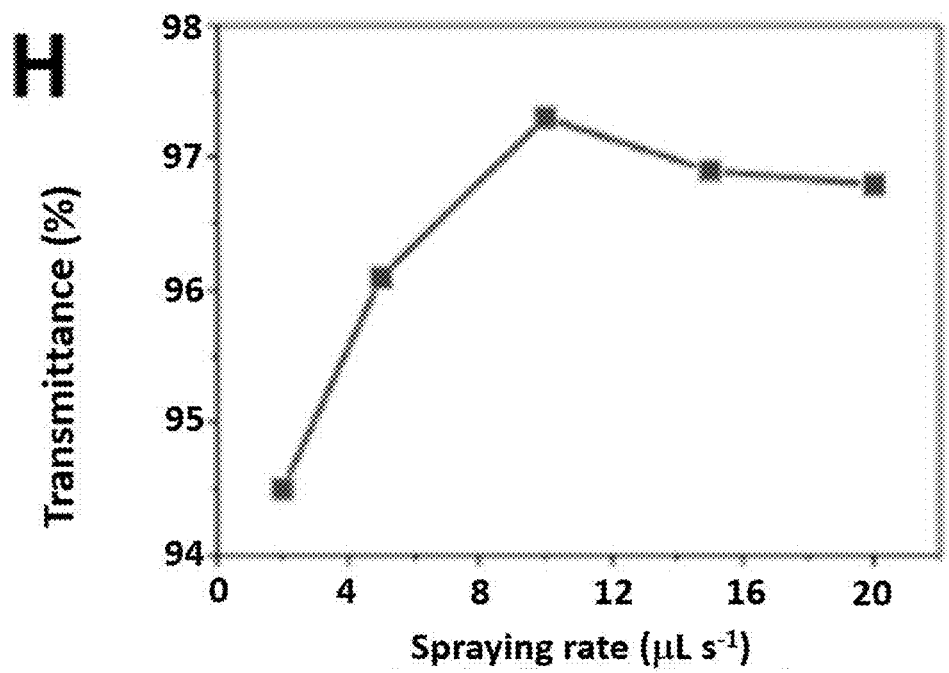
Figure 3:
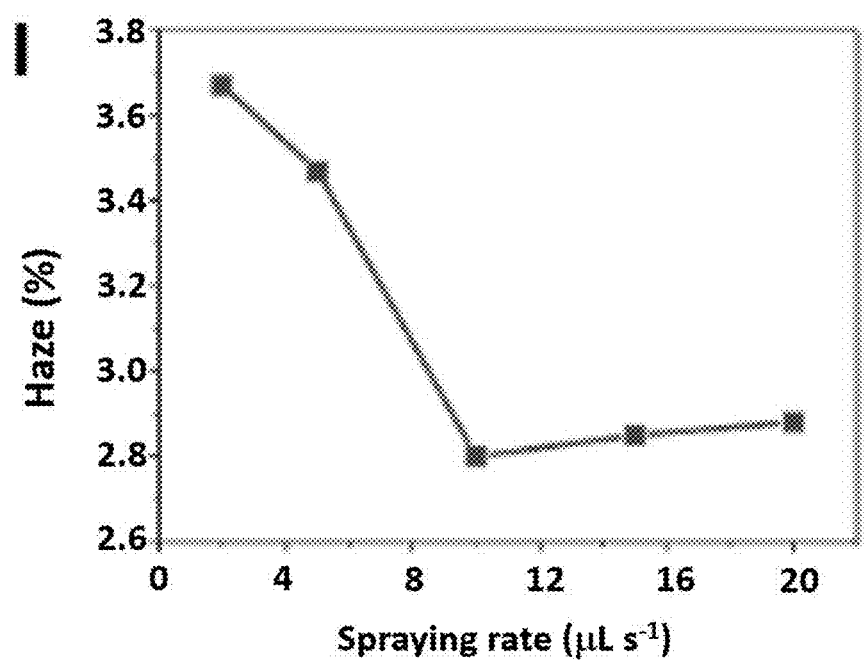
Figure 3:
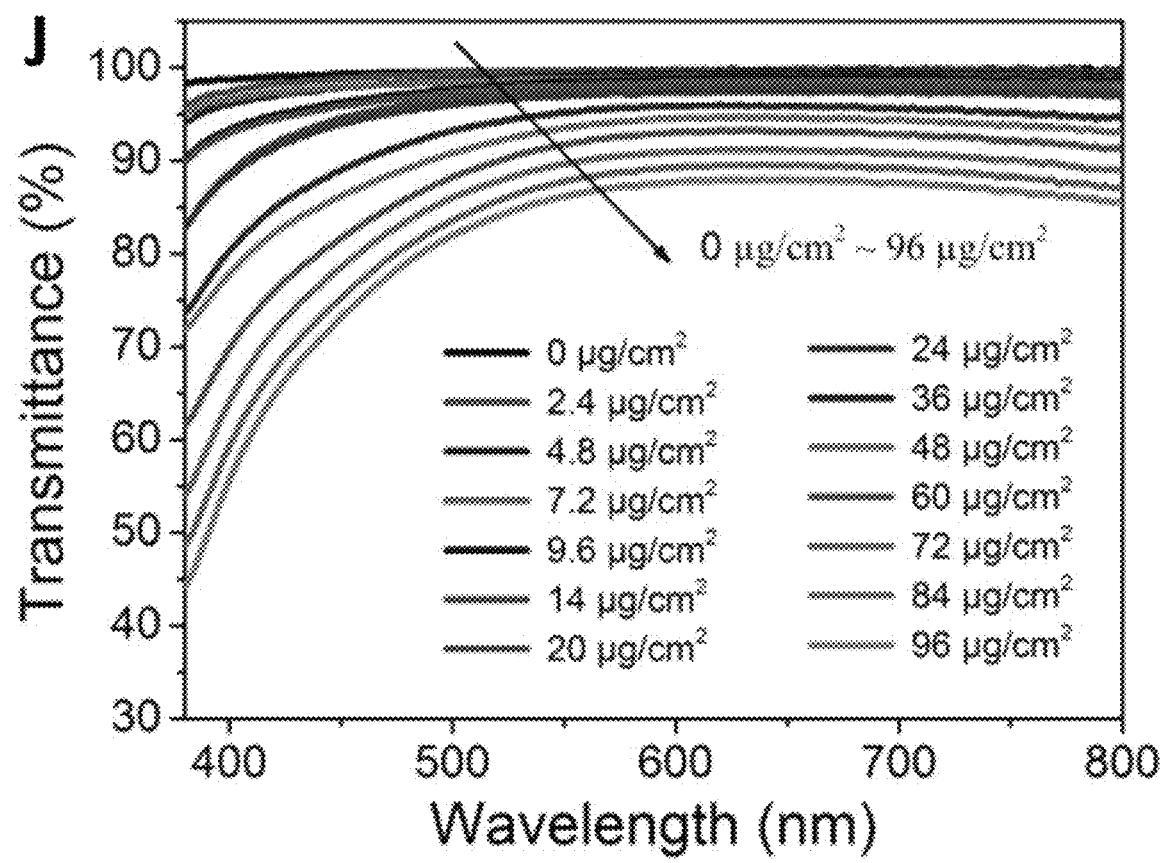
Figure 3:
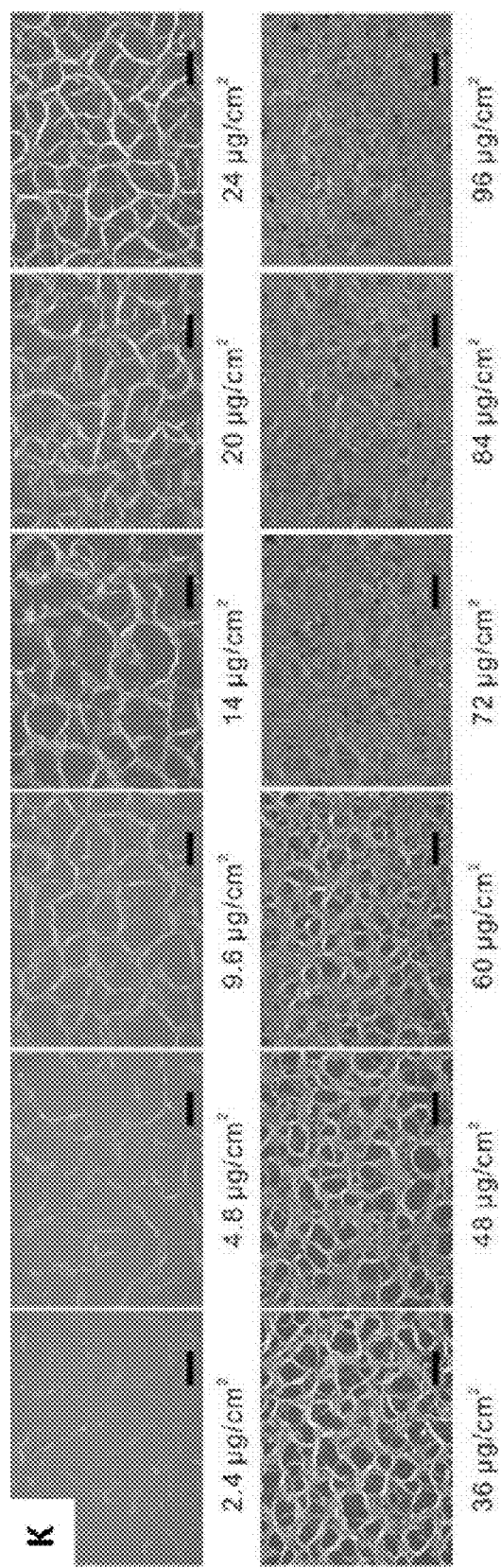
Figure 3:
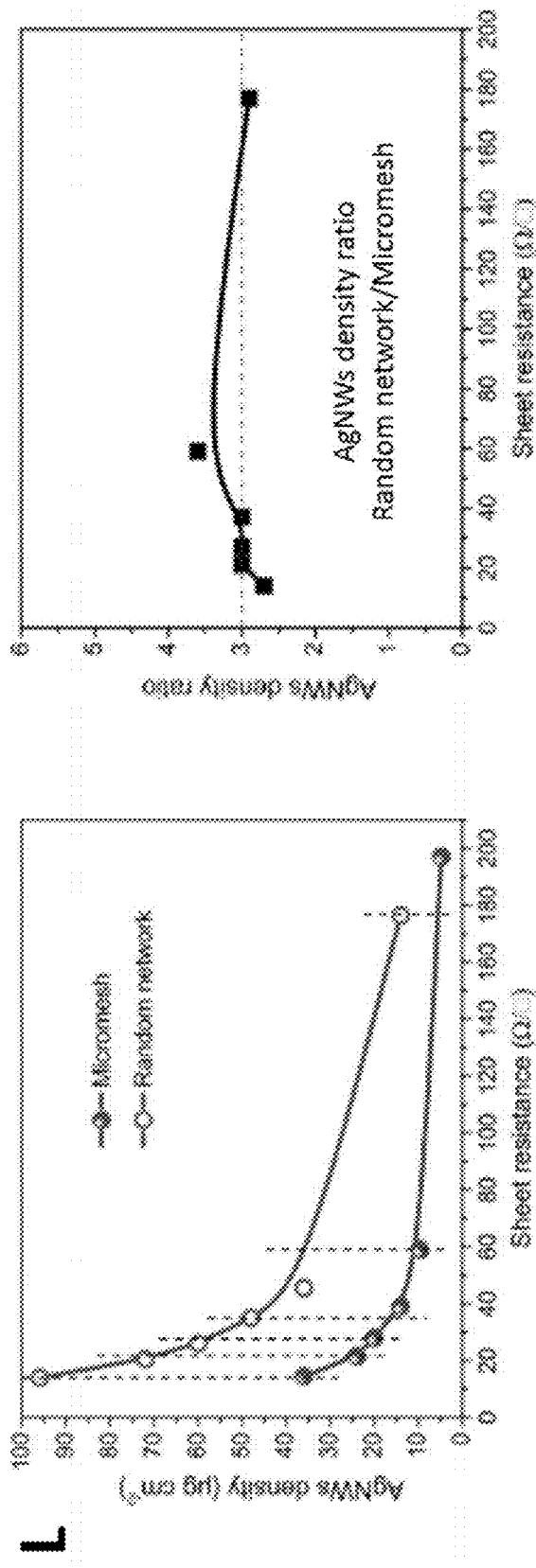
Figure 3:
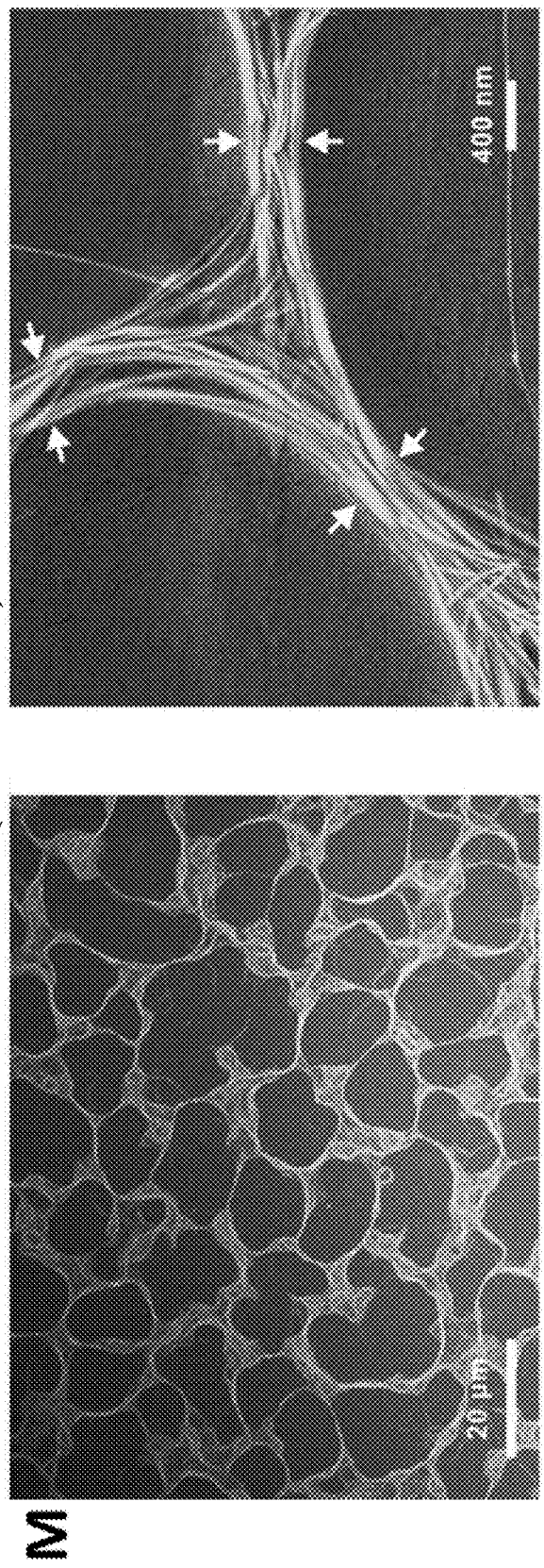
Figure 3:
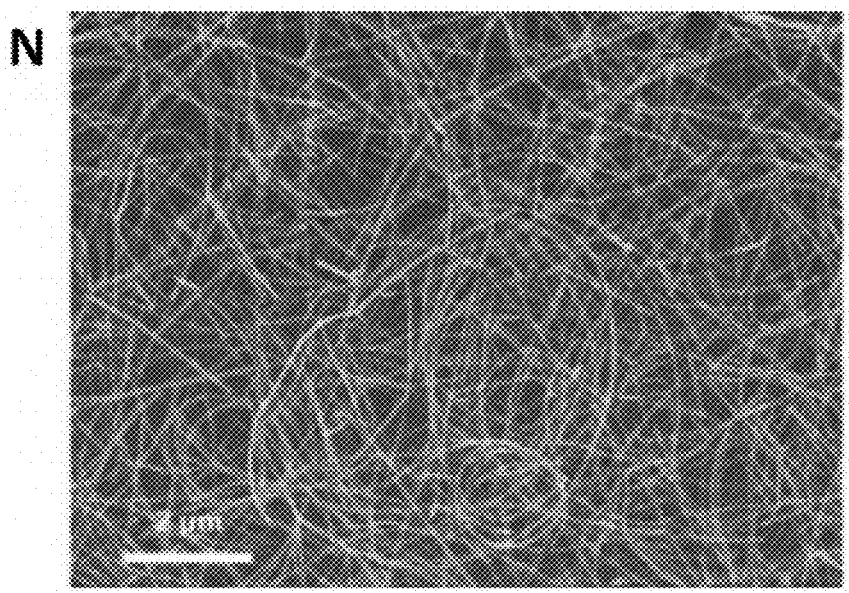
Figure 3:
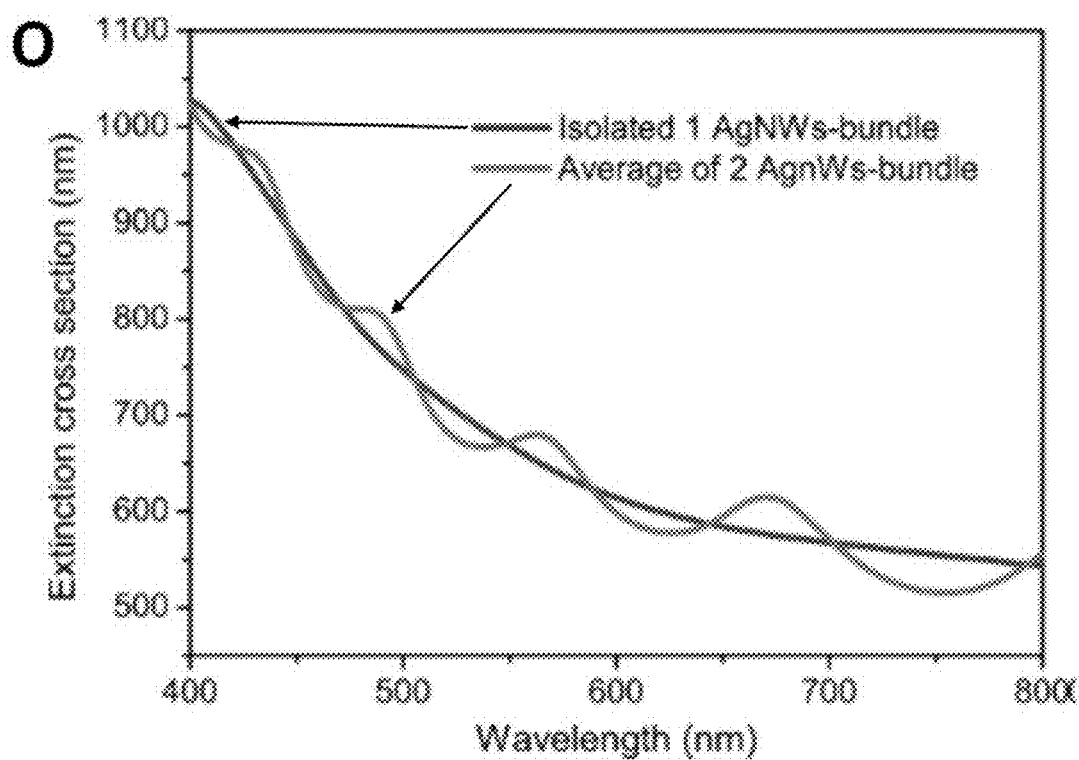
Figure 3:
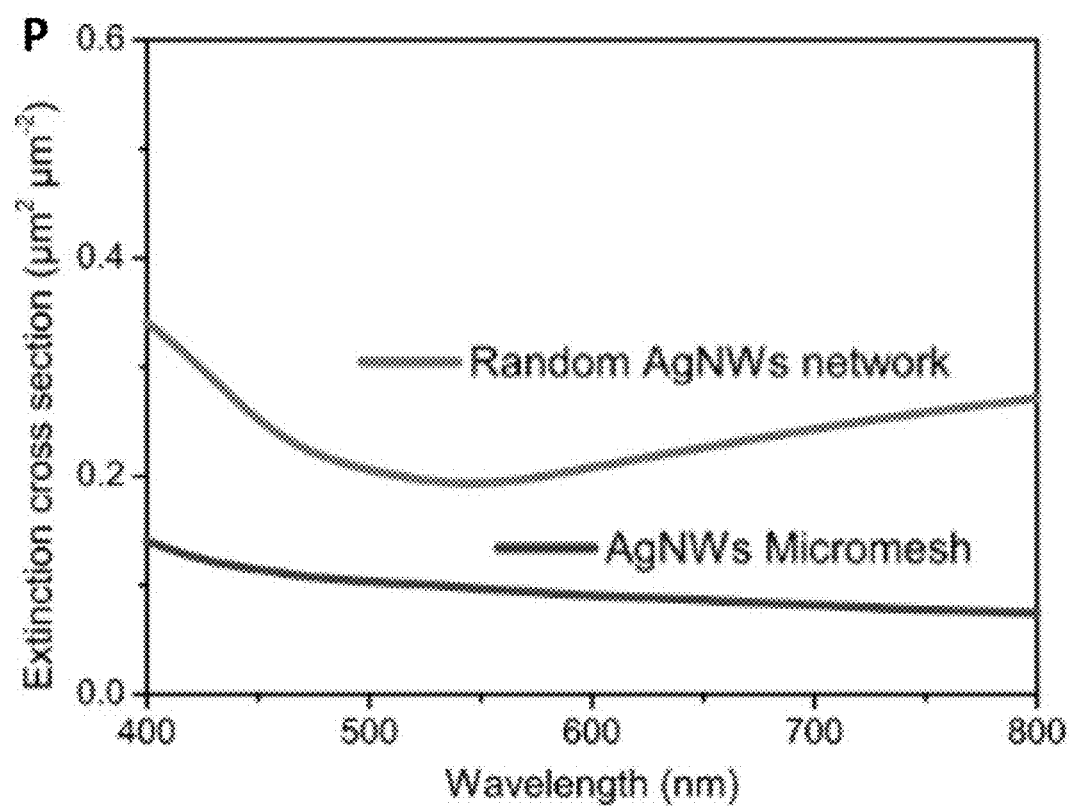

FIG. 3H is a plot of the transmittance taken at a wavelength of 550 nm for AgNWs micromesh based on various spraying velocity. Transmittance measurements exclude the substrate. The transmittance, like sheet resistance as discussed above, is highly affected by the opening ring size, and the controllable mesh size can be attained by tuning the droplet size via changing the spraying velocity. Spray-assisted self-assembly of the present method and its mechanism of depositing AgNWs bundles at the edges have been discussed above for FIG. 3G and shall not be iterated for brevity. In any case, by consuming the same amount of AgNWs, the controllable spraying velocity can achieve meshes with different optoelectronic performances, and the most effective way to tune the mesh performance is by controlling the dosage of AgNWs, as shown in FIGS. 3J and 3K.

FIG. 3I is a plot of haze of the AgNWs micromesh based on various spraying velocity. Haze measurements exclude the substrate.

FIG. 3J shows transmittance spectra of micromeshes with various AgNWs densities. Transmittance measurements exclude the substrate.

Figure 1:
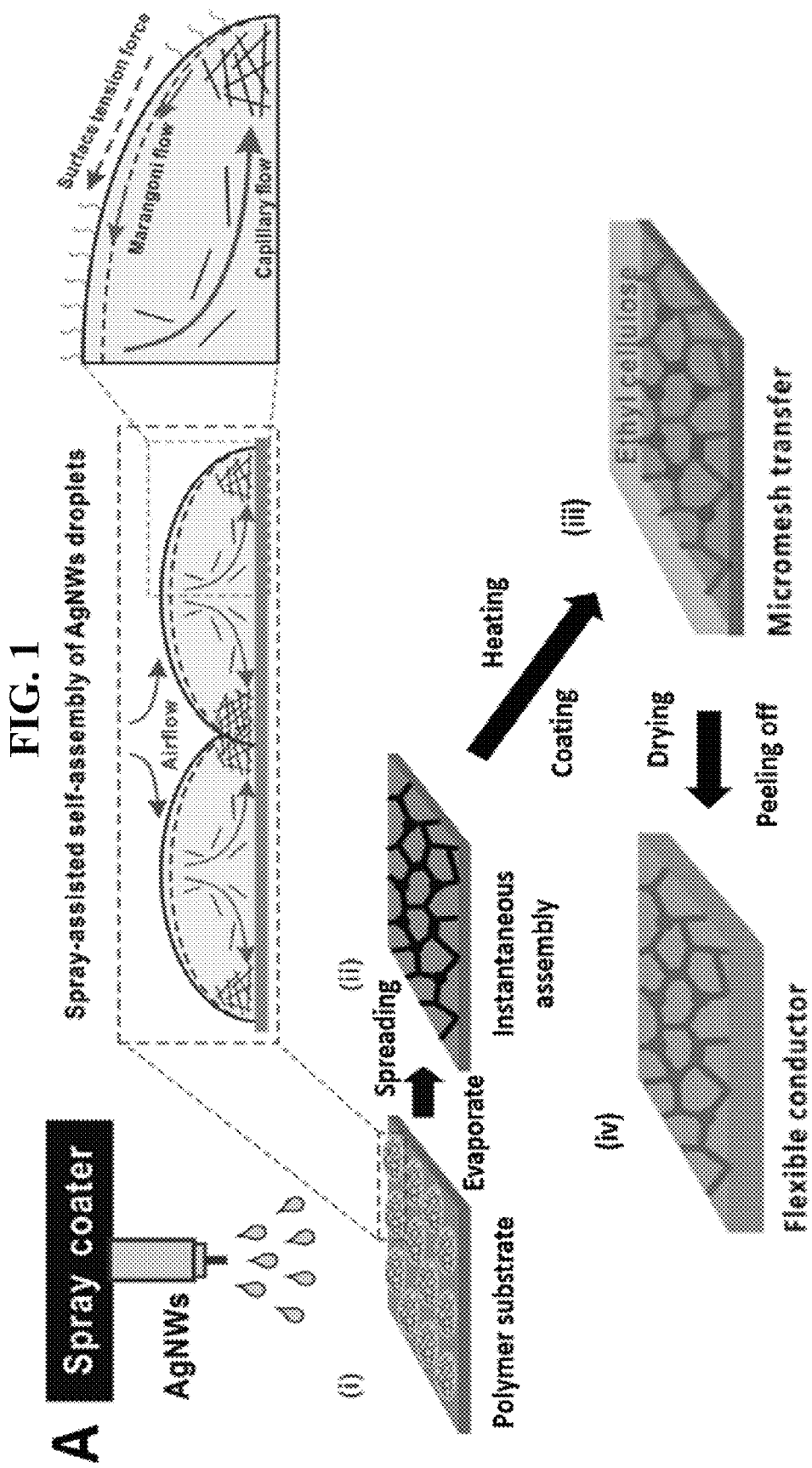
FIG. 1A is a schematic illustration of the fabrication process for an ethyl cellulose (EC) conductor with embedded silver nanowires (AgNWs) micromesh based on various embodiments disclosed herein.
FIG. 1B shows a scanning electron microscopy (SEM) planar top view of the AgNWs micromesh with EC substrate. Inset is a photo of EC conductor with polyethylene terephthalate (PET) roll indicating the scalable process. Scale bar denotes 20 μm.
FIG. 1C shows SEM images of representative knots of AgNWs bundles. Scale bars denote 1 μm.
FIG. 1D shows an SEM image of an AgNWs bundle forming the embedded structure. Scale bar denotes 400 nm.
FIG. 1E shows a cross-section schematic depicting the embedded AgNWs bundle of FIG. 1D.
FIG. 1F shows the real time sheet resistance ($R_s$) measurement photos of an AgNWs micromesh with EC substrate having dimensions of 15 cm×25 cm. The photos of FIG. 1F also demonstrate the $R_s$ homogeneity of the AgNWs micromesh with EC substrate, wherein the uniform conductivity can be attained by controlling the mesh size, which can in turn be controlled by the spraying rate. This is due to the explicit conductive paths of the specific dimensional micromesh, which provide an advantage over conventional random nanowire network.
FIG. 1G shows a transmittance spectrum of the corresponding AgNWs micromesh conductor in the visible light range. Inset is the photo of the EC conductor (15×25 cm$^2$) with high transparency and low haze. $R_s$ of the sample is indicated in FIG. 1F.
FIG. 1H relates to morphology of AgNWs. Specifically.
FIG. 1I shows the length distribution of AgNWs. This was analyzed based on 100 randomly distributed AgNWs.
FIG. 1J shows a TEM image of an AgNW diameter. Scale bar denotes 50 nm.
FIG. 1K relates to demonstration of the motion of AgNWs in isopropyl alcohol droplet on a PET substrate. Specifically.
FIG. 1L shows AgNWs movements in IPA during the evaporation.
FIG. 1M shows AgNWs piled up at the edge of droplet after IPA evaporation.
FIG. 1N shows micrographs that demonstrate formation of the AgNWs micromesh. The photos were taken per second after finishing the spraying that was performed at 25° C., demonstrating that the ring network was assembled immediately during the spraying process. It is a spray-assisted coffee-ring effect based on the surface tension difference of the selected solvent and substrate. The term "spray-assisted" used herein refers to how the spraying is carried out in a manner that enhances the coffee-ring effect. This includes controlling the spray velocity, which may affect the droplet size, and the distance between the spray equipment (e.g. a spray gun) to a substrate. The manner in which the spraying is carried out may affect the amount of solvent that evaporates before the solvent lands on the substrate, which may in turn affect how rapid the remaining solvent evaporates from the substrate. Hence, the coffee-ring effect may be enhanced as solvent evaporation from the substrate may be accelerated by how the spraying is carried out. During accelerated evaporation of the solvent from the substrate, strong capillary flow occurs in the droplets to suppress the Marangoni flow, rendering the continuous coffee-ring effect to occur in each droplet, leading to assembly of AgNWs at the edges of droplet, and finally forming an AgNW-bundle micromesh. Scale bar denotes 20 μm.
FIG. 1O shows micrographs of sprayed AgNWs on various substrates. In the top left image, AgNWs behave as random network on the glass. The other three images show AgNWs assembling into micromesh on various polymer substrates, such as PET, polytetrafluoroethylene (PTFE) and polyvinyl chloride (PVC). These images demonstrate that AgNWs micromesh only forms on a polymer substrate instead of glass, which is due to differences in surface tension. Scale bar denotes 20 μm. For the AgNWs to achieve a ring structure by spraying, several factors may be considered for selecting the solvent and substrate. During the spraying, temperature and spraying velocity may be regarded constant, as both factors can be controlled. In light of this, the difference in surface tension between the solvent and substrate should ensure the droplets can spread, with or without the assistance of airflow, rendering a driving force generated from a coffee-ring effect to carry the AgNWs to the edges of each droplet, enabling rapid or even instant formation of ring structure. This assembly process is achievable whether a single solvent or mixed solvents are used. Meanwhile, the viscosity, boiling point and saturation vapor pressure of the solvent should be appropriate for fast evaporation, so as to produce strong capillary flow that suppresses Marangoni flow, rendering coffee-ring effect continuous in each droplet, and this prevents undesired perturbation of AgNWs during the assembly process. A solvent that can disperse the AgNWs should be one of the basic premise. To fabricate the neat micromesh conductive network, apart from the solvent and substrate, the AgNWs size, nozzle size, spray velocity, temperature, and air pressure, may have to be considered for the present method to be developed as a comprehensive fabrication of electrically conductive nanowires ring structure micromeshes.
FIG. 1P shows micrographs of transferred AgNWs micromesh with various densities on different substrates. These substrates include ethyl cellulose (EC), poly(dimethylsiloxane) (PDMS), polyvinyl alcohol (PVA), 3M VHB tape, and glass. These images demonstrate transferability of AgNWs micromesh on flexible and rigid substrates. Scale bar denotes 20 μm.
FIG. 1Q shows comparison of properties of a bare PET film and EC film. The left image is a SEM planar view image of a bare EC film with good flatness. The right image shows the transmittance spectra of the bare PET film and EC film for indicating the high transparency of EC film.
FIG. 1R shows a SEM planar view image of a typical AgNWs micromesh and the ring size distribution of AgNWs micromesh. Analysis was carried out for 100 randomly distributed AgNWs bundle-bundle distance of rings. Scale bar denotes 20 μm.
Figure 1:
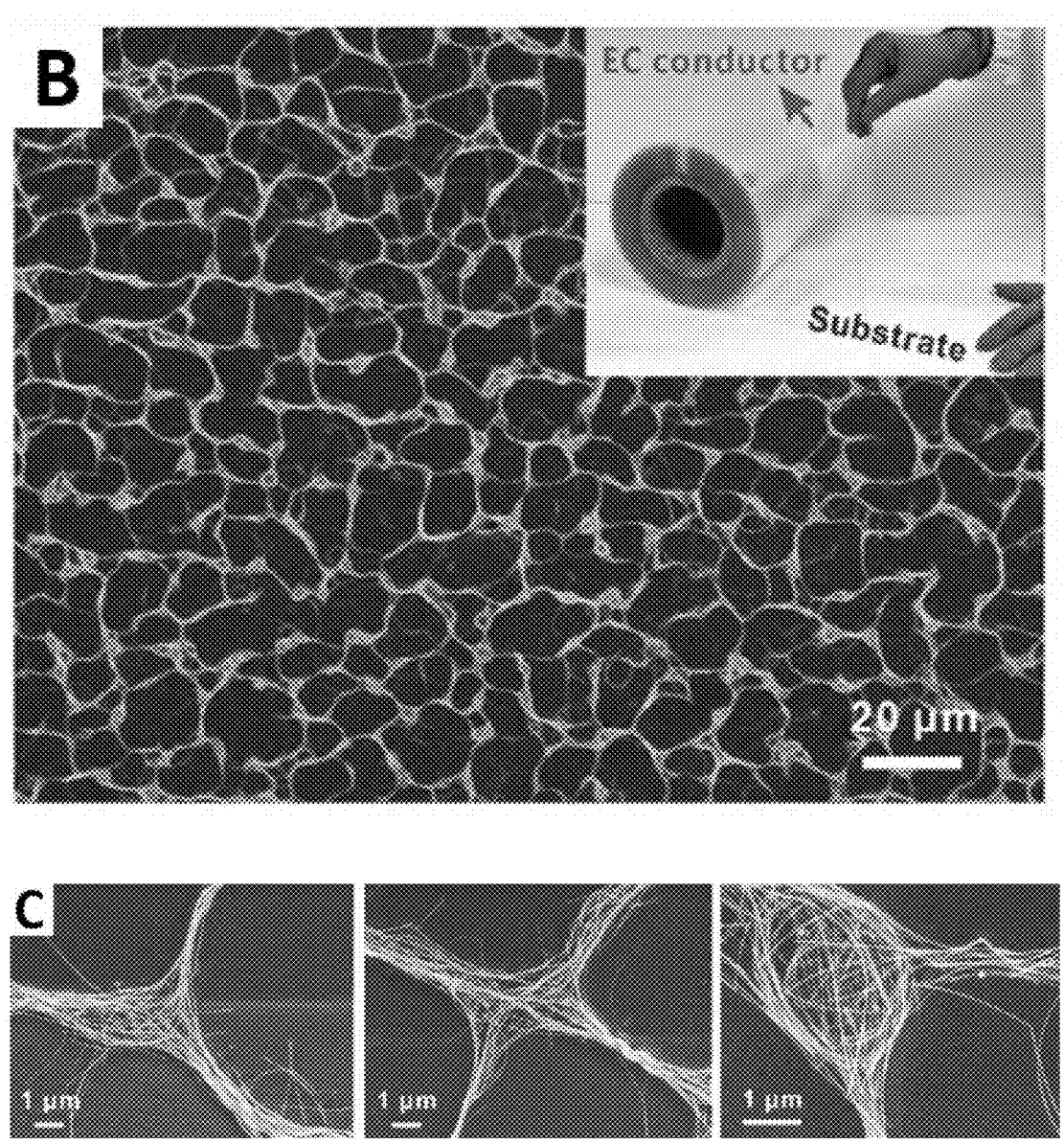
Figure 1:
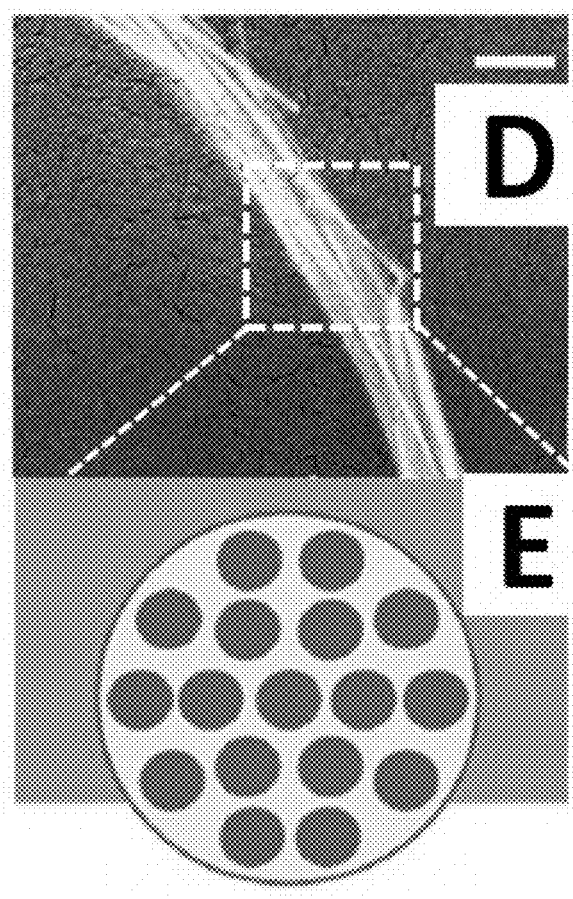
Figure 1:
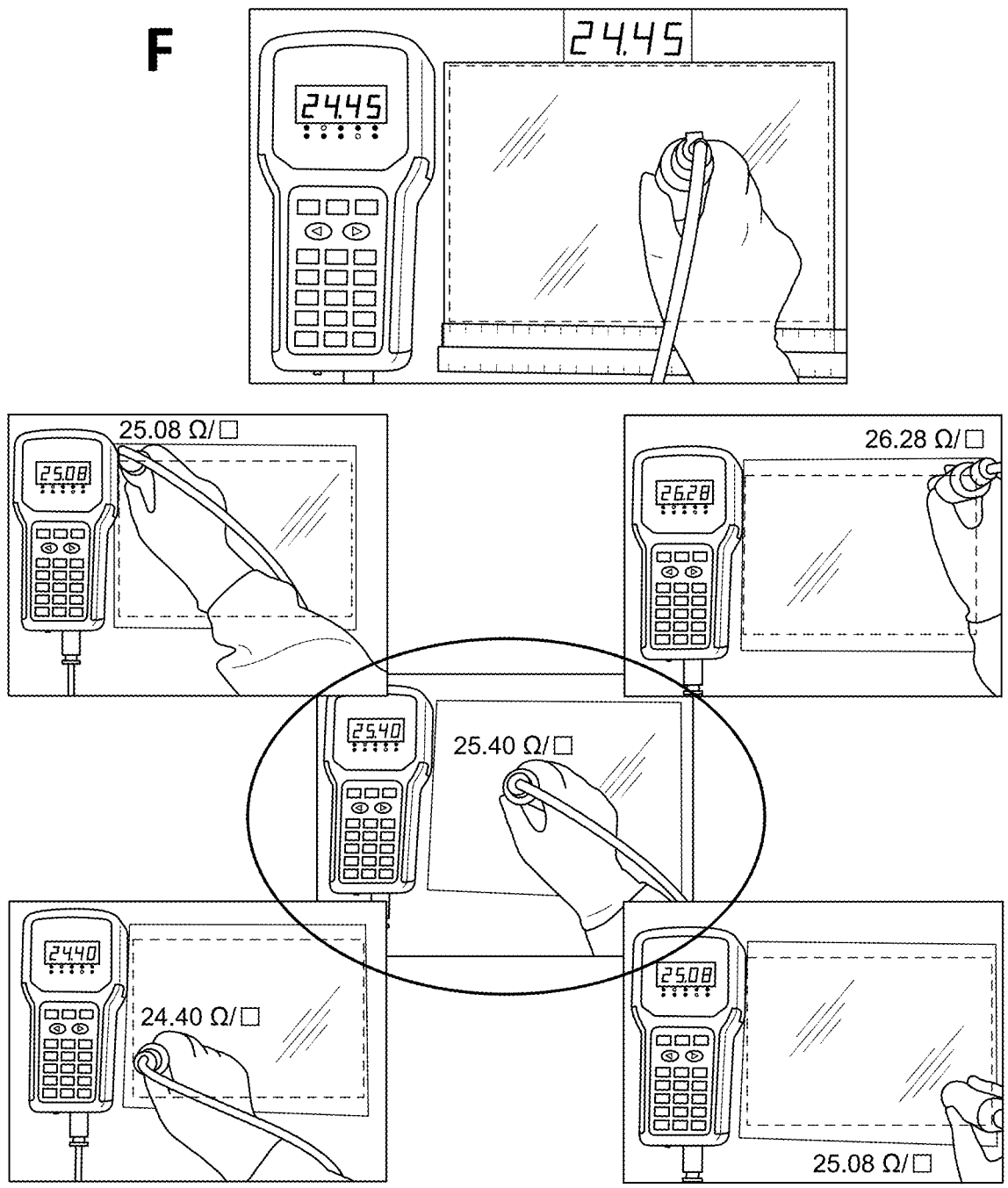
Figure 1:
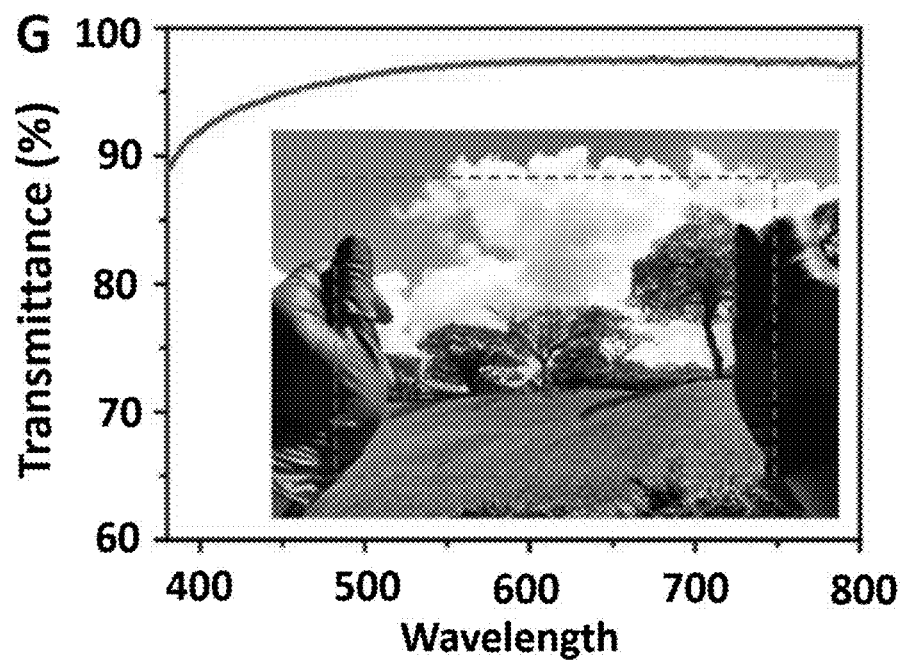
Figure 1:
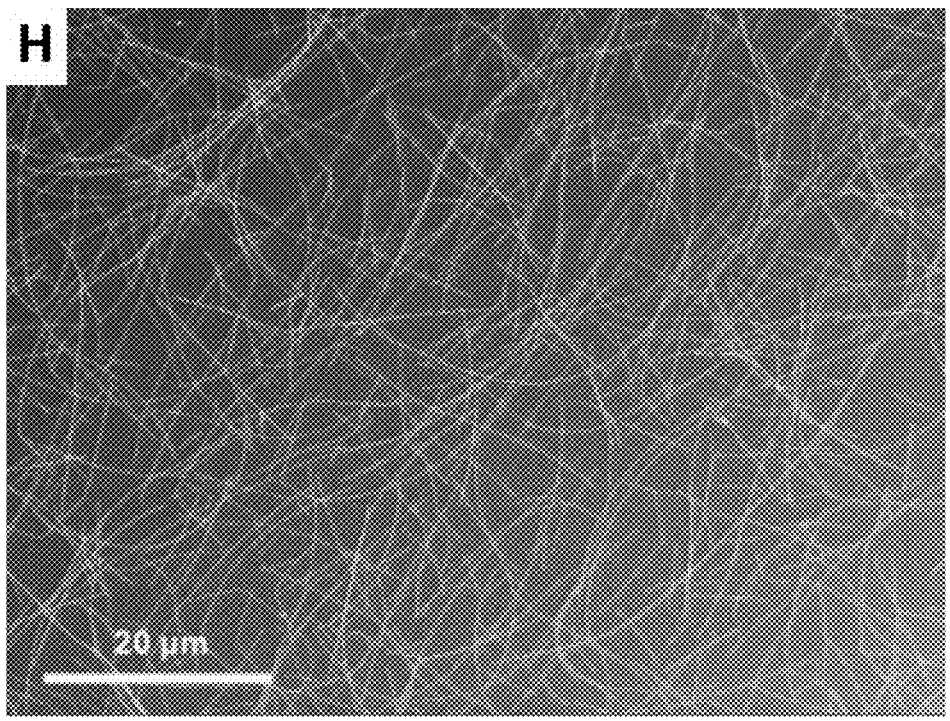
Figure 1:
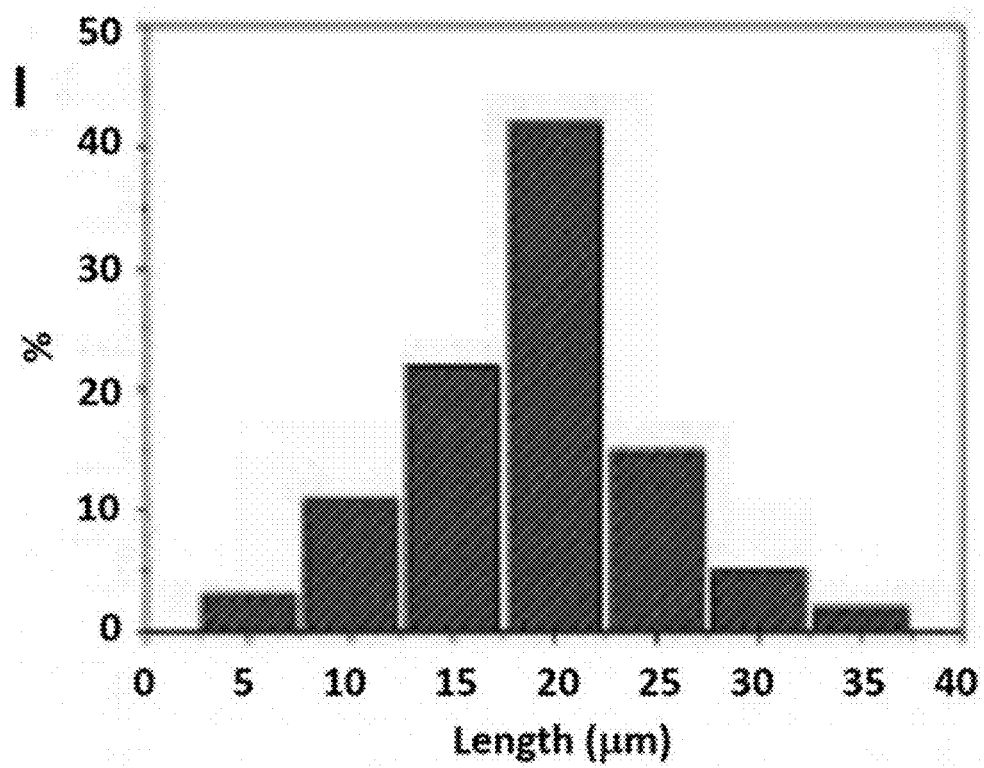
Figure 1:
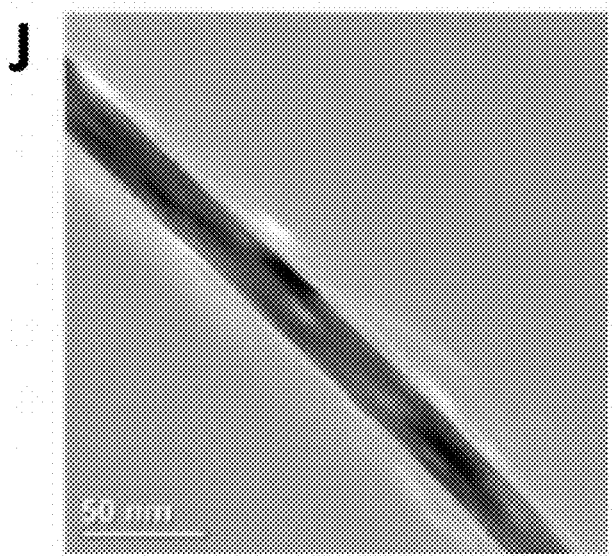
Figure 1:
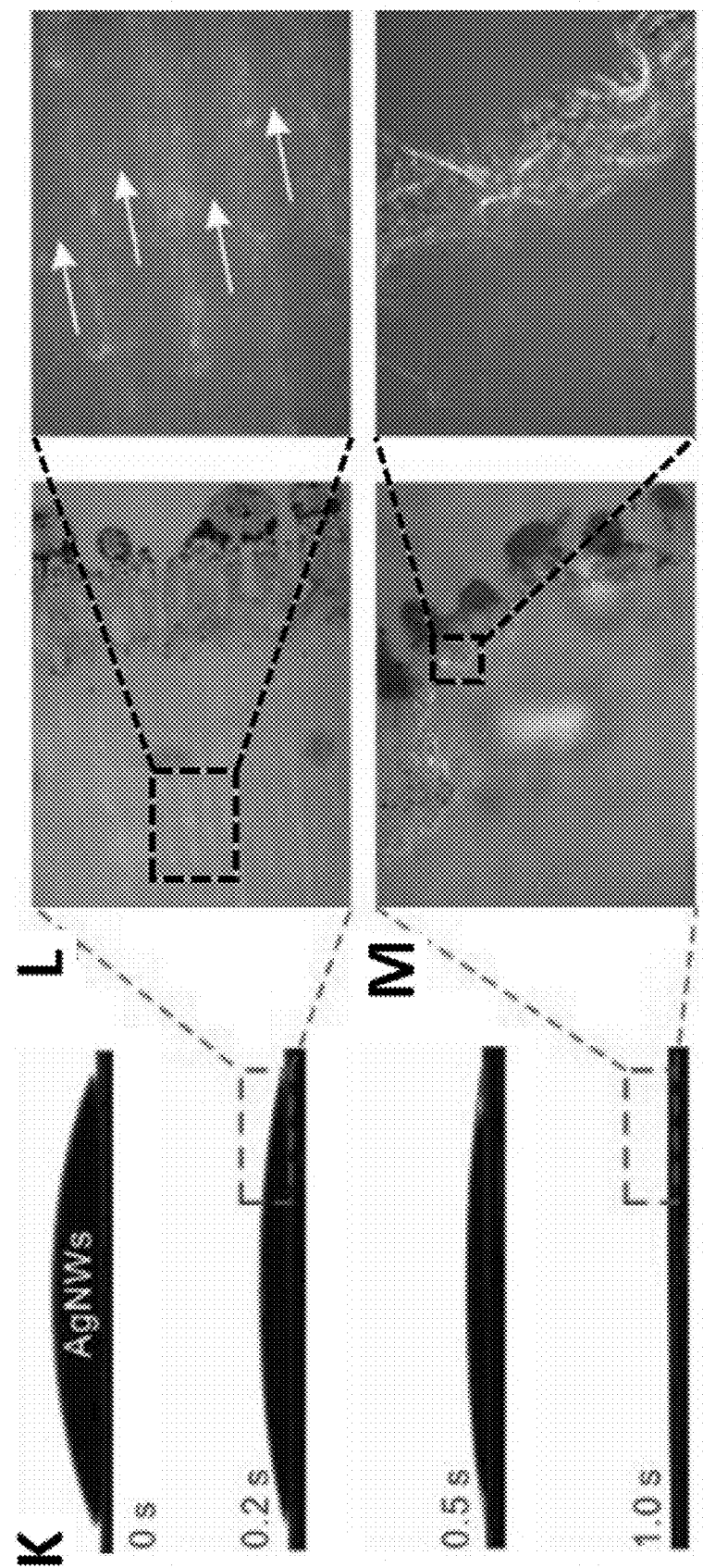
Figure 1:
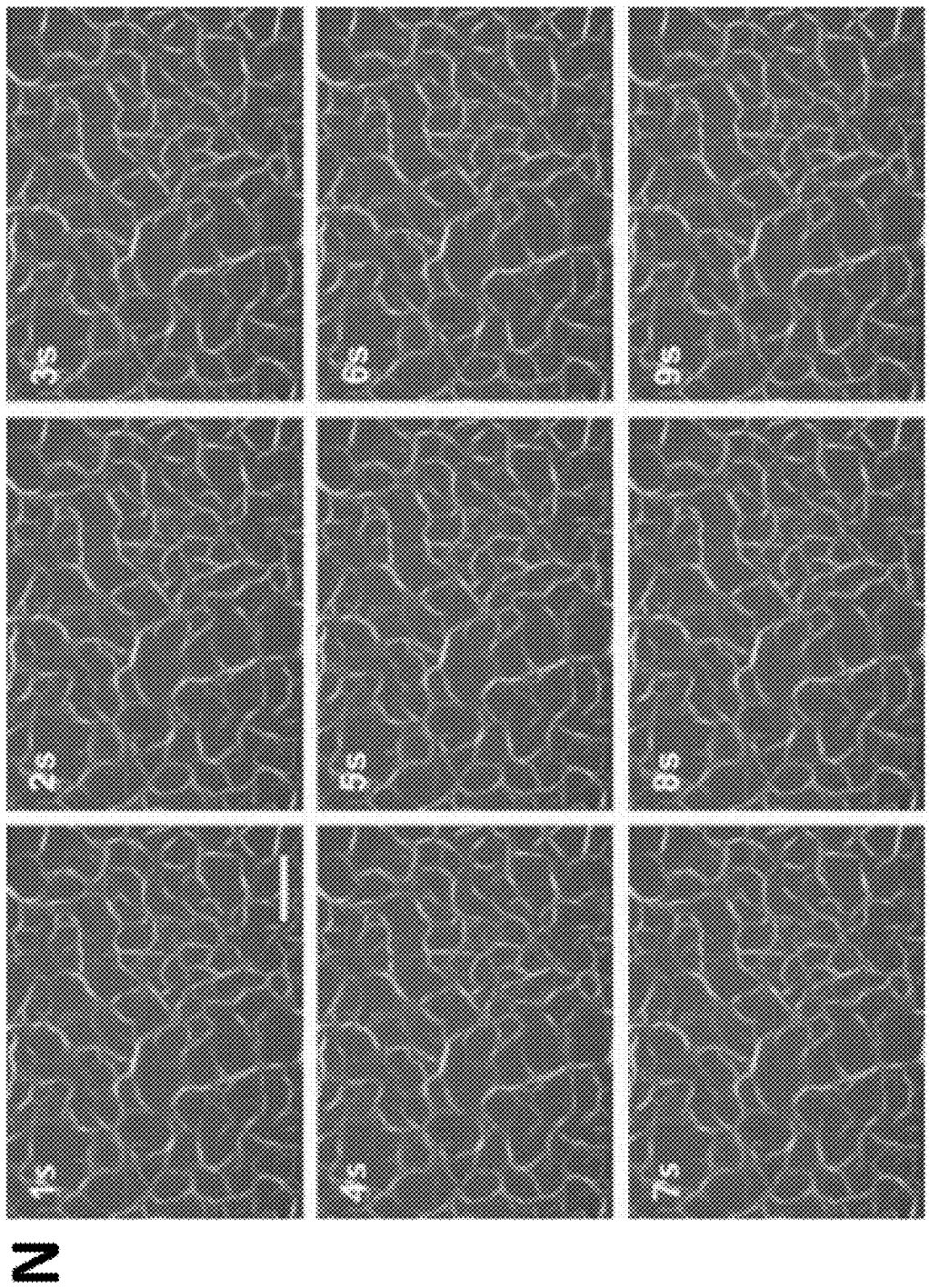
Figure 1:
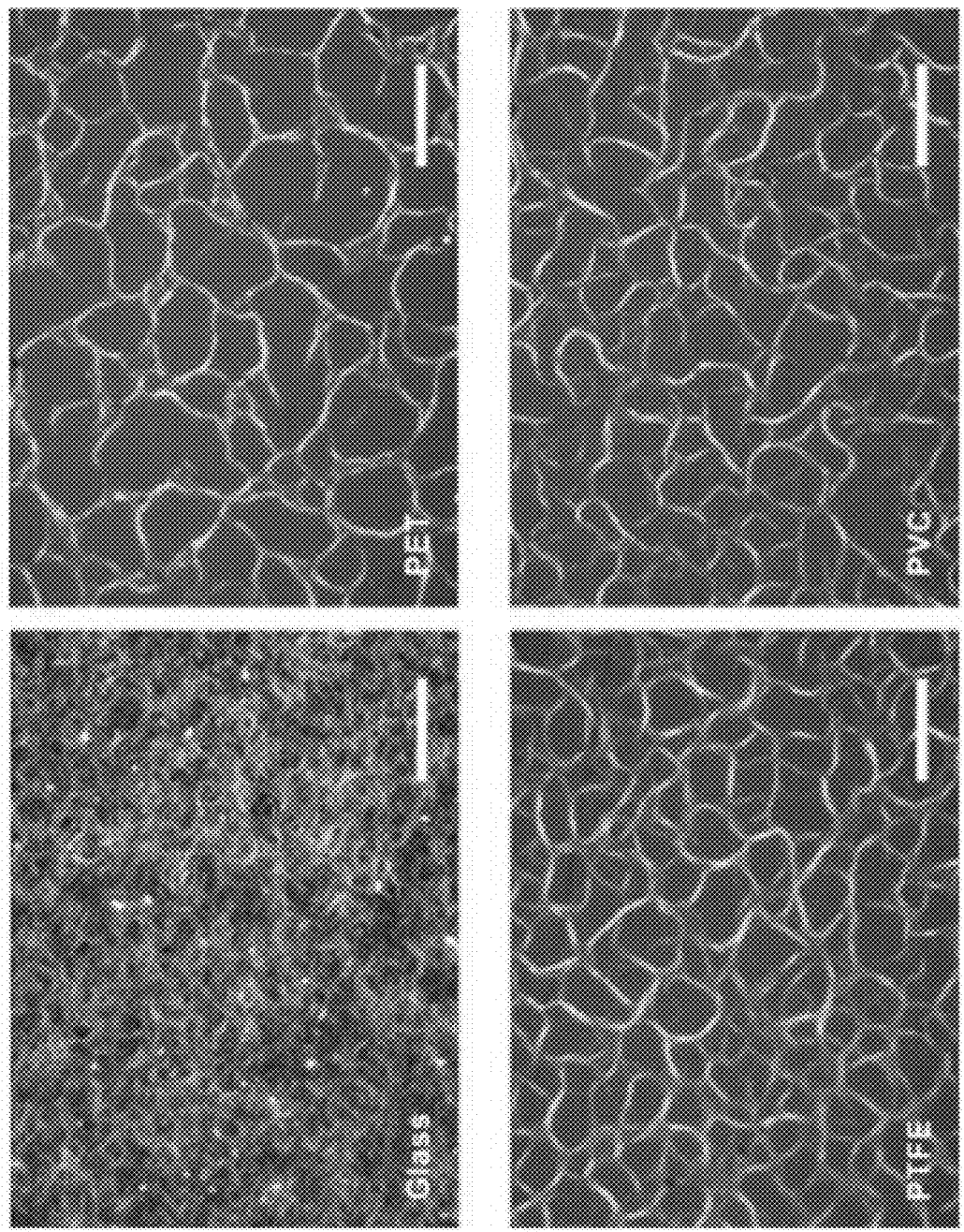
Figure 1:
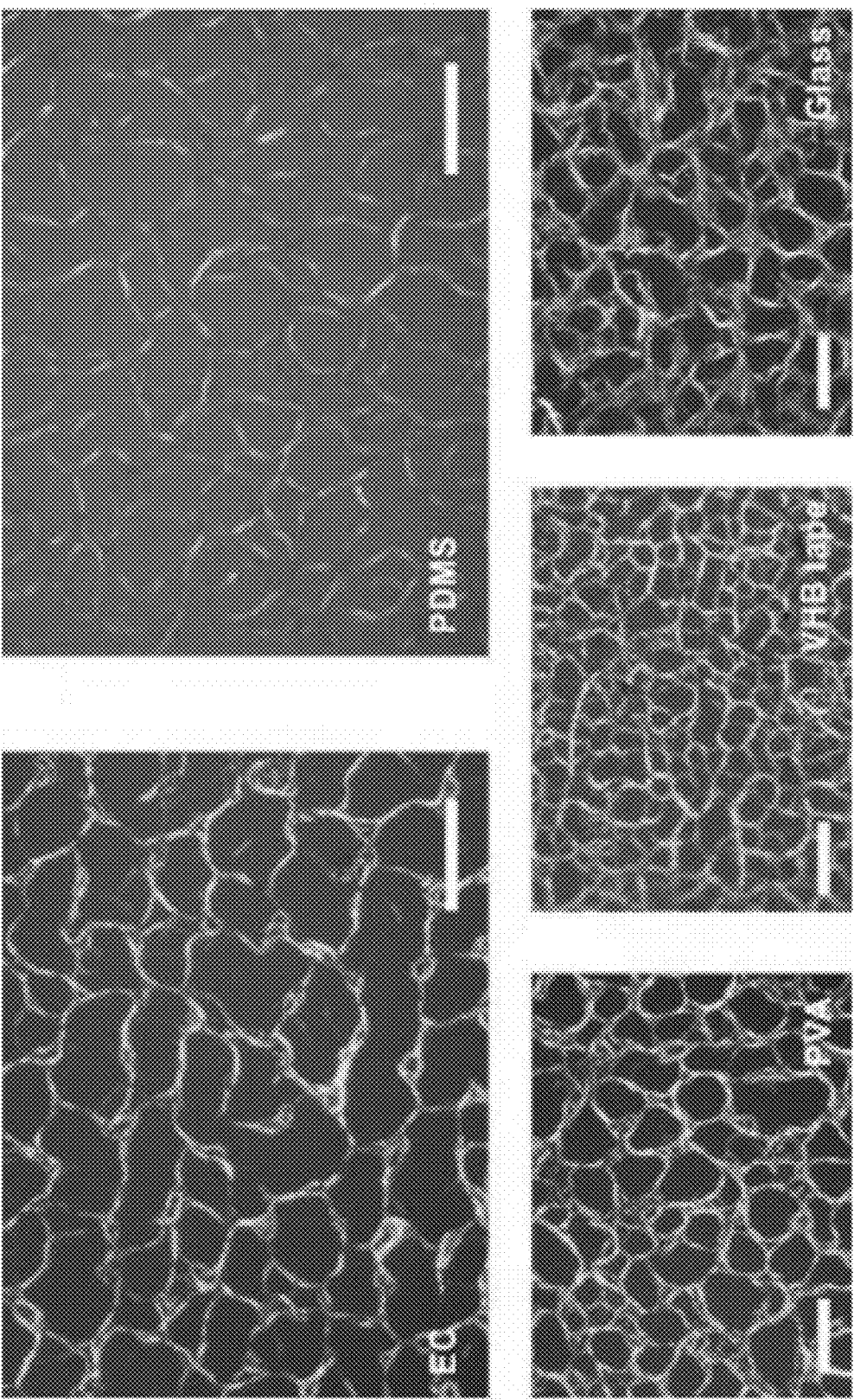
Figure 1:
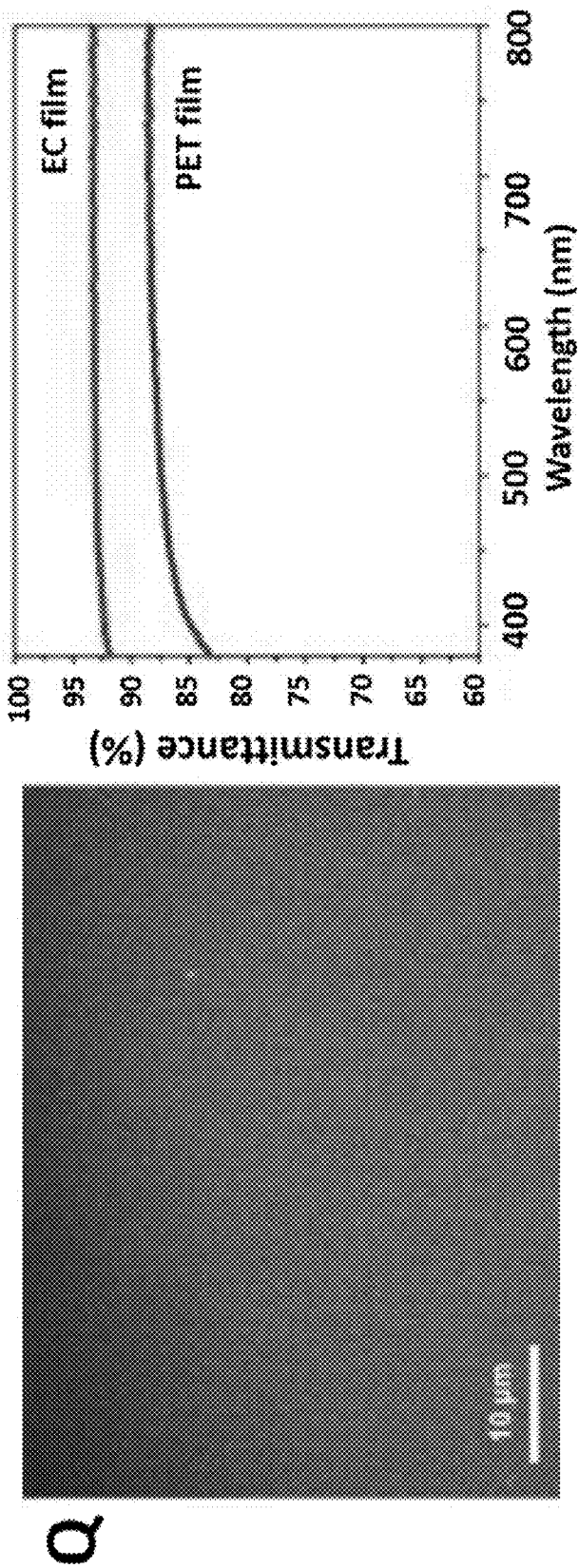
Figure 1:
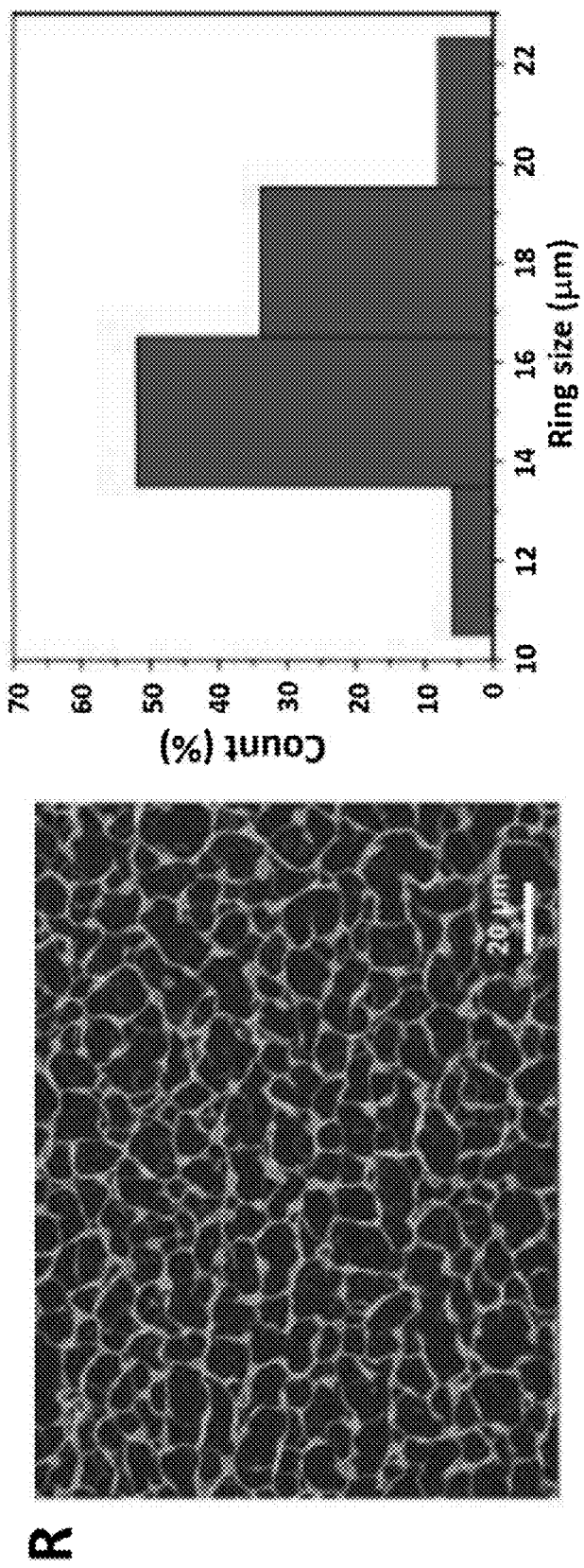

FIG. 3K shows micrographs of AgNWs micromeshes based on various AgNWs densities. Scale bars denote 10 μm. Based on the spraying rate (10 μL s$^{-1}$), various densities of AgNWs can be applied to fabricate the micromesh conductors to have different transmittance (86.2%~99.6%), and the SEM images indicate that subsequent AgNWs preferentially accumulate on the preceding AgNWs to maintain the ring structure, because the coffee-ring effect preferentially occurs on the bare area, thus a mesh network remains prevalent even with high content of AgNWs used (96 μg/cm$^2$). The accumulation of nanowires was also confirmed by the immediate forming process of the micromesh as shown in FIGS. 1K and 1L, the preceding AgNWs ring network serves as a template that leads to subsequent assembly of AgNWs while maintaining the ring structure.

FIG. 3L shows the AgNWs density comparison of the present micromesh and a conventional random network having same conductivity. The left image is a plot of AgNWs density of micromesh and random network as a function of the sheet resistance, demonstrating that the micromesh can achieve the same conductivity using less AgNWs. The right image is a plot of AgNW density ratio (random network/micromesh), which demonstrates that the amount of AgNWs used in random structure is about 3 times that of a micromesh structure for same sheet resistance.

FIG. 3M shows SEM images of the present AgNWs micromesh and model for AgNWs bundle. The left and right images are SEM planar view images of the present AgNWs micromesh and AgNWs bundle, respectively. Scale bar denotes 20 μm and 400 nm, respectively.

FIG. 3N shows a SEM planar view image of the random AgNWs network. Scale bar denotes 2 μm.

FIG. 3O shows the comparison between 2-dimensional extinction cross sections of isolated 1 bundle of silver nanowires and half of that of 2 bundles.

FIG. 3P shows the comparison of extinction cross section (μm$^2$) per unit area (μm$^2$) between micro-mesh structure (ring) and random network.

Figure 4:
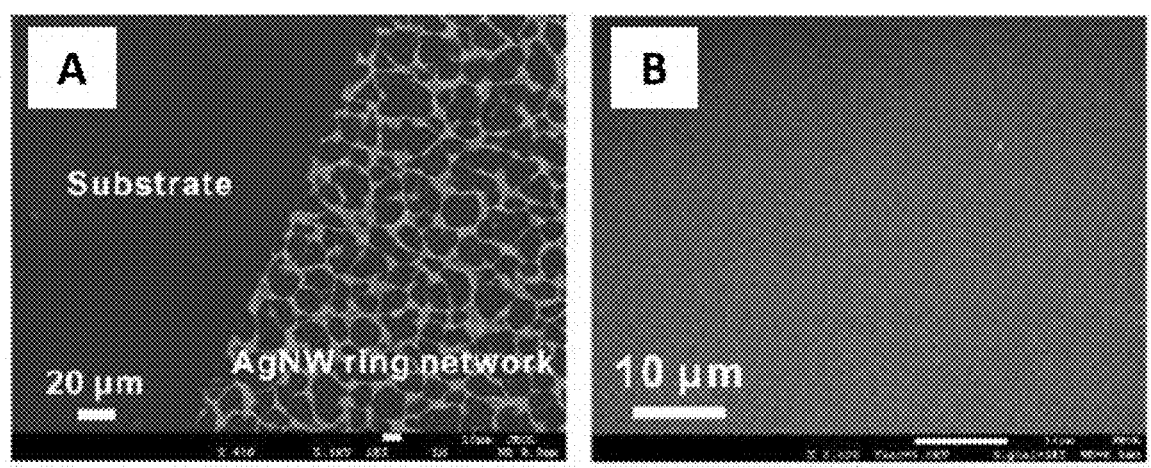
Figure 4:
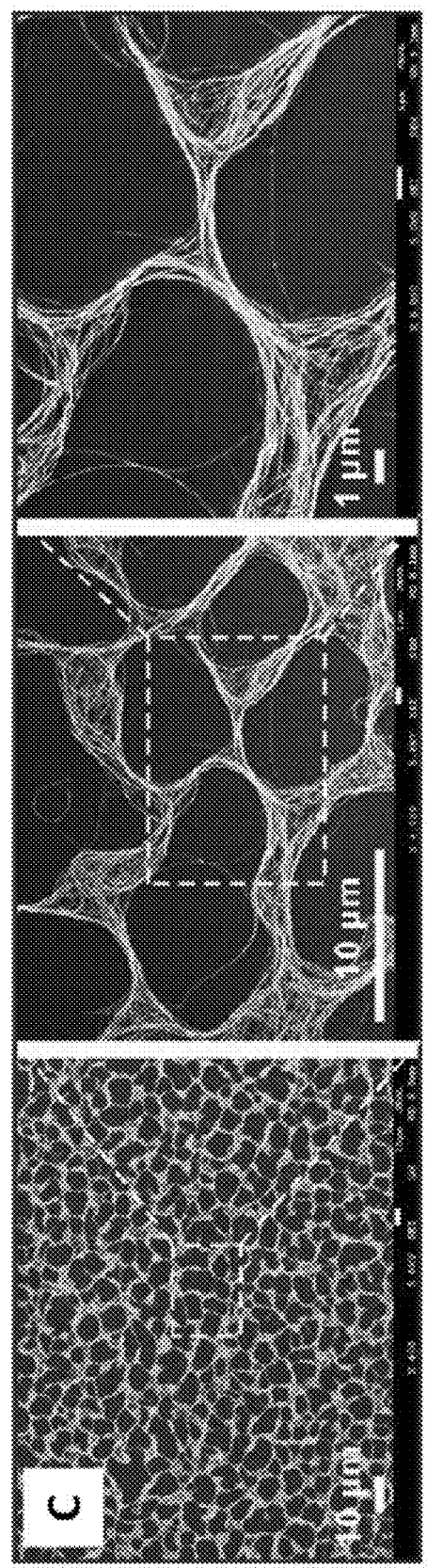
Figure 4:
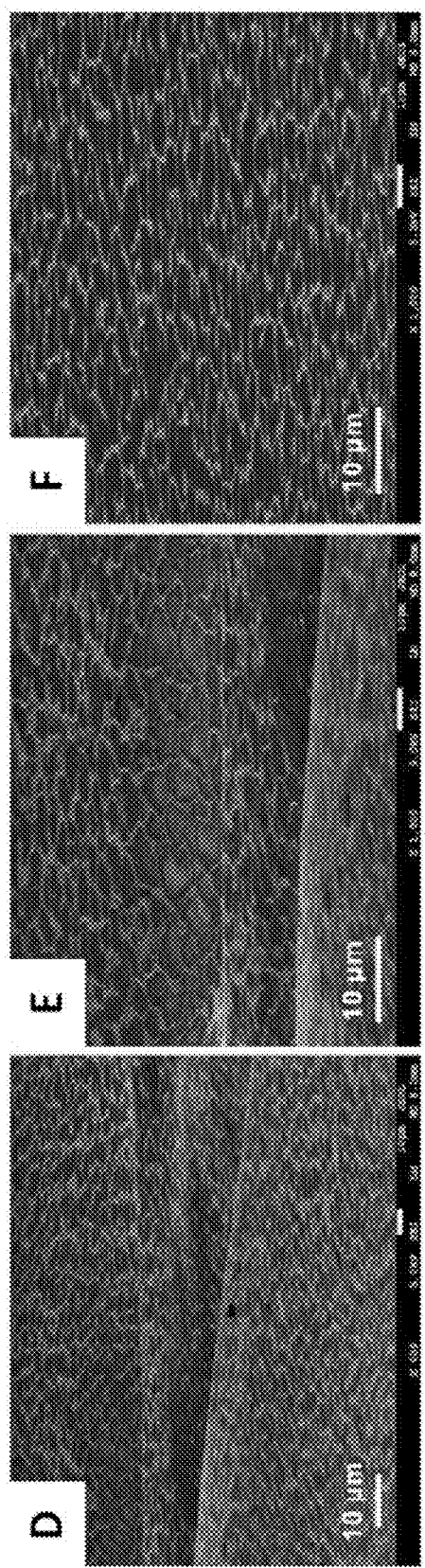

FIG. 4A shows the surface SEM image of PET after part of AgNW network transferred to a nanocellulose paper. Scale bar denotes 20 μm.

FIG. 4B shows the surface SEM image of a bare cellulose film. Scale bar denotes 10 μm.

FIG. 4C shows three SEM images of a cellulose transparent conductive paper (CTCP) with embedded AgNW coiled ring network. Scale bars denote 10 μm and 1 μm.

FIG. 4D shows a SEM image of CTCP at the tilt angle of 5°. Scale bar denotes 10 μm.

FIG. 4E shows a SEM image of CTCP at the tilt angle of 5°. Scale bar denotes 10 μm.

FIG. 4F shows a SEM image of CTCP at the tilt angle of 5°. Scale bar denotes 10 μm.

Figure 5:
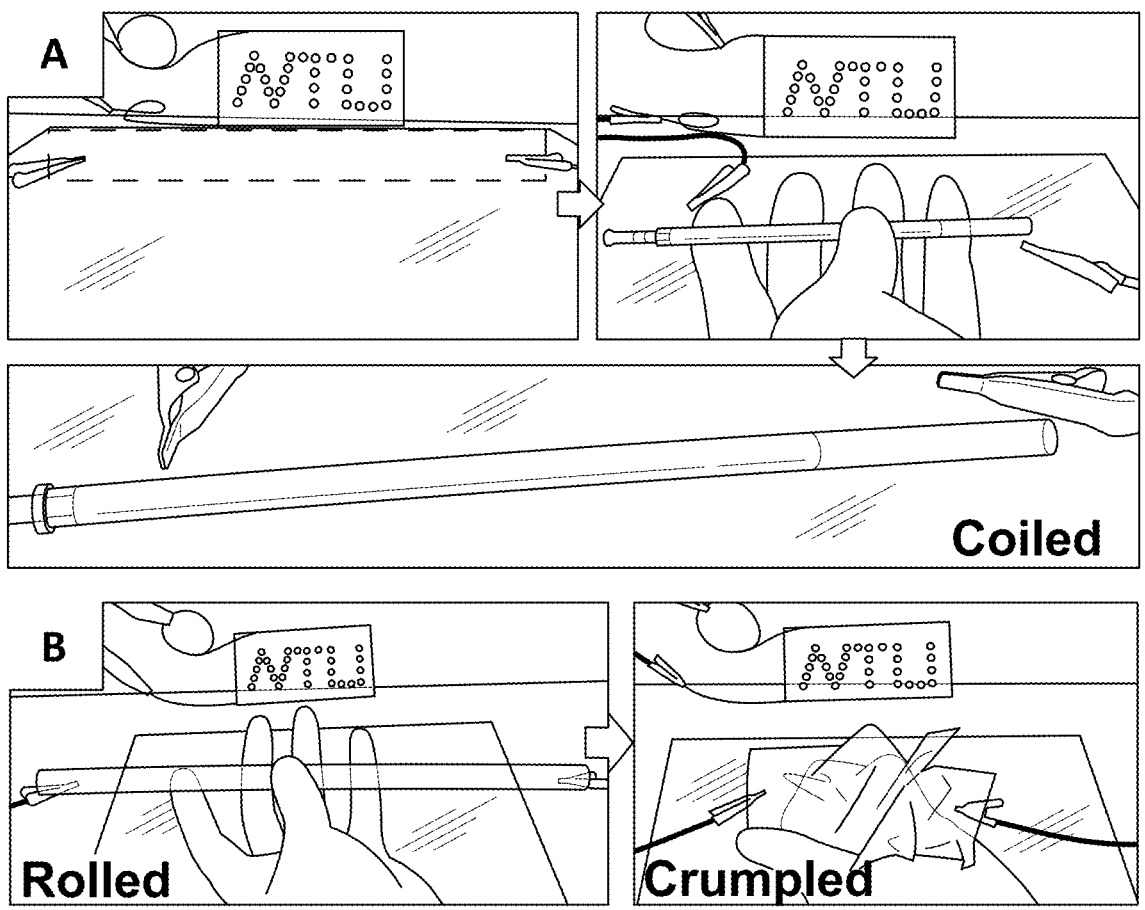
Figure 5:
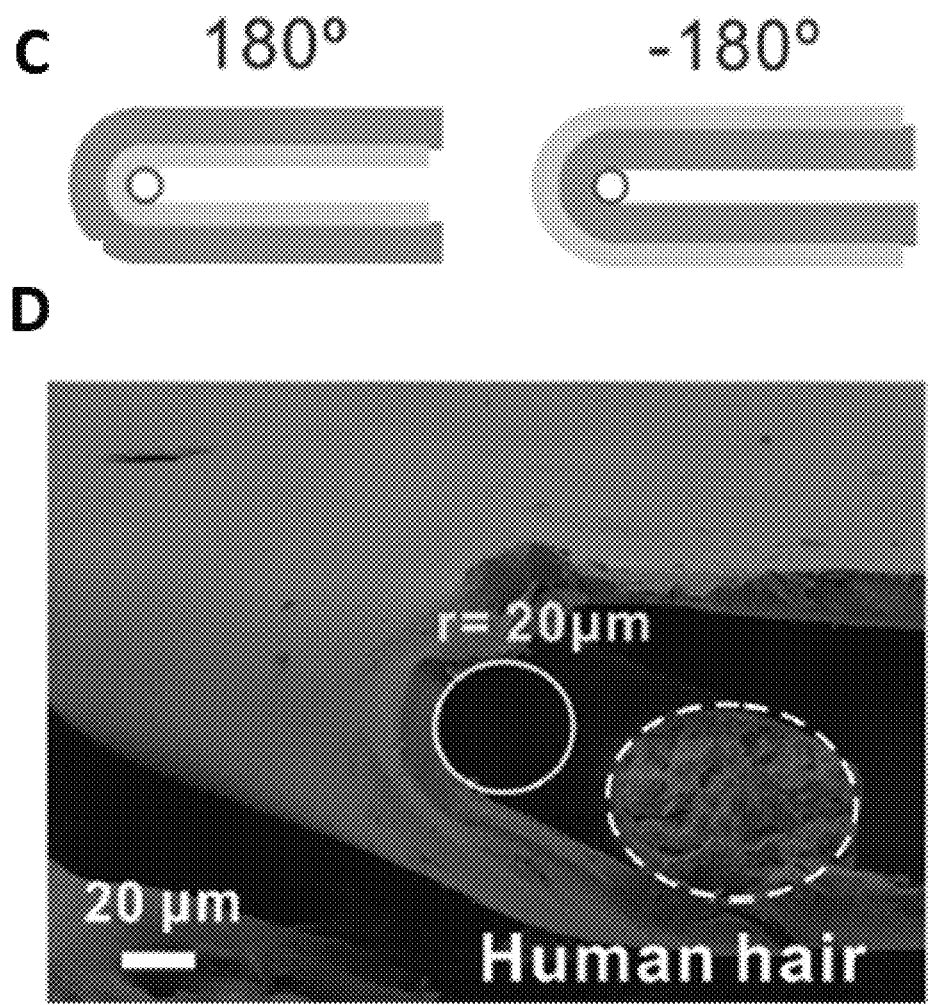
Figure 5:
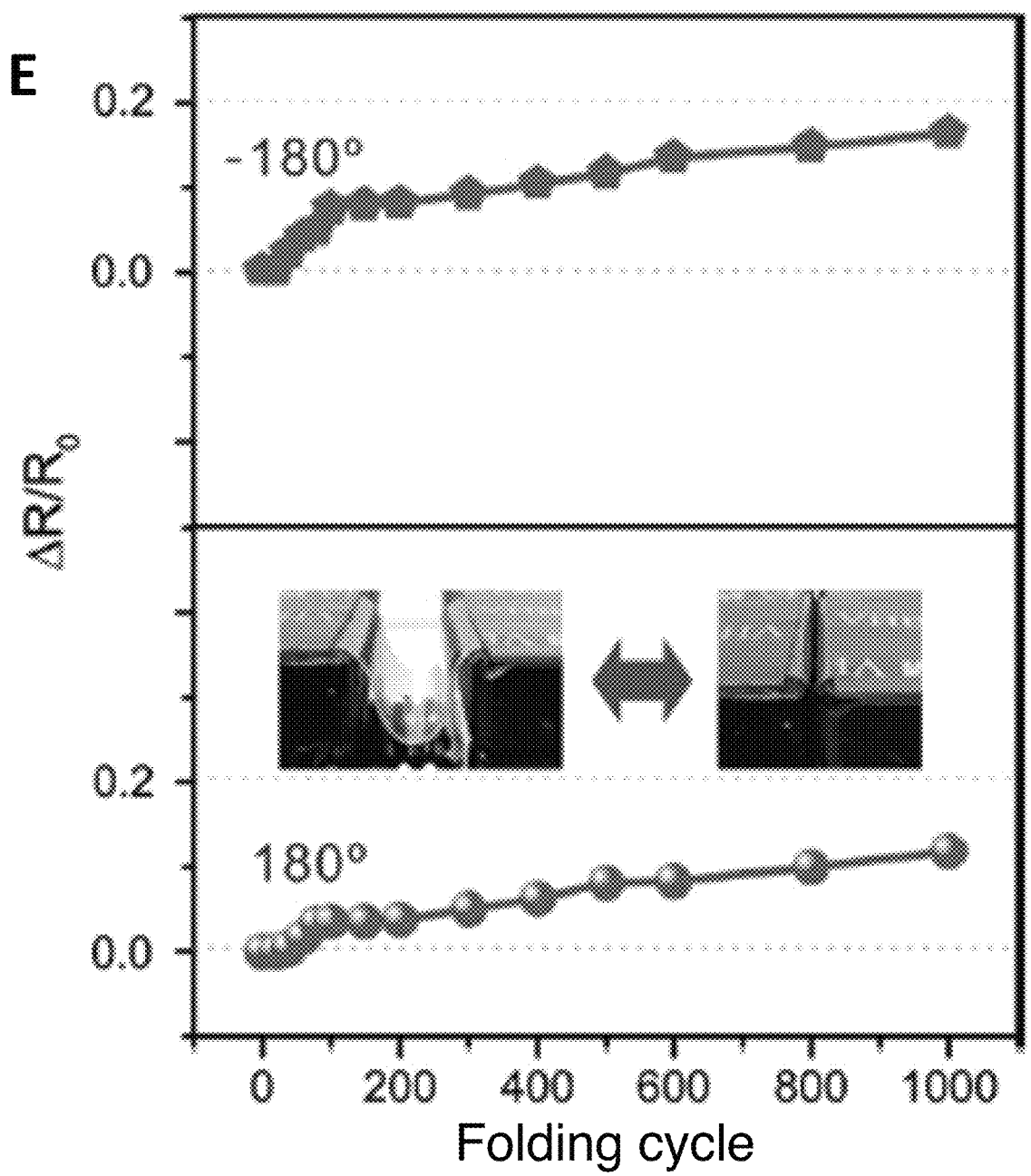
Figure 5:
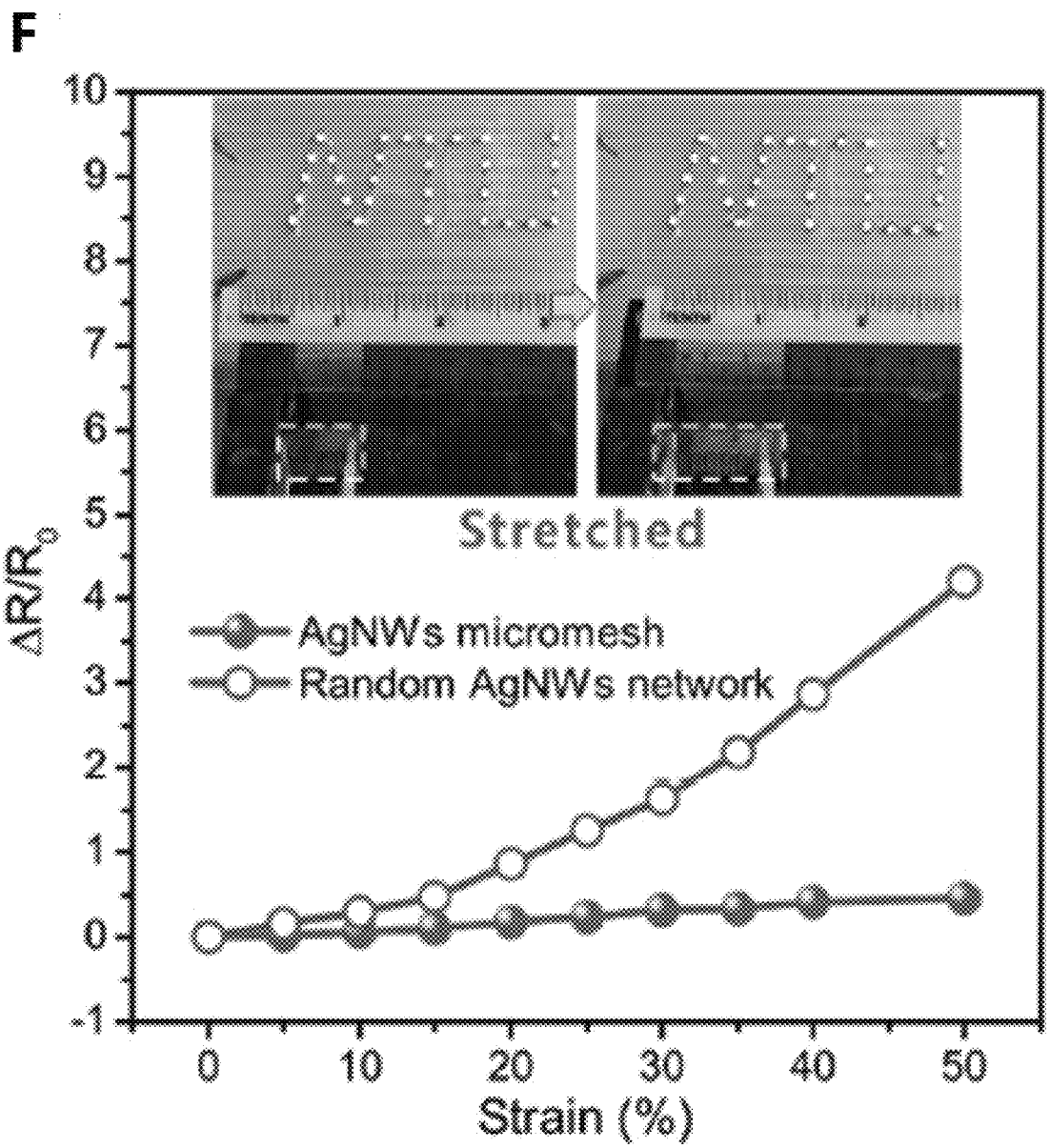
Figure 5:
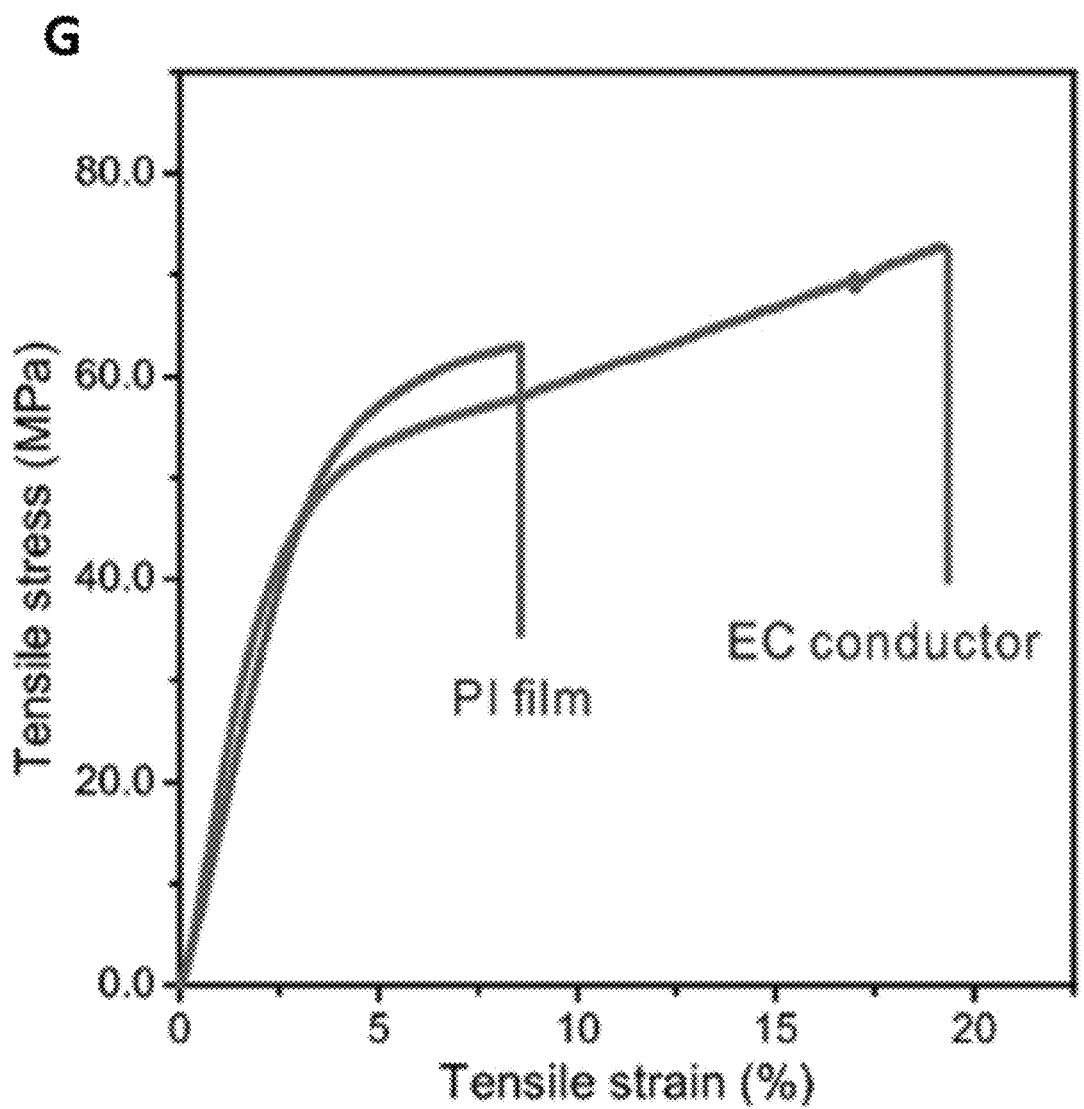
Figure 5:
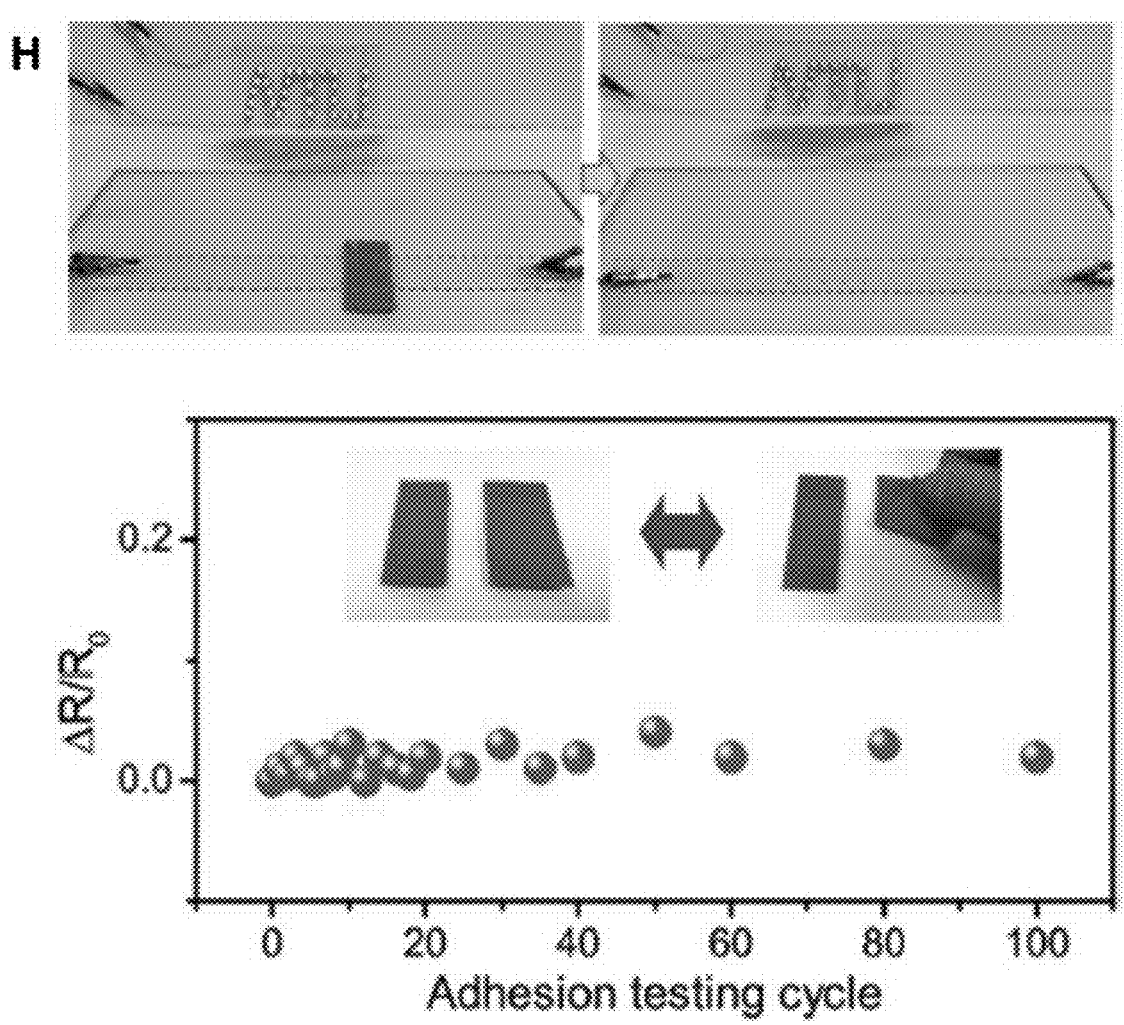
Figure 5:
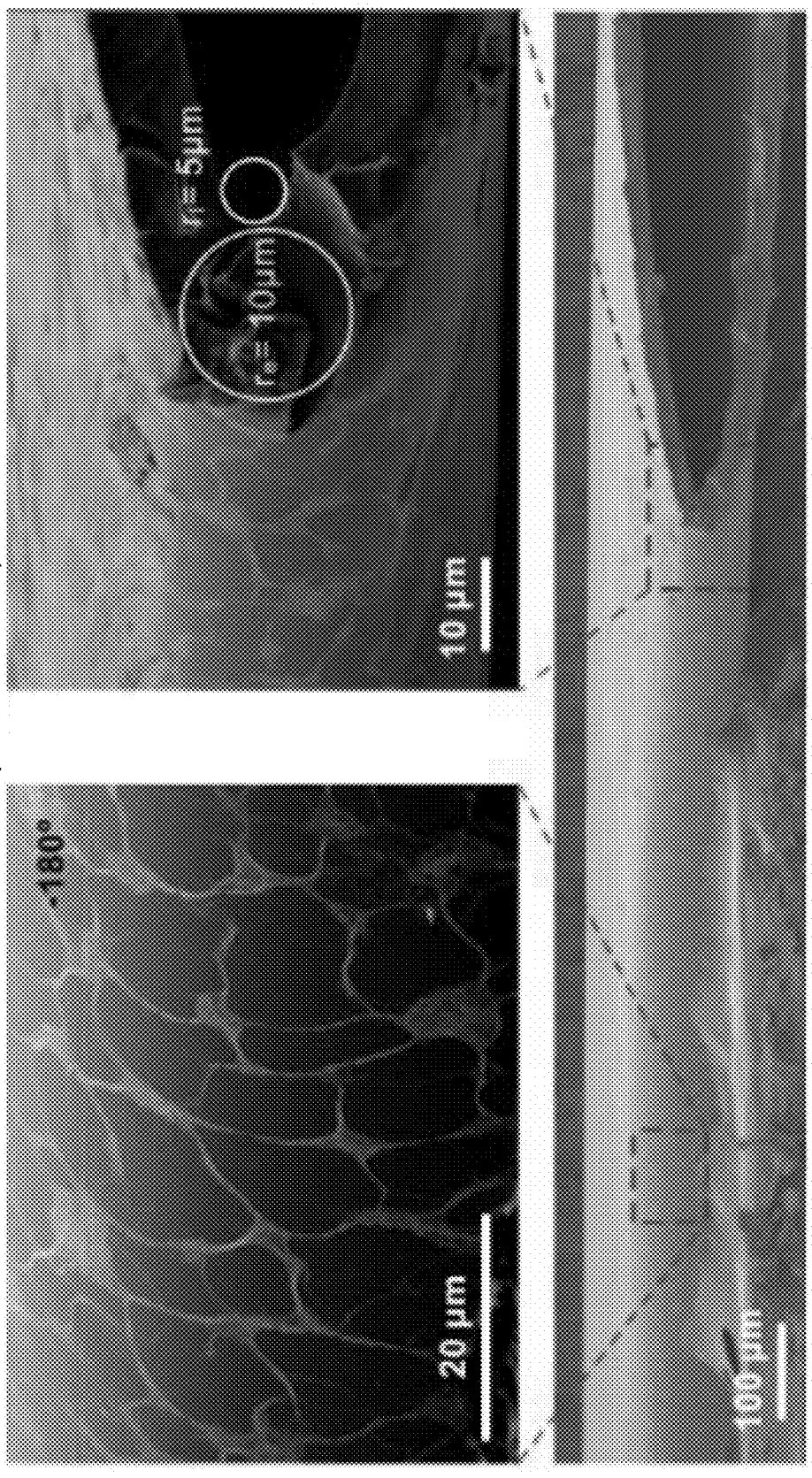
Figure 5:
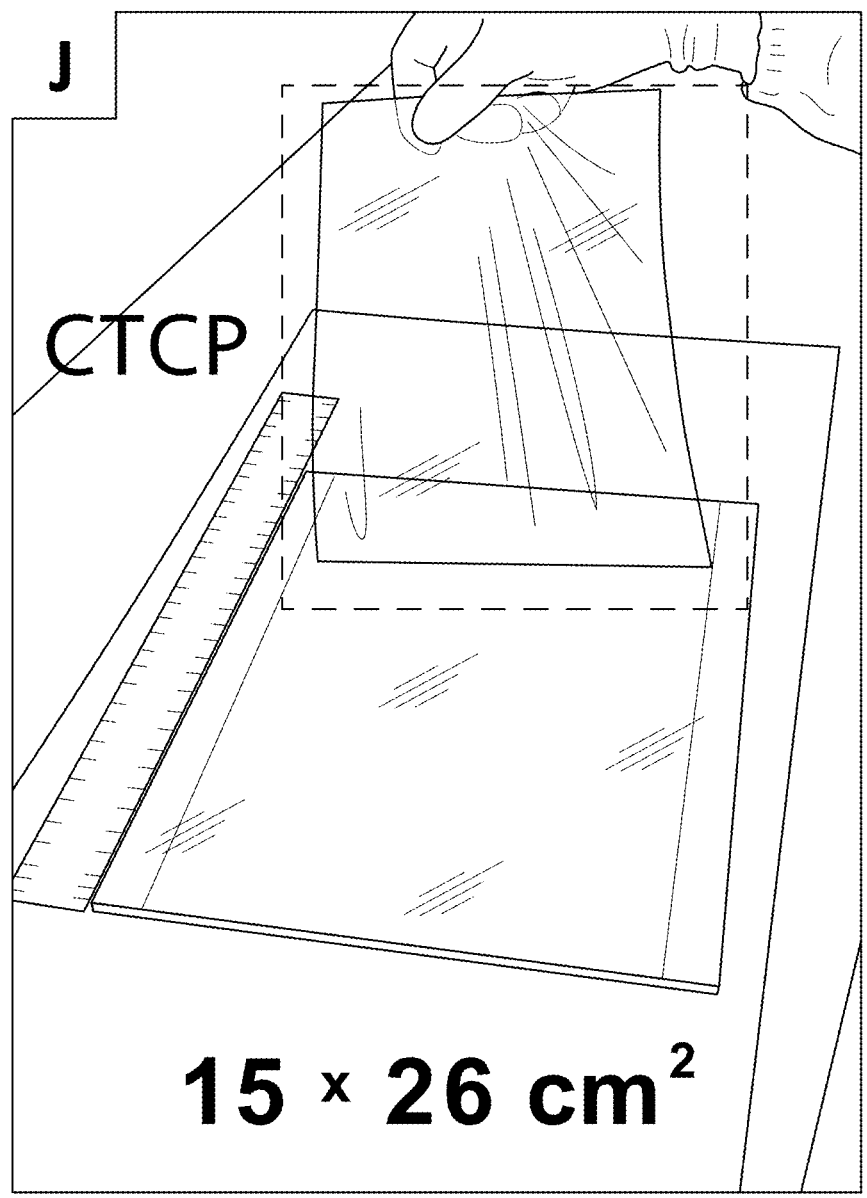

FIG. 5A shows a photo demonstration of an EC conductor ribbon (1.5×18 cm$^2$) as an electrode to maintain the lighted LEDs after coiled around the ink cartridge of a ballpoint pen (d=0.5 mm).

FIG. 5B shows a photo demonstration of an EC paper (15×25 cm$^2$) as electrode to retain the lighted LEDs after rolled into a roll (d=1.5 cm) and extremely crumpled into a spitball.

FIG. 5C depicts schematics for folding the EC paper into different angles. In the left image, the inner light grey layer represents AgNWs micromesh while the outer dark grey layer represents EC substrate. In the right image, the outer light grey layer represents AgNWs micromesh while the inner dark grey layer represents EC substrate.

FIG. 5D shows a SEM cross-section image of a 180° folded EC conductor (thickness 15 μm) with an insert, of a human hair (≈70 μm). Scale bar denotes 20 μm.

FIG. 5E is a plot of $\Delta R/R_0$ of folded EC conductor at 180° and −180° with different folding cycles. $\Delta R$ is the increased resistance of conductors under deformations, $R_0$ is the initial resistance. Sheet resistance was measured for evaluating the foldability and adhesion, resistance was measured for examining the stretchability.

FIG. 5F is a plot of $\Delta R/R_0$ versus uniaxial strain for a stretchable AgNWs micromesh conductor on a 0.2 mm PDMS substrate. Insets are photos for demonstrating the stretched conductor that retained the lighted LEDs. $\Delta R$ is the increased resistance of conductors under deformations, $R_0$ is the initial resistance. Sheet resistance was measured for evaluating the foldability and adhesion, resistance was measured for examining the stretchability.

FIG. 5G shows the tensile property comparison of the present EC conductor and a commercial PI film (thickness 15 μm).

FIG. 5H includes a plot of $\Delta R/R_0$ of EC conductor at different testing cycles with 3M tape. Insets are photo demonstrations of an EC ribbon (1.5×18 cm$^2$) electrode for maintaining the lighted LEDs even after peeling off by a 3M VHB tape (width, 2 cm). $\Delta R$ is the increased resistance of conductors under deformations, $R_0$ is the initial resistance. Sheet resistance was measured for evaluating the foldability and adhesion, resistance was measured for examining the stretchability.

FIG. 5I shows the surface morphology of AgNWs mesh on a folded EC conductors (−180°) with external folding radius of 10 μm (top left image). The top right image shows that 5 μm of internal folding radius was achieved on an EC conductor with no mechanical failures.

FIG. 5J demonstrates peelability of a CTCP having a large dimension of 15 cm by 26 cm.

Figure 6:
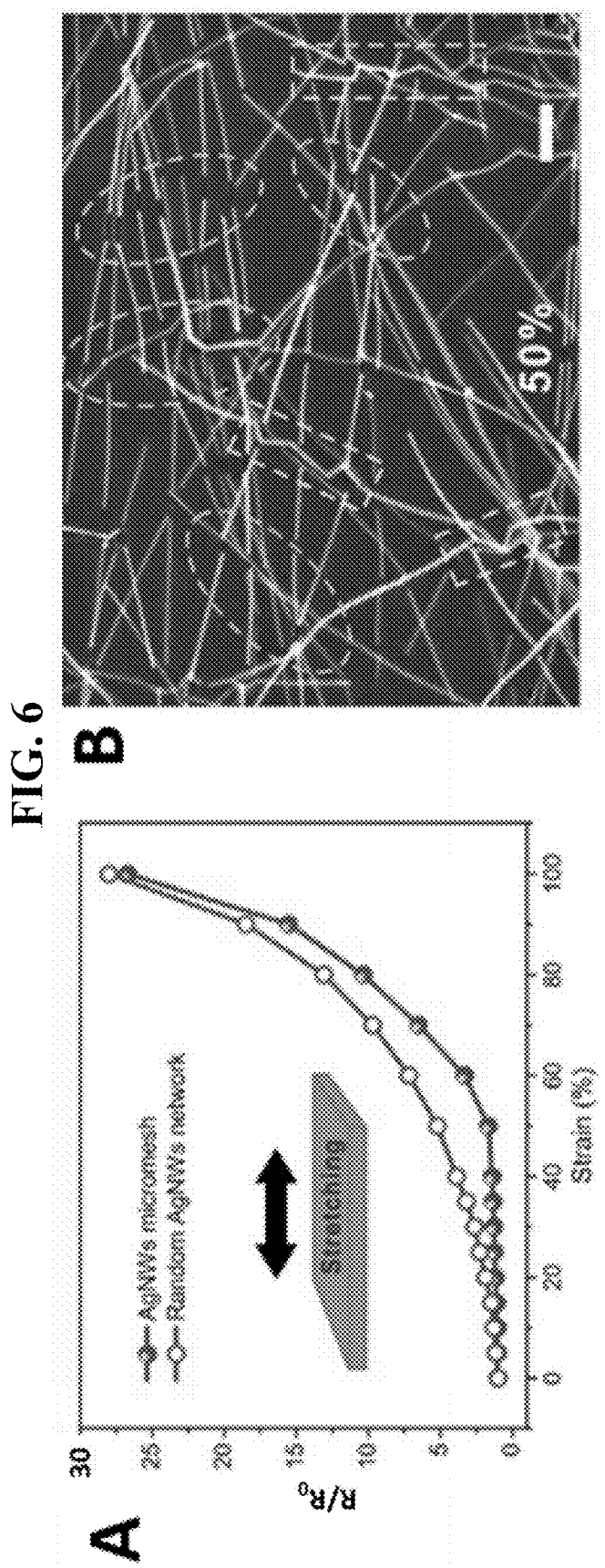
Figure 6:
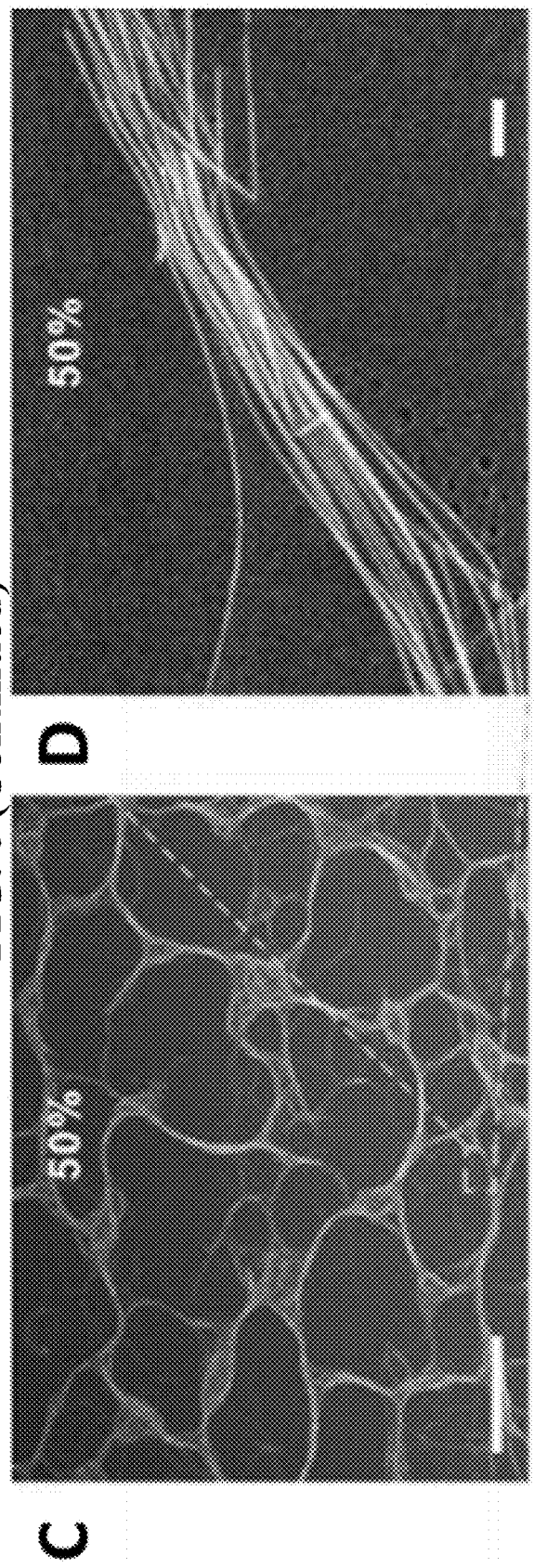
Figure 6:
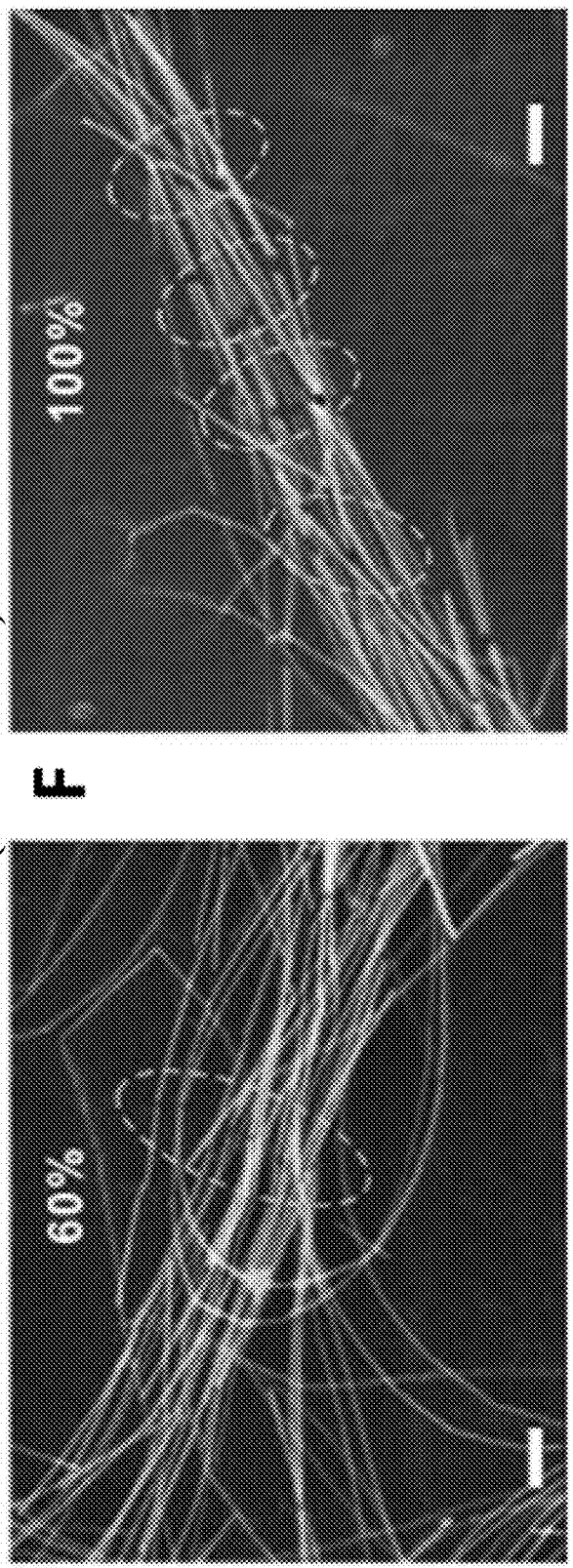
Figure 6:
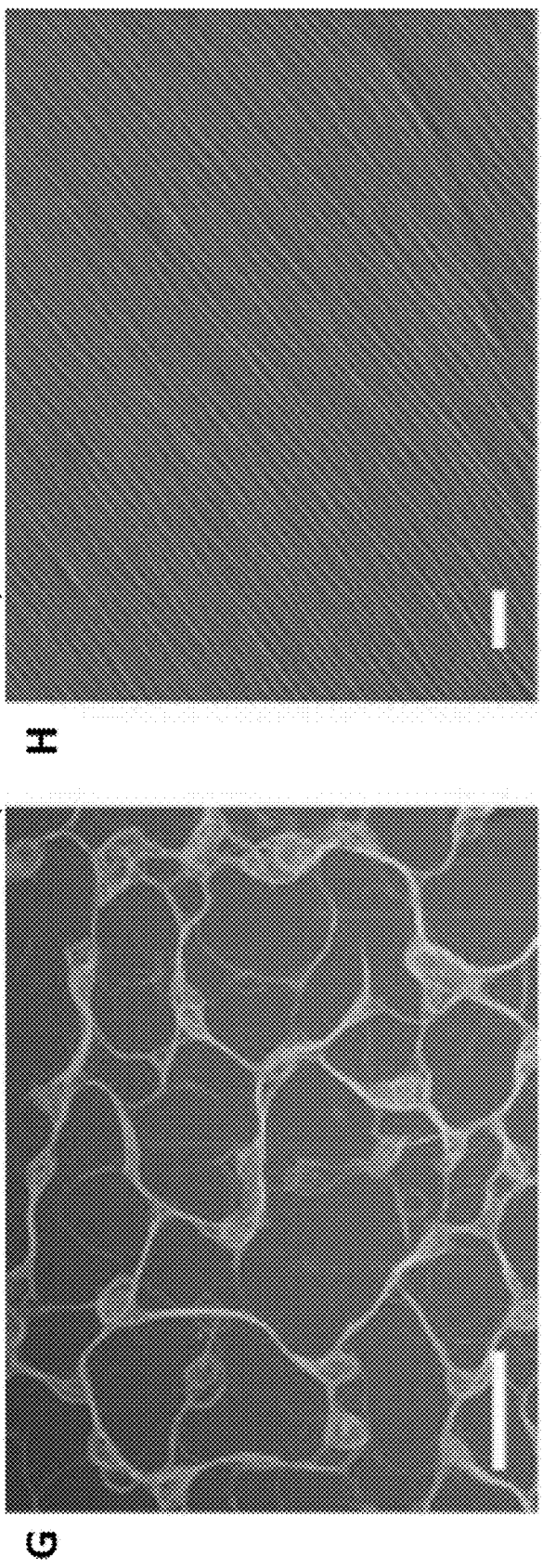

FIG. 6A is a plot of the uniaxial strain applied to the conductors, in comparison, AgNWs micromesh shows lesser increase of resistance under the same strain, its resistance increased by 46% after being stretched to 50% strain, while 420% increase of resistance occurred on the random AgNWs network with the same strain.

FIG. 6B is a SEM image showing the morphology to confirm the mechanism. Upon application of 50% strain, the random AgNWs network was severely damaged, the rectangles indicate the obvious displacements between AgNWs while the ellipses mark the breakpoints of AgNWs. Scale bar denotes 300 nm.

FIG. 6C is another SEM image showing the morphology to confirm the mechanism. In comparison to FIG. 6B, the AgNWs micromesh retains its good condition, there is no failure observed on the AgNWs bundle. Scale bar denotes 10 μm.

FIG. 6D is another SEM image showing the morphology to confirm the mechanism. In comparison to FIG. 6B, the AgNWs micromesh retains its good condition, there is no failure observed on the AgNWs bundle. Scale bar denotes 300 nm.

FIG. 6E is another SEM image showing the morphology to confirm the mechanism. A slight crack emerged on the bundle at 60% strain, resulting in the increased $R_s$. Scale bar denotes 300 nm.

FIG. 6F shows the cracks of AgNWs bundle increased at 100% strain, leading to the significant increase of $R_s$. The better stretchability of AgNWs micromesh conductor can be attributed to the advantages of ring network structure, which has pre-shape-change occurred at the initial strain (<50%) to retain the fine conductive paths. The conductivity would only decrease until there are displacements or failures occurred on the AgNWs ring structure. Scale bar denotes 300 nm.

FIG. 6G is a SEM planar view image of the AgNWs micromesh after surface adhesion test using 3M VHB tape. Scale bar denotes 10 μm.

FIG. 6H is a SEM planar view image of the AgNWs micromesh after 100 cycles of adhesion test using 3M VHB tape. Scale bar denotes 10 μm.

Figure 7:
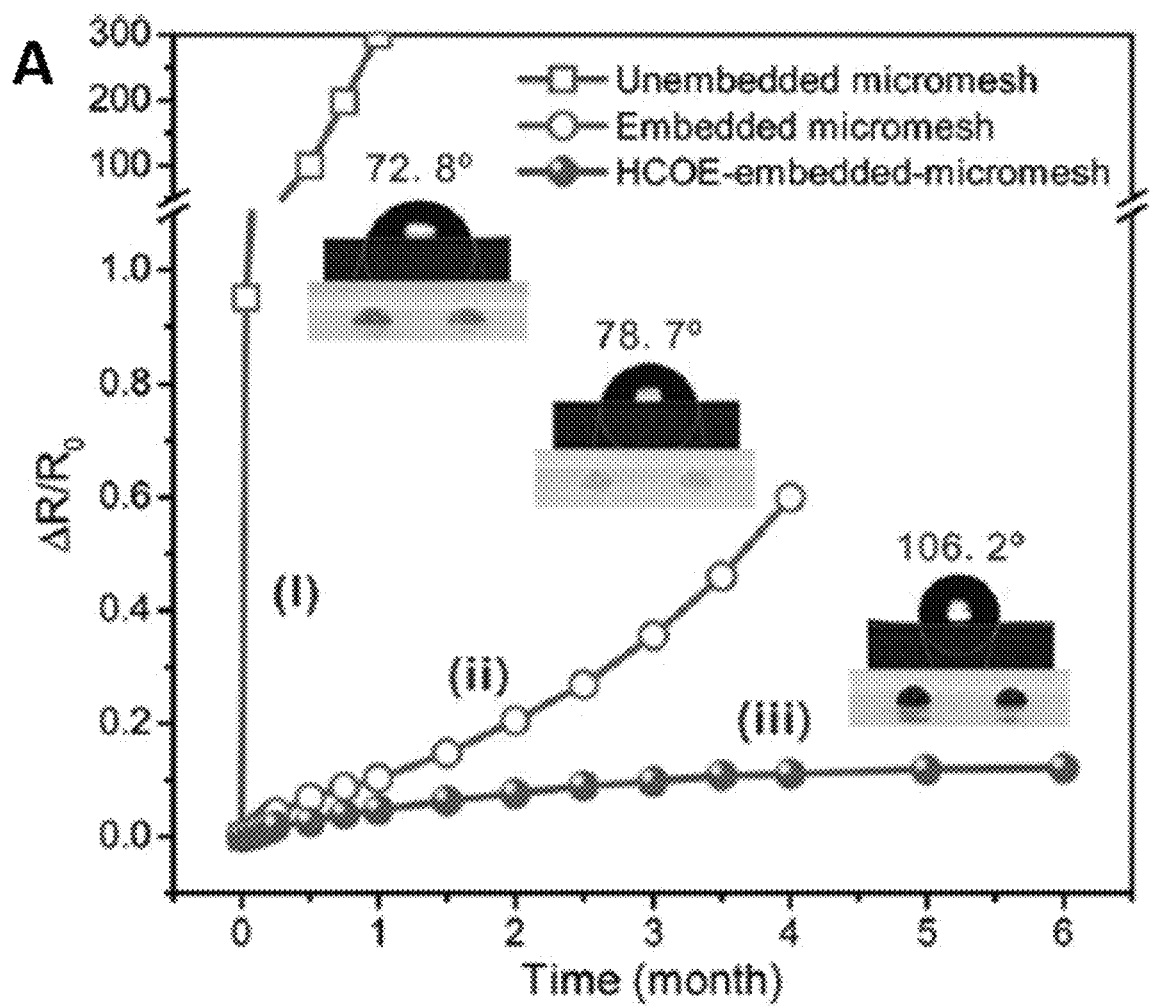
Figure 7:
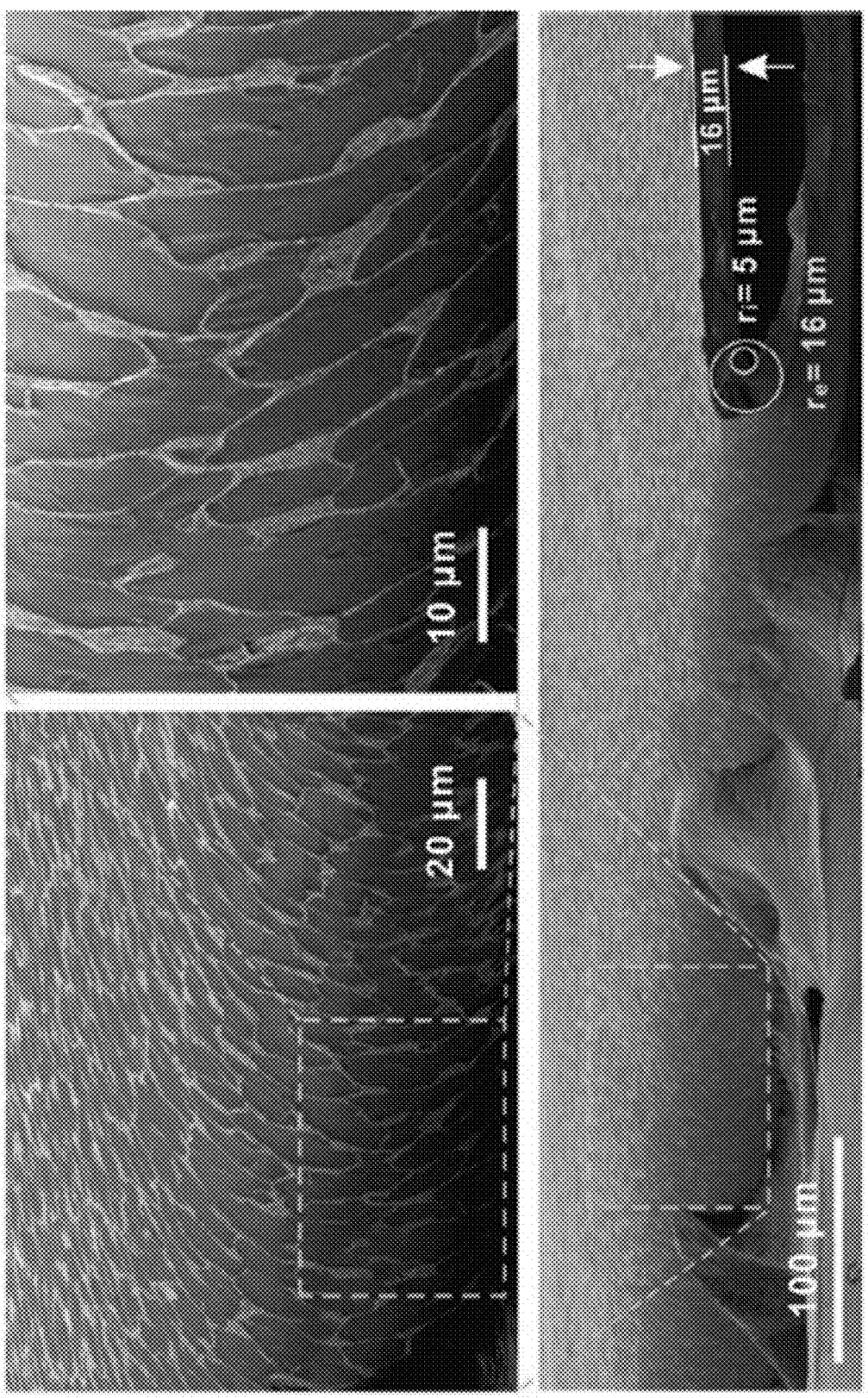
Figure 7:
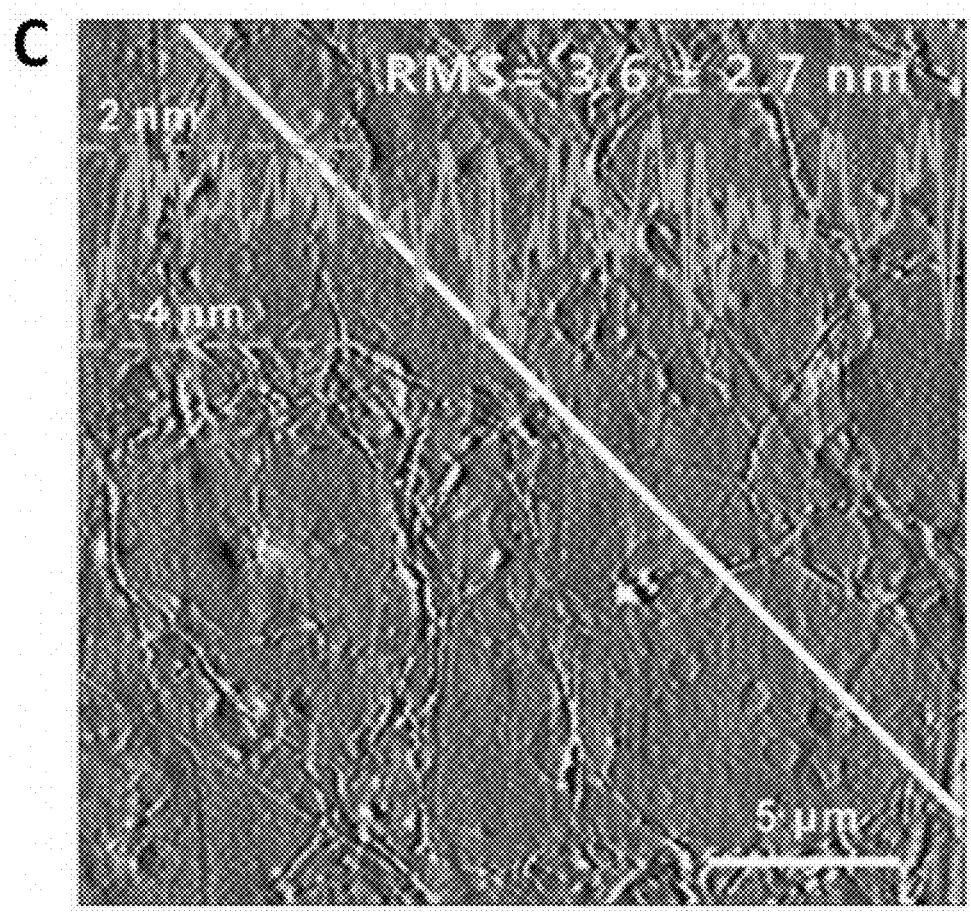
Figure 7:
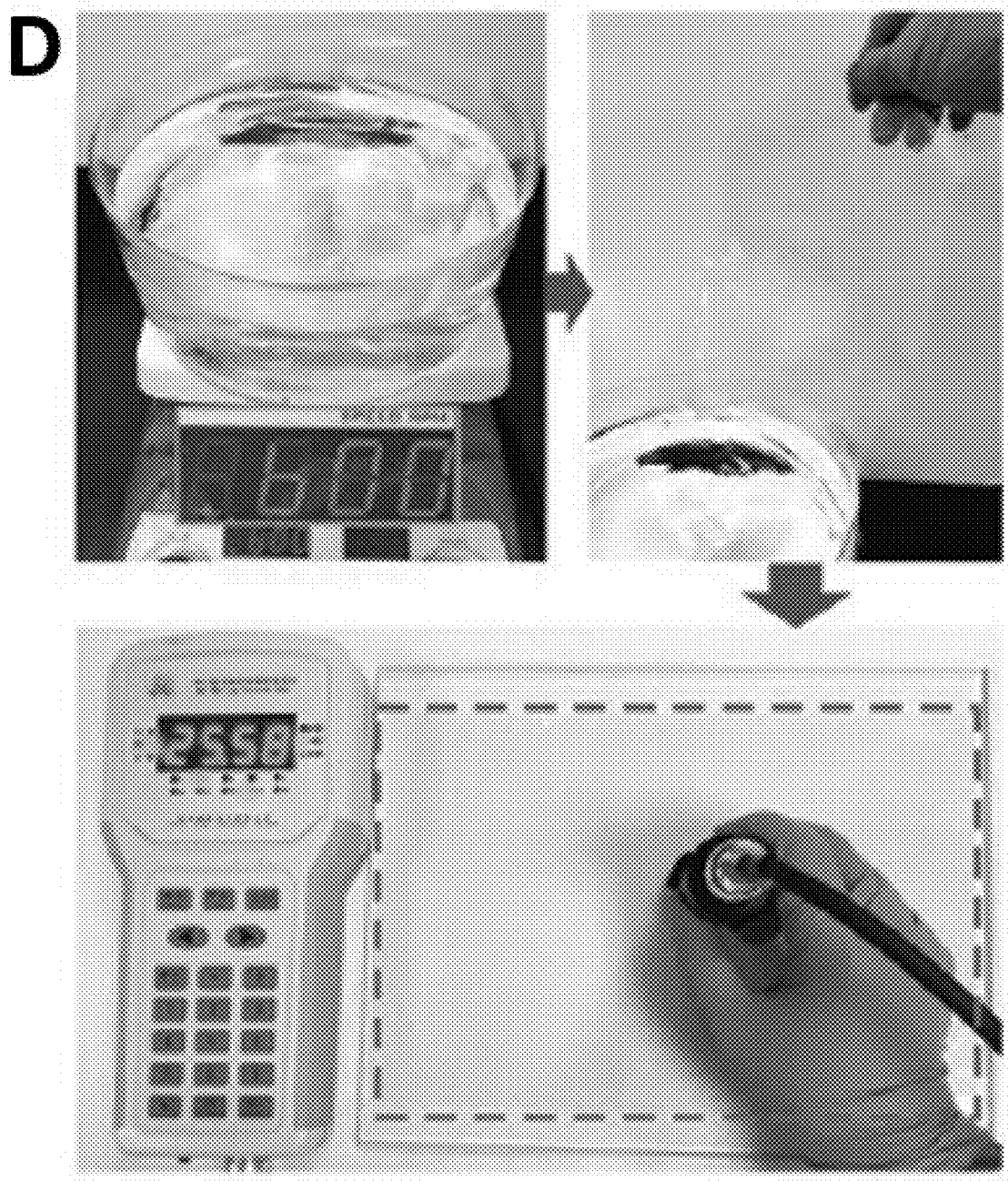
Figure 7:
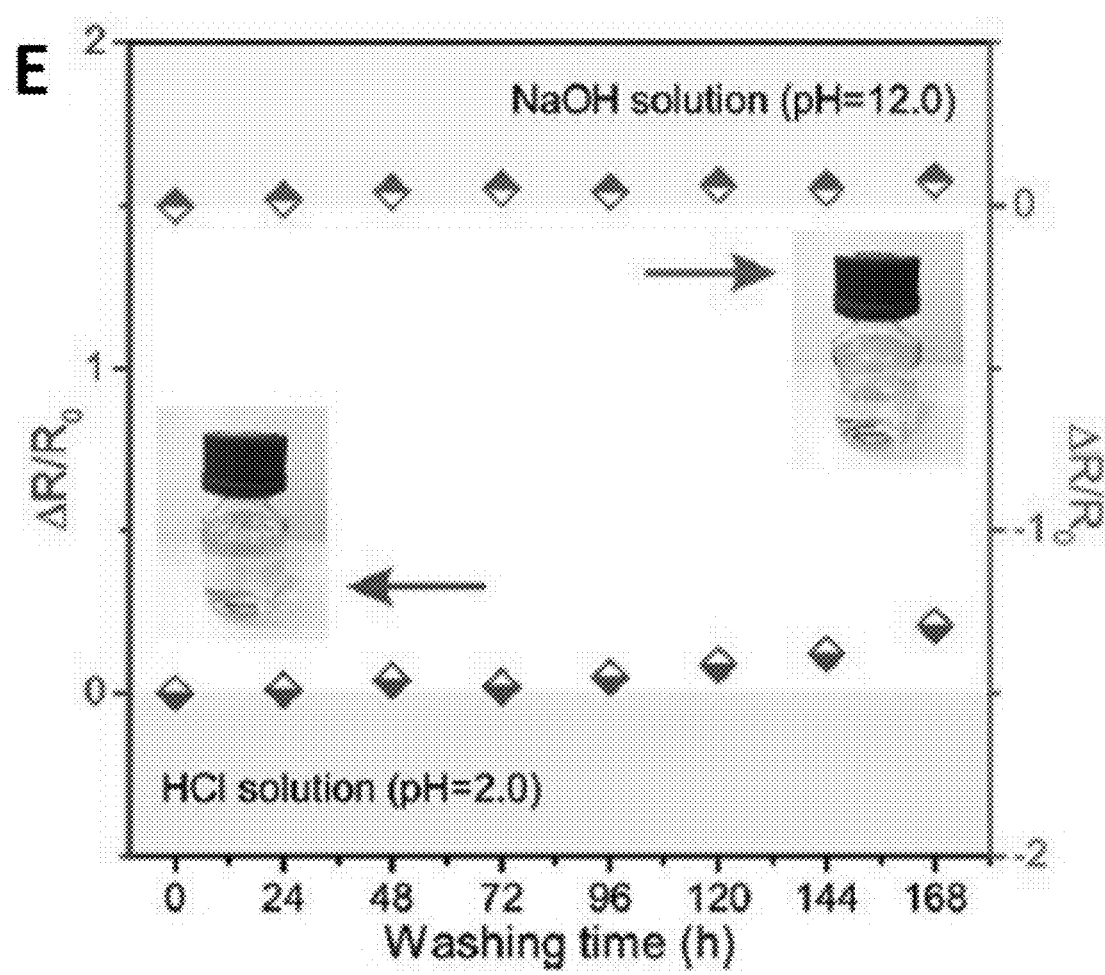

FIG. 7A shows the comparison of conductivity stability of three AgNWs micromesh including an HCOE protected EC conductors with environmental exposure.

FIG. 7B shows SEM images of a folded HEC conductor (16 μm) at −180° with 5 μm internal radius ($r_i$) and 20 μm external folding radius ($r_e$), demonstrating the extreme foldability of EC substrate and AgNWs micromesh. Scale bars denote 20 μm (top left image), 10 μm (top right image) and 100 μm (bottom image), respectively.

FIG. 7C shows an AFM image of the present HEC conductor for demonstration of retaining AgNWs micromesh with lower surface roughness. Inserted curve denotes the surface height marked by white line. Scale bar denotes 5 μm.

FIG. 7D shows photo demonstration of the washed HEC conductor with stable sheet resistance.

FIG. 7E shows the conductive stability of washed HEC conductor under harsh environments (pH of 2 and 12).

Figure 8:
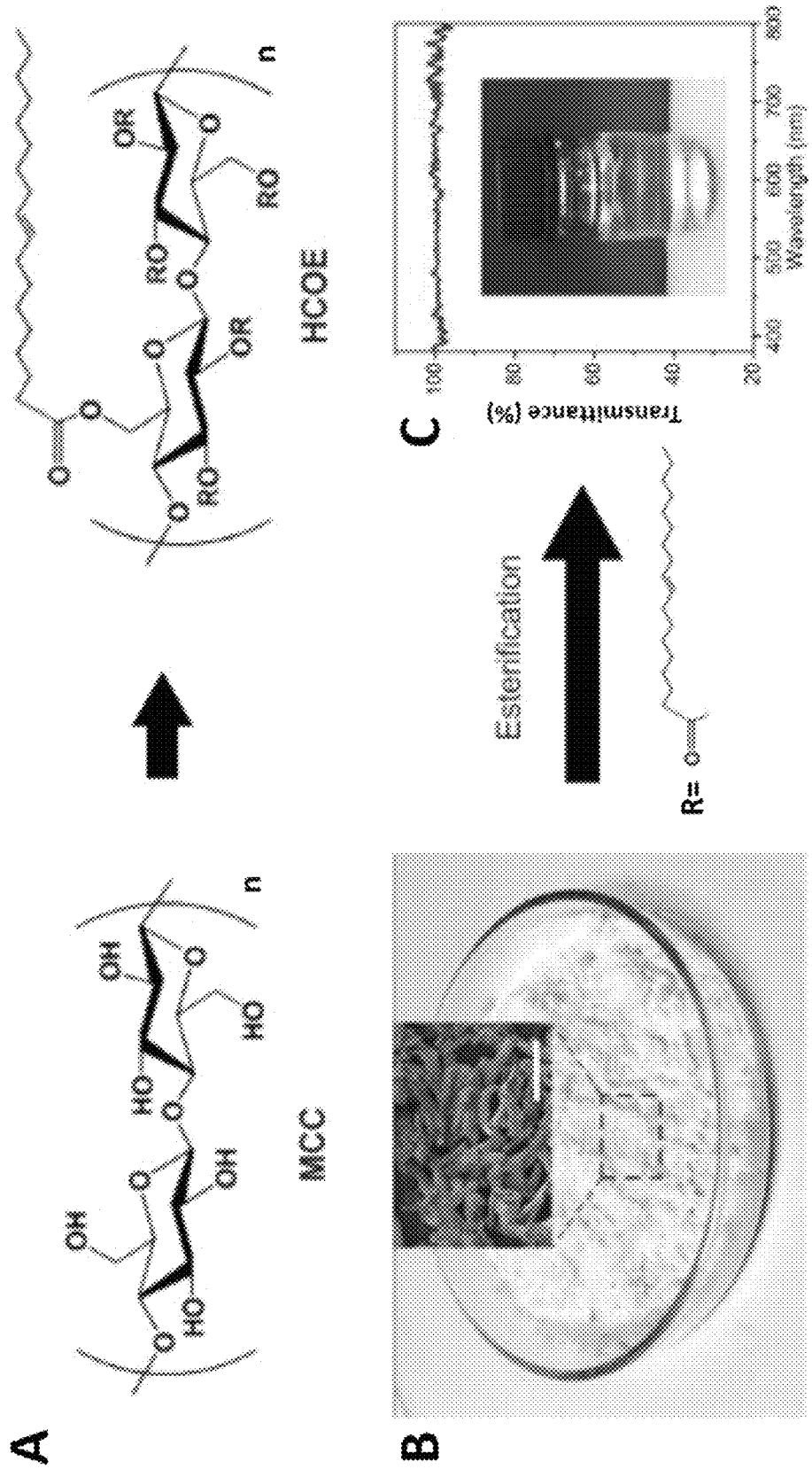

FIG. 8A shows a schematic synthesis process of HCOE from the microcrystalline cellulose (MCC).

FIG. 8B shows MCC powder with length of 60±10 μm. Scale bar denotes 100 μm.

FIG. 8C shows transmittance spectra of HCOE thin layer with thickness of 20±5 nm.

Figure 9:
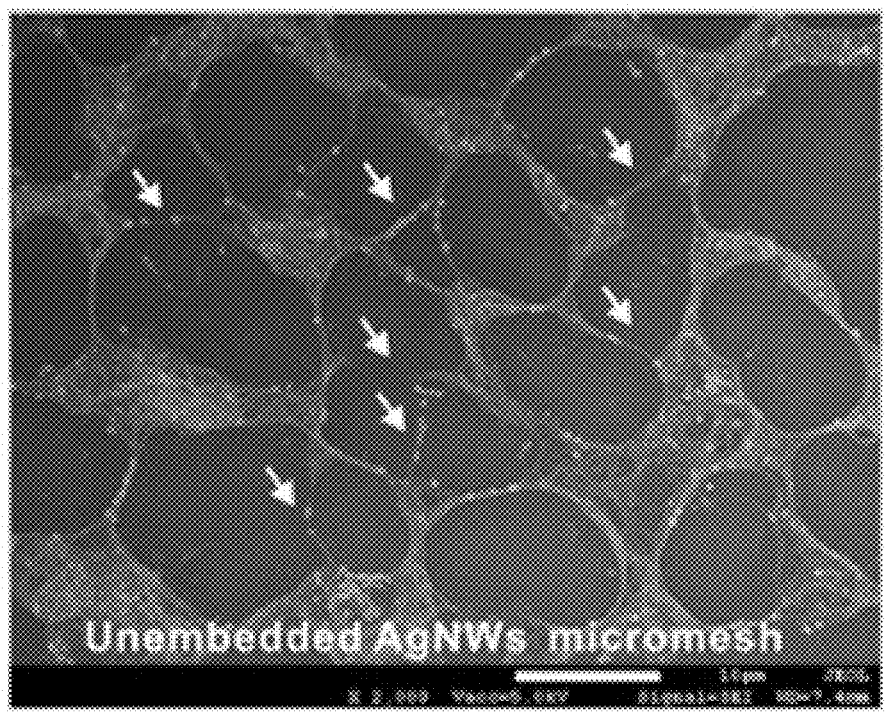
Figure 9:
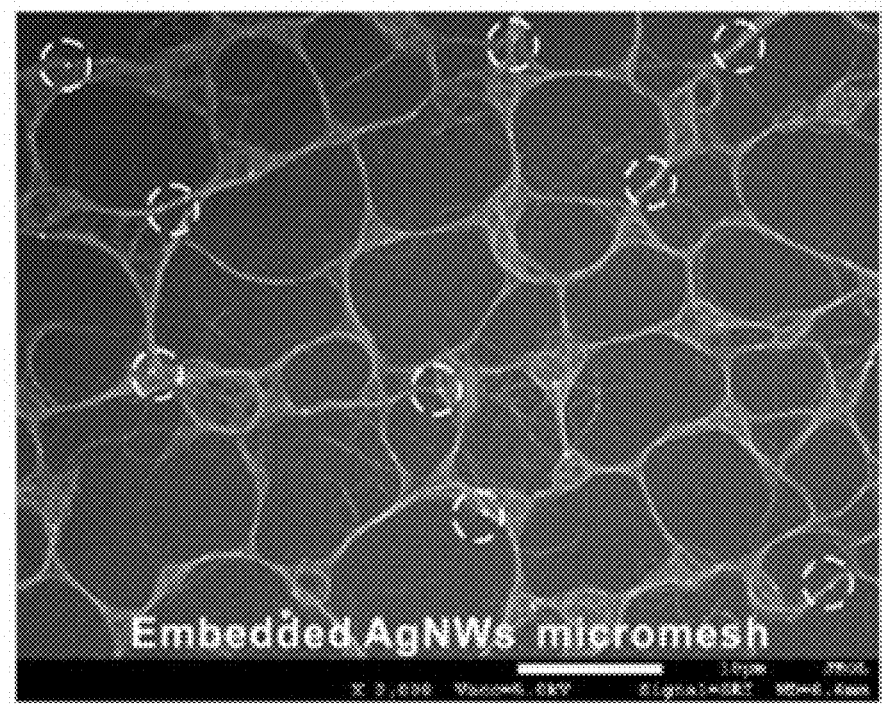
Figure 9:
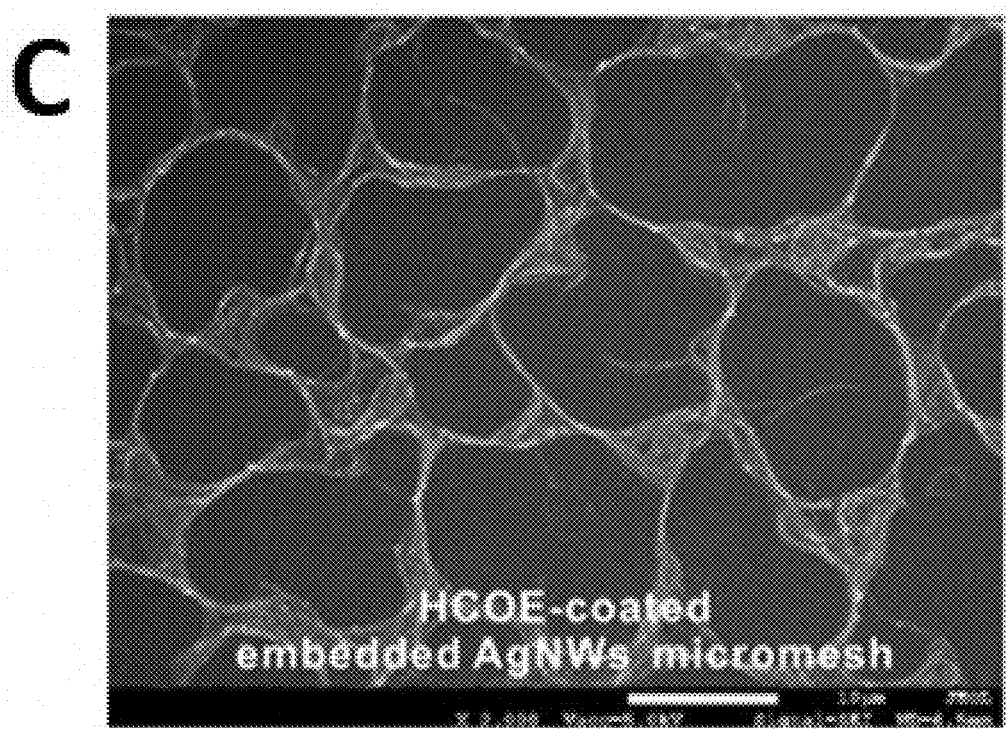
Figure 9:
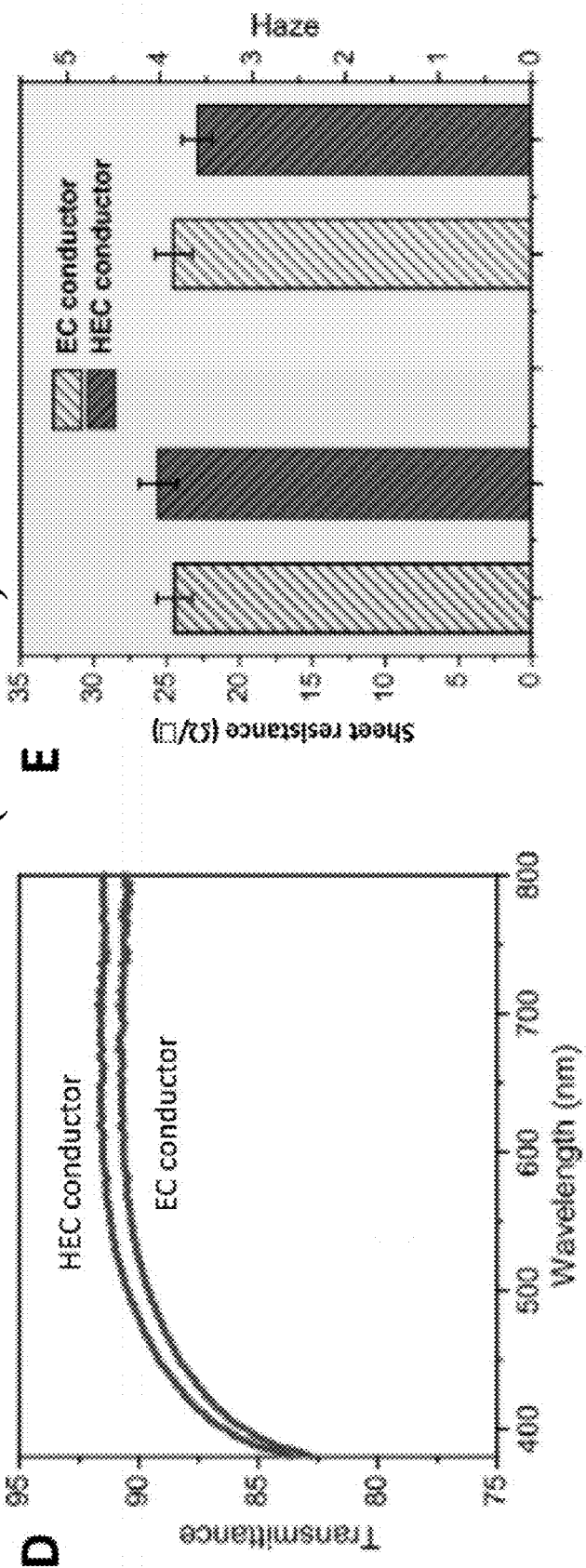

FIG. 9A shows non-embedded AgNWs micromesh coated on the PET substrate. Particles emerged due to oxidation of nanowire, the arrows were marked to indicate some of the fractured AgNWs bundles due to the severe oxidation. Scale bar denotes 10 μm.

FIG. 9B shows embedded. AgNWs micromesh examined on EC substrate. The red circles were marked to indicate the presence of particles that were formed due to the oxidation of some nanowires. Scale bar denotes 10 μm.

FIG. 9C shows embedded AgNWs micromesh with coating of HCOE (8±4 nm). Scale bar denotes 10 μm.

FIG. 9D shows transmittance spectra of EC conductor before and after coating with HCOE.

FIG. 9E is a plot of the sheet resistance and haze of EC conductor and HEC conductor, 7 samples were measured to obtain the results.

Figure 10:
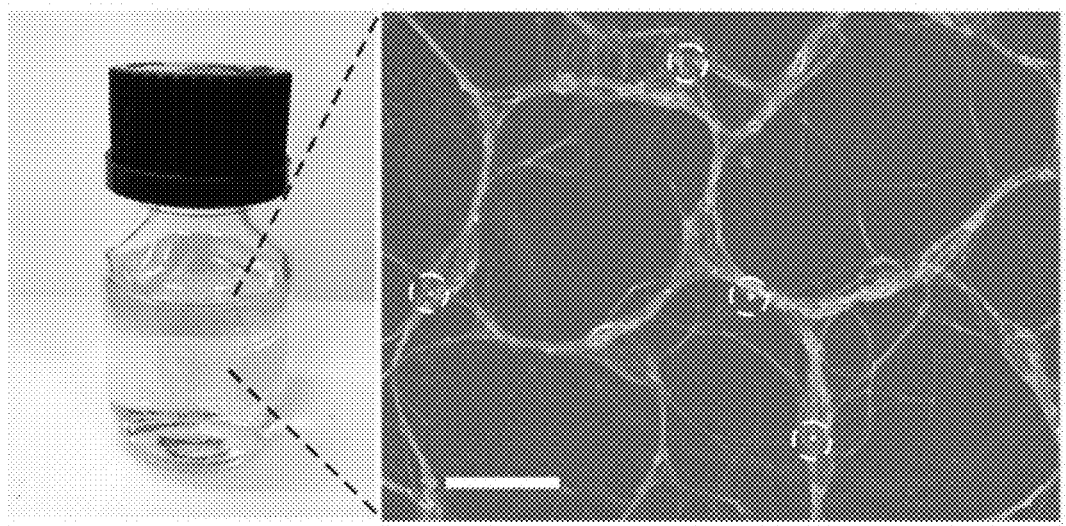
Figure 10:
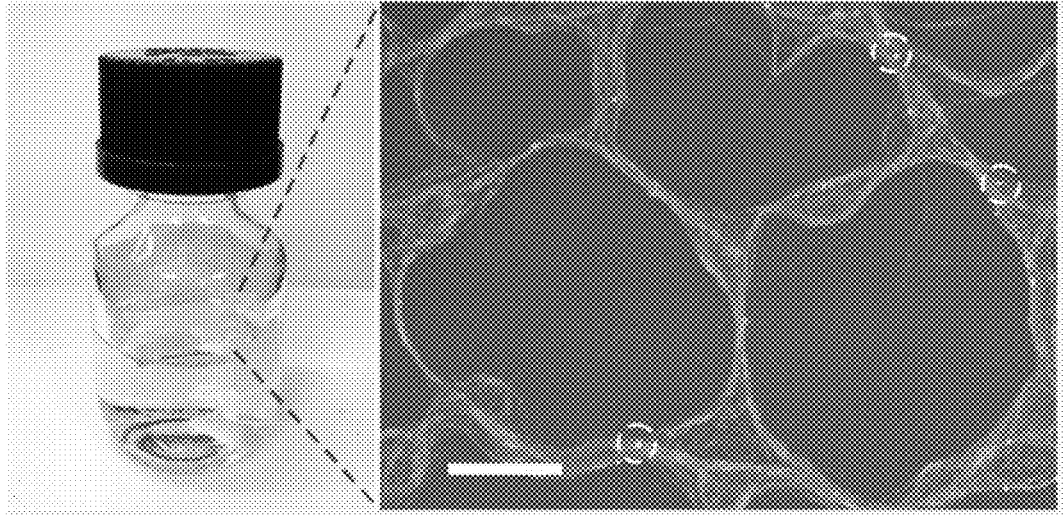

FIG. 10A shows a SEM planar view image of AgNWs micromesh after washing in HCl solution (pH=2). Scale bar denotes 5 μm.

FIG. 10B shows a SEM planar view image of AgNWs micromesh after washing in NaOH solution (pH=12). Scale bar denotes 5 μm.

Figure 11:
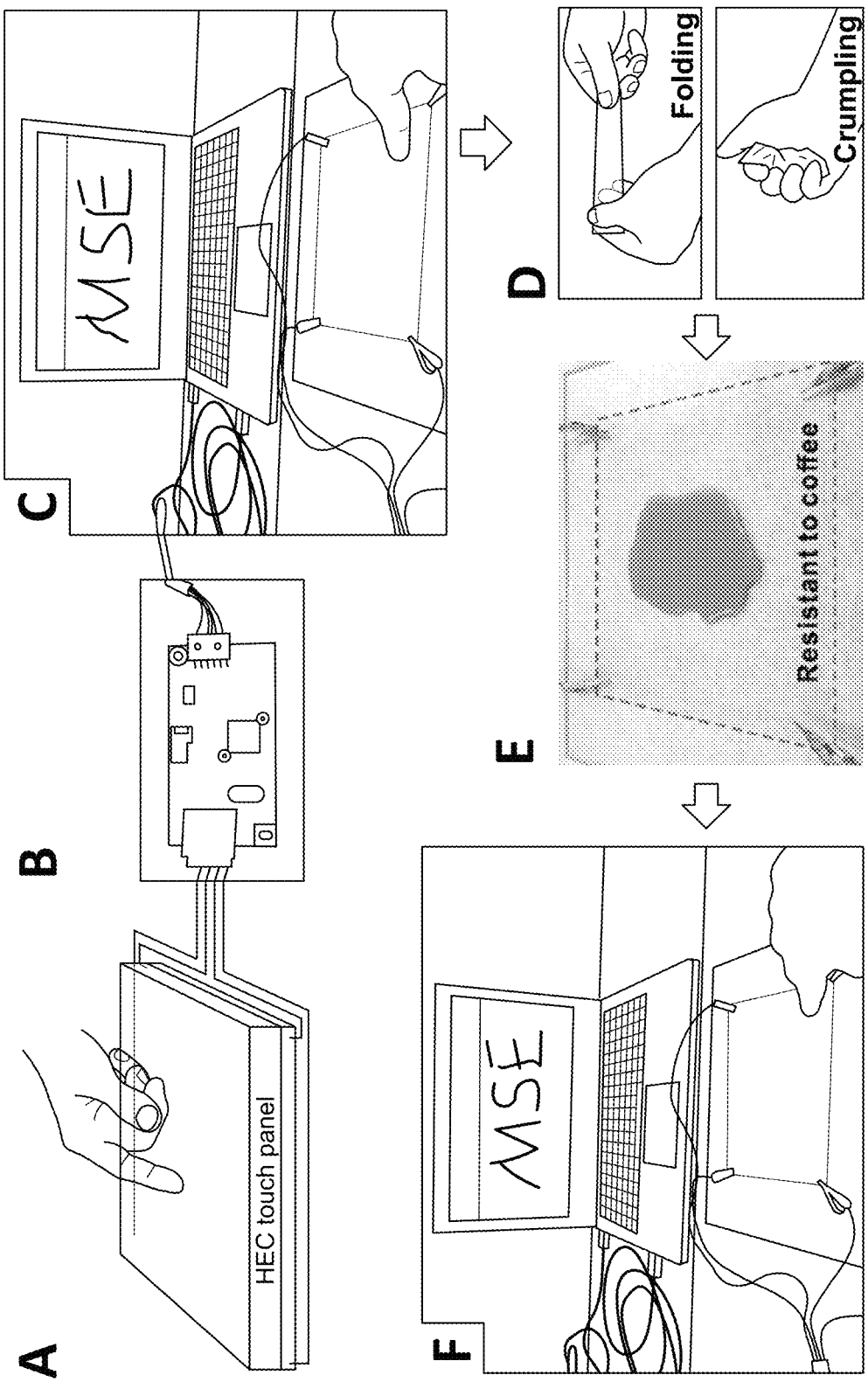

FIG. 11A is a schematic illustration of the EC conductor configured for use as a capacitive touch panel (12×18 $cm^2$), having the EC (top layer) conductor with embedded AgNWs micromesh (bottom layer).

FIG. 11B shows the touch panel operated by a commercial controller with a connection to a computer.

FIG. 11C shows the output pattern.

FIG. 11D shows photo demonstration of the touch panel working normally even after various mechanical deformations, such as folding and crumpling.

FIG. 11E shows photo demonstration of coffee spilled onto the touch panel.

FIG. 11F shows photo demonstration of the touch panel working normally even after coffee was spilled thereon. Hence, the touch panel constructed based on the present conductor is resistant to coffee, or even liquid failure.

Figure 12:
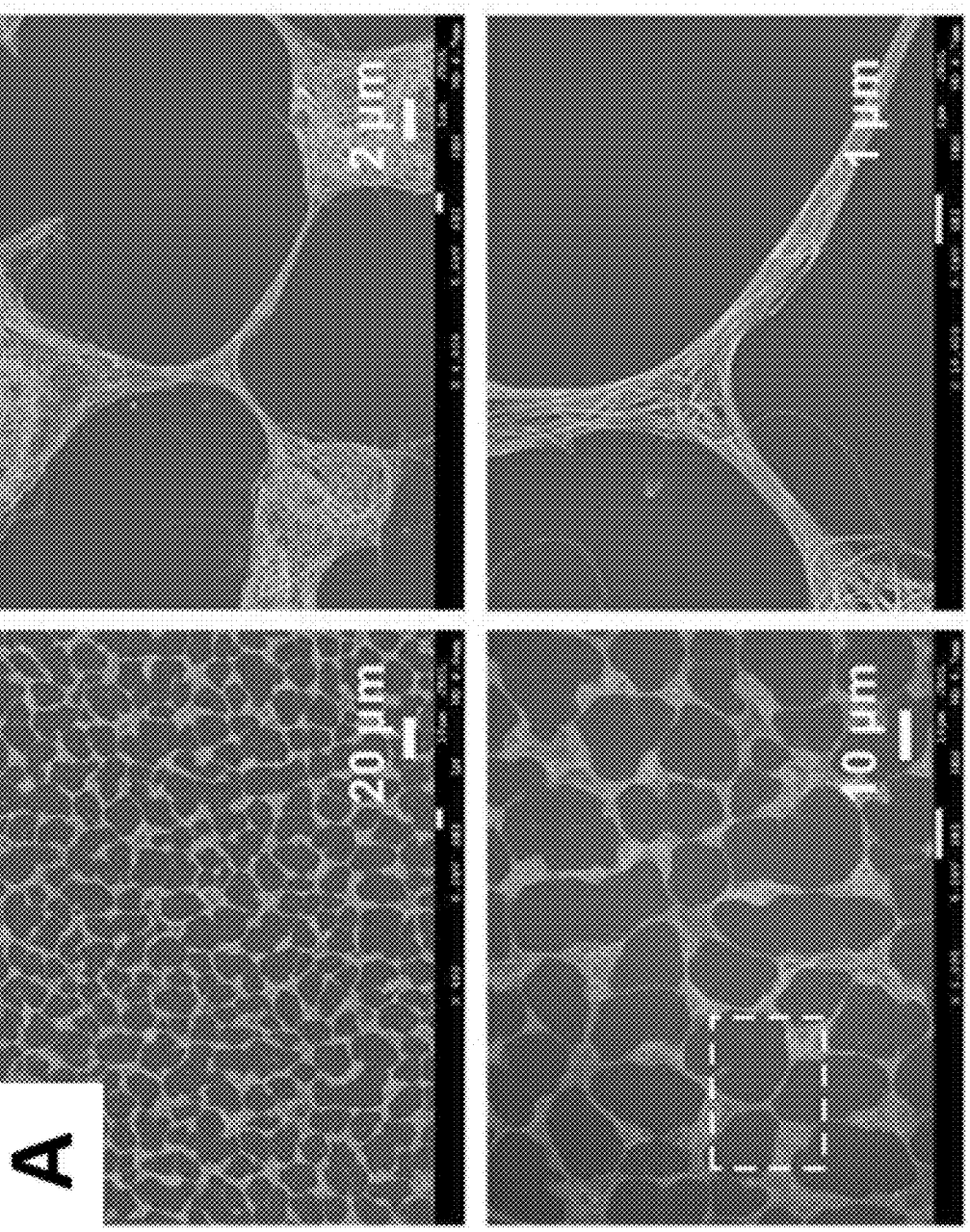
Figure 12:
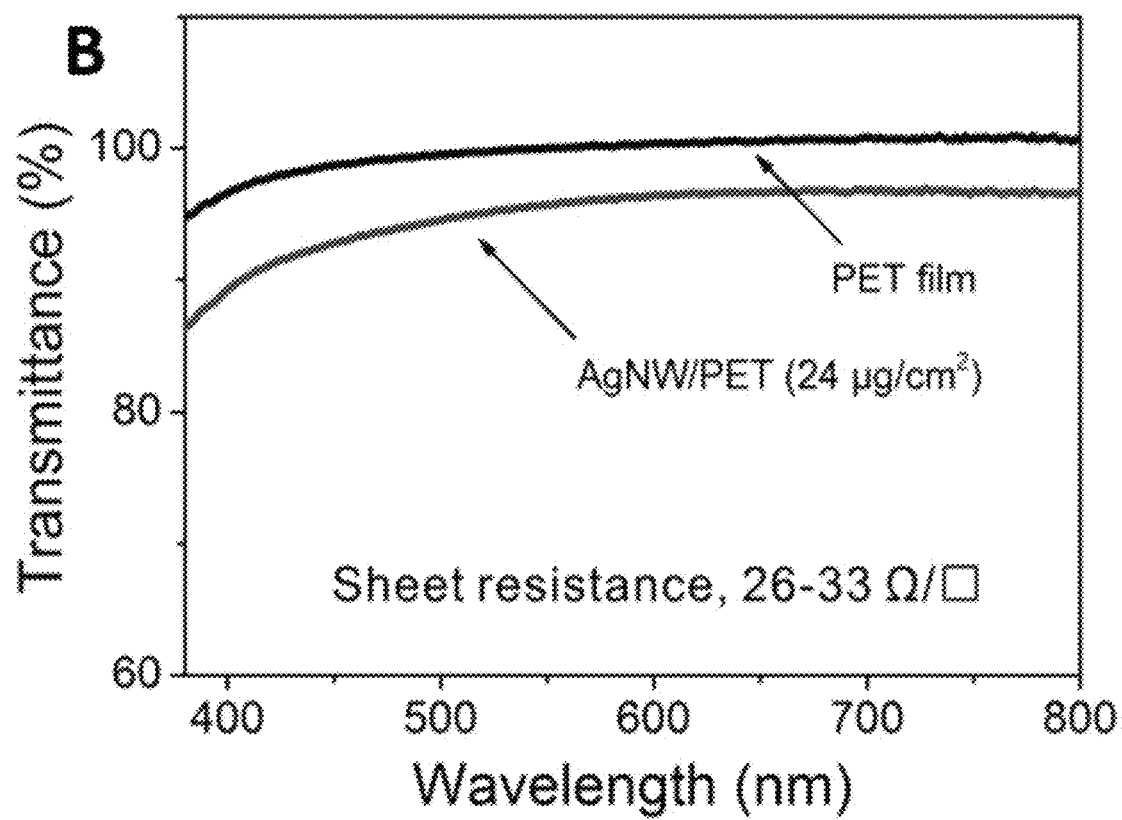

FIG. 12A shows SEM images that depict the surface morphology of AgNWs ring network on PET film. The various scale bars denote 20 μm, 10 μm, 2 μm and 1 μm.

FIG. 12B shows the transmittance of PET film and ring AgNWs/PET conductor. Transmittance measurements exclude the substrate.

Figure 13:
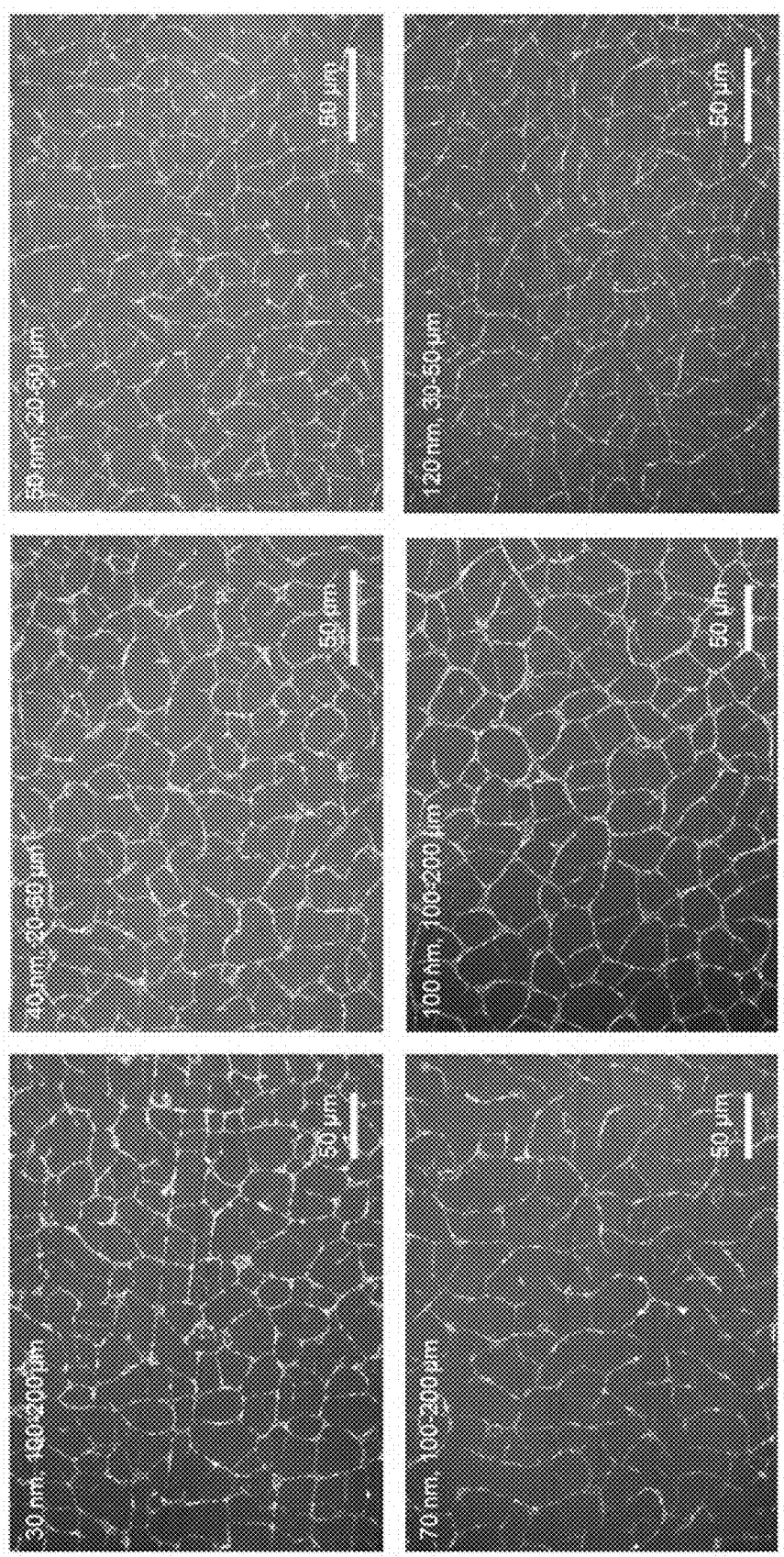

FIG. 13 shows AgNWs of different diameters (30 nm to 120 nm) and lengths (30 μm to 200 μm). Scale bars denotes 50 μm.

Figure 14:
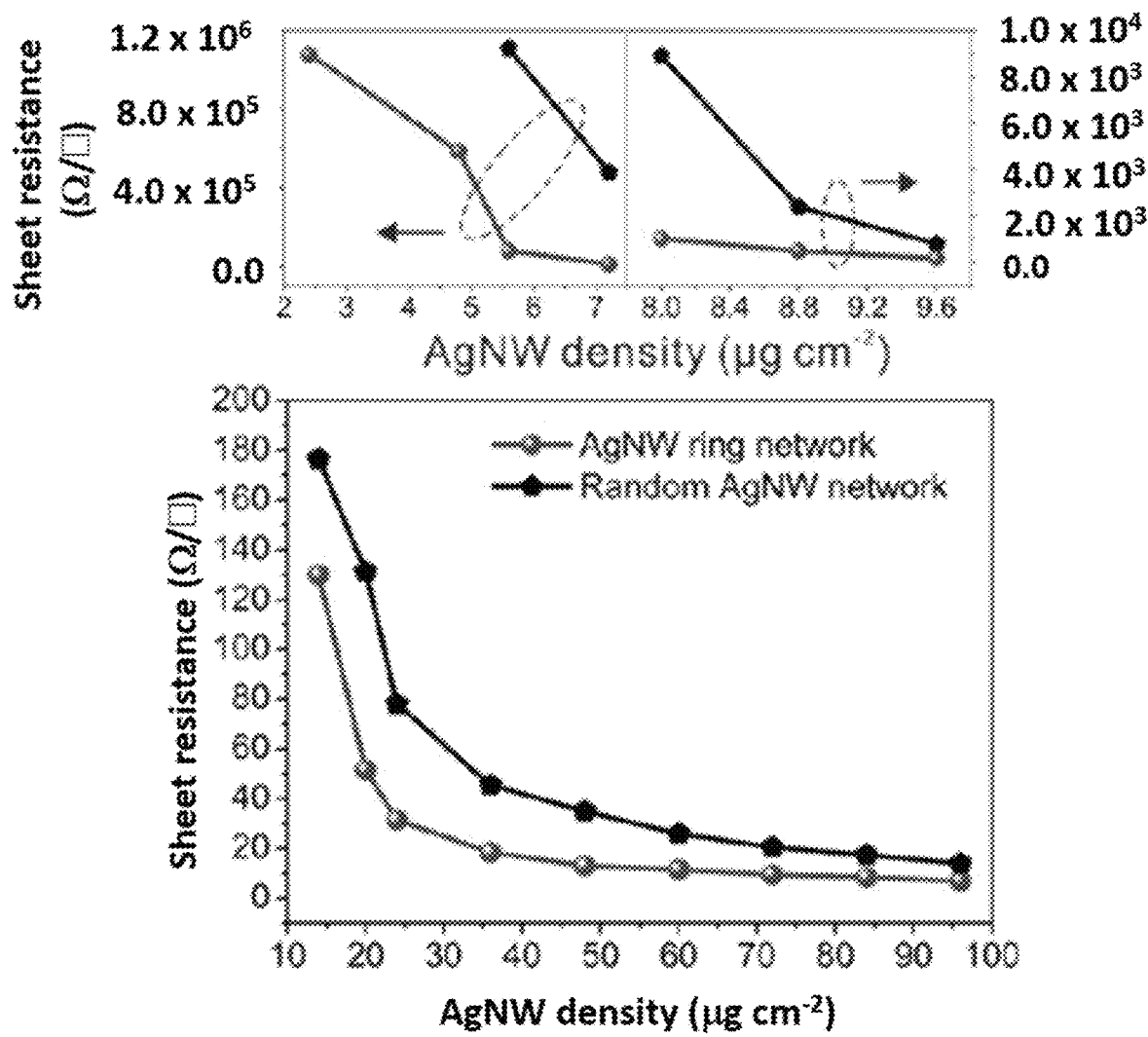
Figure 14:
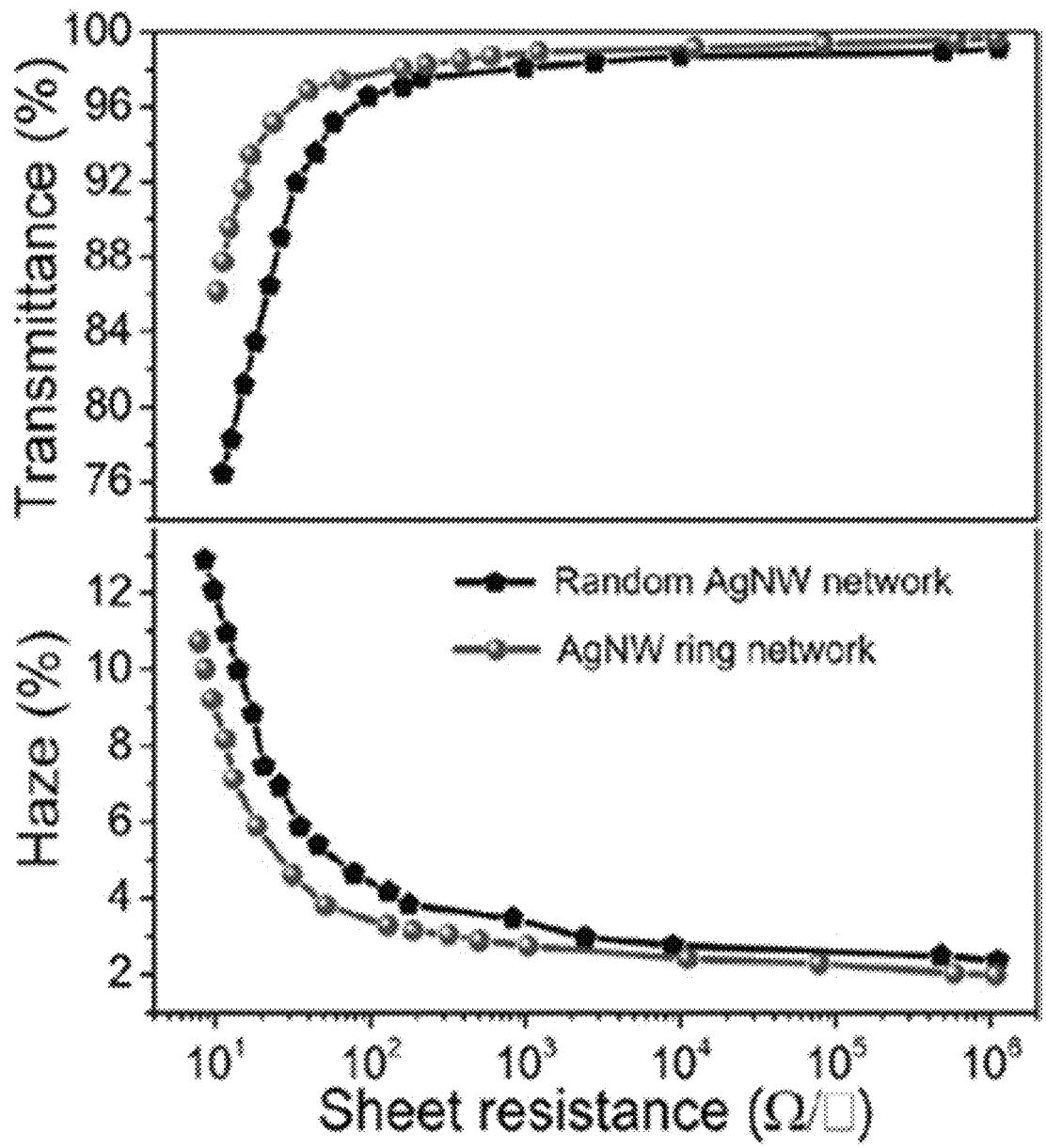

FIG. 14A shows a comparison of the optoelectronic performance of CTCP with different AgNWs networks, and in particular a comparison of sheet resistance of two AgNW networks with varying densities of AgNWs. These data represent preliminary results based on initial experiments, whereas the data shown in FIG. 2K further above have been optimized by tuning the spraying process, amount of nanowires, and types of nanowires.

FIG. 14B shows a comparison of the optoelectronic performance of CTCP with different AgNWs network, and in particular the comparison of transmittance and haze of two AgNW networks at different sheet resistances. Transmittance here has excluded the substrate. These data represent preliminary results based on initial experiments, whereas the data shown in FIG. 2L further above have been optimized by tuning the spraying process, amount of nanowires, and types of nanowires.

Figure 15:
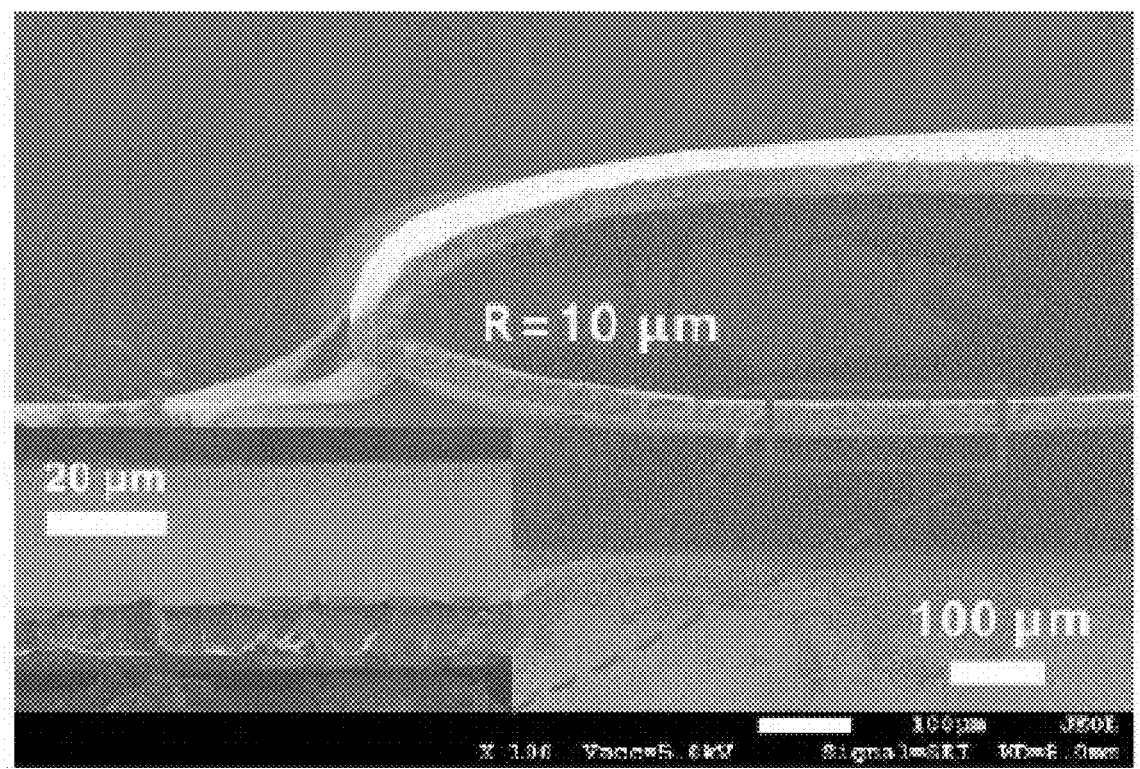
Figure 15:
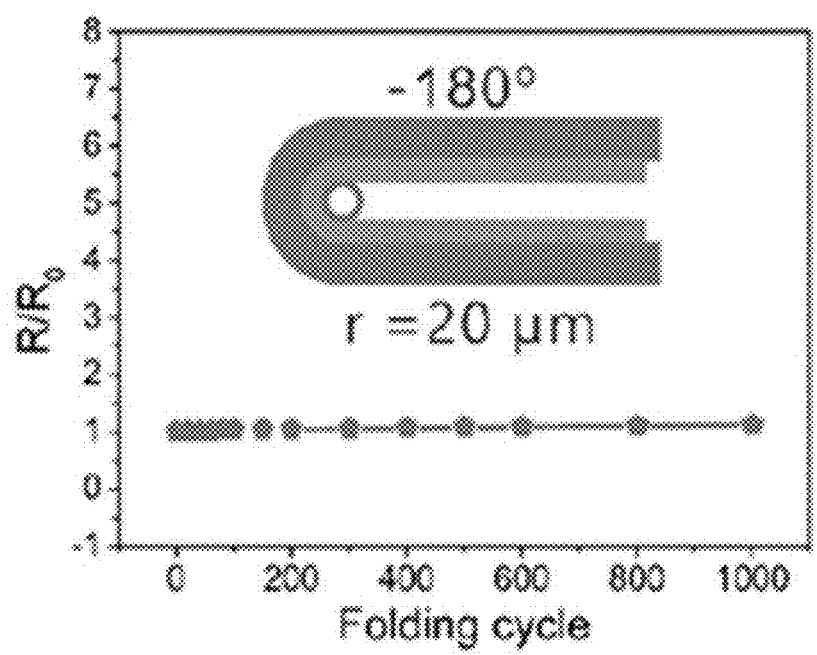
Figure 15:
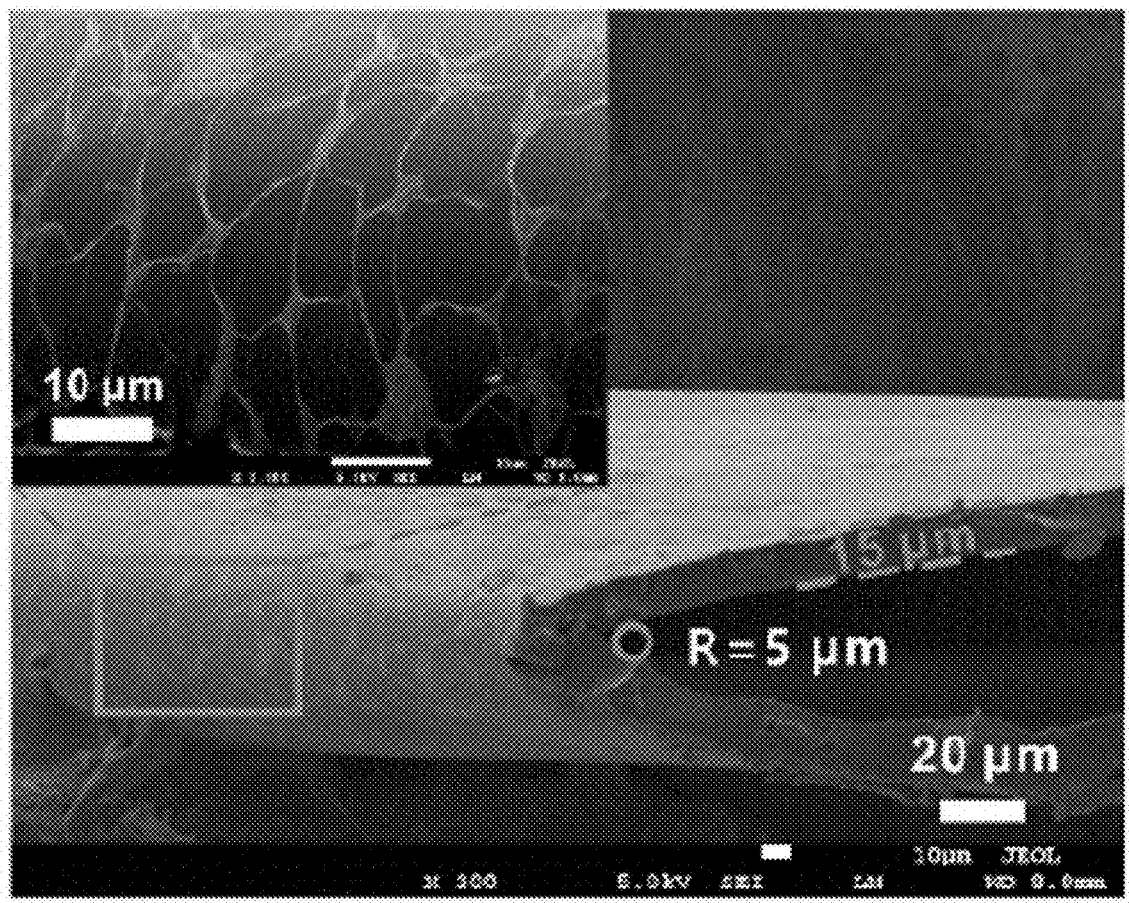
Figure 15:
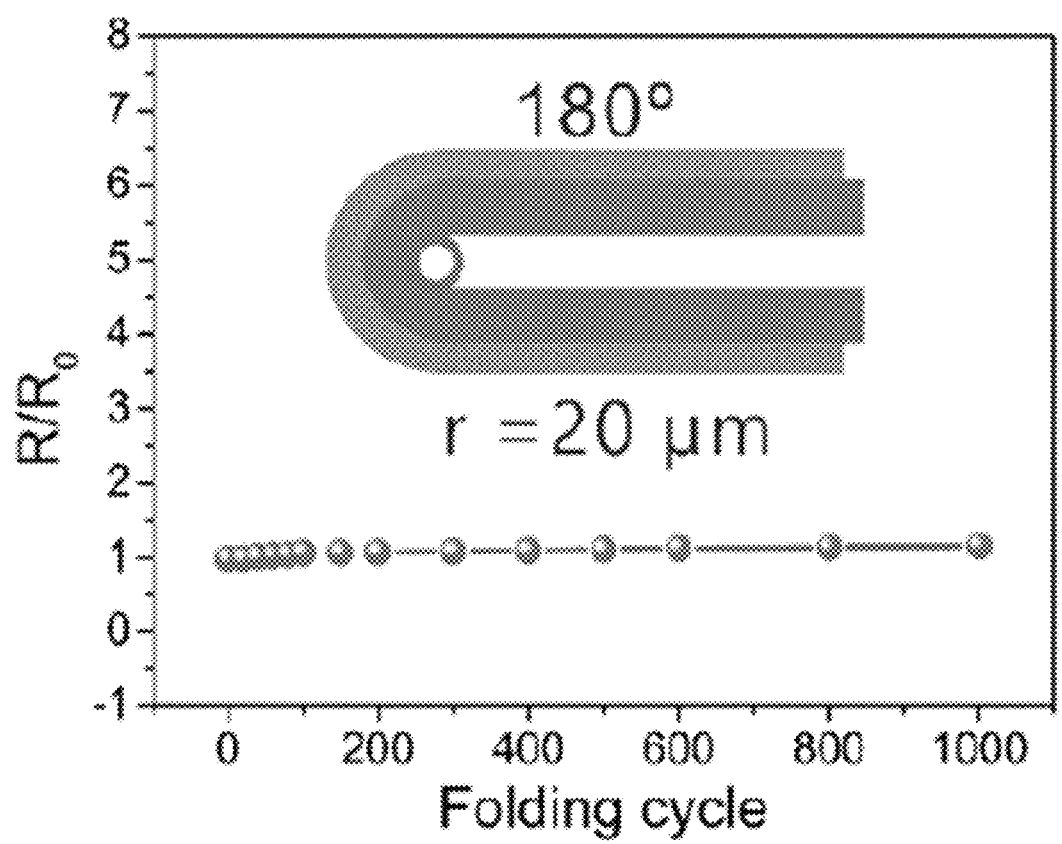

FIG. 15A is a SEM cross-section image showing the foldability of CTCP, whereby in this image the CTCP was folded at −180° with 10 μm folding radius. The image shown in FIG. 5D further above is from the same batch of EC conductor as the image shown herein.

FIG. 15B shows the sheet resistance of CTCP at different folding cycles (−180°). The data shown in FIG. 5E further above are from the same batches of EC conductor, however the figures above show different range of Y axes.

FIG. 15C is a SEM cross-section image showing the foldability and sheet resistance stability of CTCP, whereby in this image the CTCP was folded CTCP at 180° with 5 μm folding radius. The image shown in FIG. 5D further above is from the same batch of EC conductor as the image shown herein.

FIG. 15D shows the sheet resistance of CTCP at different folding cycles (180°). The data shown in FIG. 5E further above are from the same batches of EC conductor, however the figures above show different range of Y axes.

DETAILED DESCRIPTION

The following detailed description refers to the accompanying drawings that show, by way of illustration, specific details and embodiments in which the invention may be practised. These embodiments are described in sufficient detail to enable those skilled in the art to practice the invention. Other embodiments may be utilized and changes may be made without departing from the scope of the invention. The various embodiments are not necessarily mutually exclusive, as some embodiments can be combined with one or more other embodiments to form new embodiments.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The present disclosure provides for a method of producing a transparent conductive electrode. The transparent conductive electrode may be a flexible transparent conductive electrode. The term "flexible" used herein refers to an object or material that can be folded, stretched and subjected to any contortion, without damaging the object or material and/or altering any of its properties. Such a flexible object or material can restore to its original shape on its own and/or by manual intervention to undo the folding, stretching and contortion.

The term "transparent" used herein refers to an object or material which any form of electromagnetic radiation, such as visible light, can be transmitted through.

The term "conductive electrode" used herein refers to an electrode that conducts electricity. As the flexible transparent conductive electrode is electrically conductive, it may be termed a "transparent conductor".

The transparent conductive electrode, produced or producible from the method disclosed herein, comprises a micromesh coated on or embedded in a transparent substrate. The transparent substrate may be a flexible transparent substrate. The micromesh is composed of an arrangement of connected electrically conductive nanowires, such that holes are formed between the connected electrically conductive nanowires, and each electrically conductive nanowire may be connected to one or more other electrically conductive nanowires. In the context of the present disclosure, nanowires refer to wires having a length to diameter ratio (L/D) of higher than 20. In the context of the present disclosure, "nanowires" may also include "nanofibers". Hence, "nanowires" may include wires with a length to diameter ratio (L/D) ranging from about 20 to 1000. Additionally, it may include fibers, in particular nanofibers, which have a length to diameter ratio (L/D) higher than 1000. Nanowires differ from microwires in that nanowires have diameters in the range of about 0.1 nm to about 500 nm, while microwires have diameters in the range of about 0.5 μm to about 500 μm. In various embodiments, the electrically conductive nanowires may be metallic nanowires. In such embodiments, the nanowires may be ductile as they are made of metal. In other embodiments, the electrically conductive nanowires may be carbon nanowires or nanofibers. In such embodiments, the nanowires may be ductile due to their ultrahigh aspect ratio. The micromesh, based on such electrically conductive nanowires, may accordingly be ductile.

The expression "coated on" used herein means that the electrically conductive nanowires in the form of a micromesh are disposed on a surface of an object or material and having no parts of the electrically conductive nanowires formed in the object or material. The term "embedded" used herein means that the micromesh may be substantially or completely formed into a substrate, such as a polymer substrate or even a flexible transparent substrate. When the micromesh is substantially formed into the substrate, a part of the micromesh may be formed on the surface of the substrate. Said differently, the micromesh may be disposed partially or entirely within the substrate. When the micromesh is partially disposed within the substrate, part of the micromesh may be disposed on the surface of the substrate.

When the micromesh is coated on or embedded in a flexible transparent substrate, such a substrate enhances and/or imparts flexibility to the already ductile micromesh. This means that a flexible transparent conductive electrode comprising both the micromesh and flexible transparent substrate can be folded, stretched, and subjected to any contortion without being damaged (e.g. mechanical failure, breakage and/or fracture).

The present method and the present transparent conductive electrode are advantageous as the micromesh developed provides for an improved optoelectronic performance, which means that electrical conductivity is not compromised even when transparency, haze, and/or sheet resistance is improved. The optoelectronic performance is improved even when a single layer of micromesh is coated on or embedded in the substrate. This means that electrical conductivity can be improved with lower sheet resistance, higher transmittance and reduced haze even when just a single layer of micromesh is formed on and/or in the substrate.

The improved transparency, reduced haze, and lower sheet resistance may be attributed to the micromesh and the present method. Various embodiments of the present method and transparent conductive electrode are described as follows.

In the present disclosure, there is provided for a method of producing a transparent conductive electrode. The method comprises spraying a suspension of electrically conductive nanowires on a polymer substrate to form droplets thereon, wherein each of the droplets has a periphery which is in contact with one or more peripheries of another droplet, wherein the suspension comprises a polar solvent, wherein the polymer substrate and the polar solvent produce a surface tension which directs the electrically conductive nanowires to arrange at the periphery of each of the droplets to form a network of connected ring structures. The method includes removing the polar solvent from the polymer substrate to form a micromesh comprising the electrically conductive nanowires which are retained in the form of the network of connected ring structures. In the resultant transparent conductive electrode obtained from the present method, the micromesh of electrically conductive nanowires may be coated on the polymer substrate or embedded in the polymer substrate.

As mentioned above, the present method produces a transparent conductive electrode having better transparency, reduced haze, better conductivity and lower sheet resistance. The transparent conductive electrode may be a flexible transparent conductive electrode. The present method not only provides for such advantages, but also because it uses less electrically conductive nanowires (at most about one third of the amount for forming a randomly arranged network) to produce a transparent conductive electrode having such advantages, which renders the present method more cost effective.

The improved transmittance and haze arise from the micromesh produced through the present method. The present method directs the electrically conductive nanowires to arrange themselves to form a network of connected ring structures. This network is an open ring network in which each ring structure comprises electrically conductive nanowires bundled together and shaped to form a ring, wherein the center of the ring is hollow, i.e. has a hole. FIG. 1B illustrates an example of the present ring structure. The holes allow, for example, more light to pass through, as compared to a random network of nanowires that overlay each other in a haphazard manner, which reduces the area of holes and thus reduces the amount of light that can pass through the network of randomly arranged nanowires. Due to the network of connected ring structures, the micromesh has lower extinction cross-section and surface roughness. The expression "extinction cross-section" used herein refers to an area that leads to loss of optical energy due to both absorption and scattering of electromagnetic radiation, e.g. visible light. With lower extinction cross-section, this means that the present micromesh has lower light absorption and scattering, and hence better transmittance. The lower surface roughness also aids in suppressing the scattering of light. Hence, the present method produces a micromesh that has improved transparency and haze.

The present method is able to form the network of connected ring structures instead of a network of randomly arranged nanowires, as the polar solvent for forming the suspension of electrically conductive nanowires, and the polymer substrate which the suspension is to be sprayed on, produce a surface tension that directs the electrically conductive nanowires to migrate towards the periphery of the droplets to form the connected ring structures (see FIG. 1A). The surface tension is a force that arises from a strong capillary flow in each of the suspension droplets, which drives the electrically conductive nanowires towards the edge of each suspension droplet formed on the polymer substrate. This surface tension suppresses the force from a Marangoni flow that may cause the electrically conductive nanowires to move back to the center of droplets. Assembly of the electrically conductive nanowires at the periphery of the droplets is immediate as the surface tension exists once the droplet forms on the polymer substrate, and this provides for a rapid and efficient method of instantaneously forming the network of connected ring structures. The term "periphery" and its grammatical variant used herein refer to the boundary defined by the edge of a droplet. This boundary may be the perimeter of each droplet. The migration of electrically conductive nanowires towards the periphery of each droplet and arrangement of the electrically conductive nanowires at the periphery to form the network of connected ring structures may be termed herein "coffee-ring effect".

In various embodiments of the present method, the suspension may be first prepared by dispersing electrically conductive nanowires in a polar solvent for the suspension to be applied onto the polymer substrate by spraying. Hence, spraying the suspension may comprise dispersing the electrically conductive nanowires in the polar solvent.

Advantageously, spraying the suspension provides an air flow to the suspension droplets formed on the polymer substrate. The air flow not only acts as a driving force for spreading the droplets evenly across the polymer substrate, but also helps to spread the electrically conductive nanowires in the droplets towards the peripheral edge of the droplets. Further advantageously, spraying of the suspension may also accelerate evaporation of the polar solvent as solvent may separate and/or evaporate from the sprayed suspension before it lands on the polymer substrate. For example, the use of high pressure gas for spraying may generate an air flow that accelerates the evaporation of solvent, enhances the capillary flow and suppresses the Marangoni effect, resulting in assembly of the electrically conductive nanowires into a network of connected ring structures. The spray velocity, measurable from the gas flow, may affect the droplet size. Different spray velocity may produce different droplet size, and different sizes of droplet may contain different amounts of solvent, which affects the speed of solvent evaporation for each droplet and die extent of the force that drives the electrically conductive nanowires to the edge of the droplet, hence the different sizes of the ring structure.

The spraying may be carried out by using an equipment such as, but not limited to, a spray coater, spray gun, spray bottle, or any other suitable spraying systems. Spraying the suspension may comprise spraying the suspension at a spraying rate ranging from 1 μL/min to 100 mL/min, 10 μL/min to 100 mL/min, 100 μL/min to 100 mL/min, 1 mL/min to 100 mL/min, or 10 mL/min to 100 mL/min, etc. The advantage of these spraying rates has already been described above, wherein the different spray rates may be used to adjust the driving force to obtain different sizes of ring structure, which may in turn affect optoelectronic performance of the resultant conductive electrode. Spraying the suspension may be carried out at a temperature ranging from 10° C. to 200° C., 50° C. to 200° C., 100° C. to 200° C., 150° C. to 200° C., etc. By carrying out the spraying at a temperature in these ranges, the solvent may be partially or completely removed, either through evaporation or the heating provided. In certain instances, spraying the suspension may be carried out in the absence of heating. The spraying distance, which is the distance from a nozzle (or outlet), from which the suspension is sprayed, to the polymer substrate may be 0.5 cm to 50 cm, 1 cm to 50 cm, 10 cm to 50 cm, 20 cm to 50 cm, 30 cm to 50 cm, or 40 cm to 50 cm, etc. As already mentioned above, the spray distance can be used to manipulate the sizes of the ring structure.

In various embodiments, the polar solvent may comprise water, methanol, aniline, acetone, chloroform, propanol, ethyl acetate, ethanol, or tetrahydrofuran. The term "polar solvent" refers to a liquid having dipole moments that arise from bonds between atoms with very different electronegativities, such as oxygen and hydrogen. Conventionally, commercial nanowires tend to be synthesized with the use of protective agents or stabilizing agents, which may typically be polymers that may induce and control (e.g. limit) the growth of crystals. Such polymers also provide enough zeta surface potential for the resultant commercial nanowires to stabilize without unnecessarily precipitating. In other words, conventional nanowires may be manufactured with an ultra-thin layer of polymer coating (e.g. a few nm). By using polar solvents, such commercial nanowires may also be used in the present method, as ultrathin polymer coating may be dispersed adequately in the polar solvent for smooth spraying.

In various embodiments, the polymer substrate may comprise polyethylene terephthalate, polypropylene, polyester, nylon, polyvinyl chloride, polycarbonate, polyethylene, polyhexafluoropropylene, fluorinated ethylene propylene, polytrifluoroethylene, chlorotrifluoroethylene, polydimethyl siloxane, natural rubber, paraffin, polyvinylidene fluoride, polyvinyl fluoride, polychlorotrifluoroethylene, poly butylene terephthalate, nylon-11 (polyundecanamide), surlyn ionomer, polystyrene, polyacrylate, polyvinyl alcohol, polyphenylene sulfide, cellulose acetate, polyvinylidene chloride, polyimide, polysulfone, polymethylmethacrylate, nylon-6 (polycaprolactam) or polytetrafluoroethylene. Advantageously, as the surface tension of all of these polymer substrates is about 16 mN/m to 42 mN/m, they are viable materials for the method disclosed herein. The present method is versatile as various types of polymer substrate may be used for forming the droplets sprayed thereon. As mentioned elsewhere herein, the difference in surface tension between the polymer substrate and the solvent plays an important role. Without being bound to theory, it is believed that a surface tension below 45 mN/m may produce optimal results. For example, the surface tension of the polymer substrate could be about 15 mN/m to 44 mN/m. Hence, viable polymer substrates may comprise polytetrafluoroethylene having a surface tension of about 18 mN/m to about 20 mN/m, or polyvinyl chloride having a surface tension of about 33 mN/m to about 38 mN/m, or polyethylene terephthalate having a surface tension of about 33 mN/m to about 38 mN/m, or a combination thereof. In contrast, a glass substrate has a surface tension of about 47 mN/m and it was found that a network of connected ring structures did not form thereon. In certain instances, the polymer substrate may be flexible and/or transparent.

During the spraying process, with the temperature and spray velocity maintained constant, the surface tension difference between the solvent and the substrate produces a driving force in each of the droplets that spreads the electrically conductive nanowires, such as AgNWs, towards the edge of each droplet, with or without the assistance of air flow, generating a coffee-ring effect that enables instant formation of a network of connected ring structures. This assembly process is achievable regardless whether a single solvent or mixed solvents are used. Without being bound by theory, it is believed that any polar solvent may be used as long as it is a polar solvent and volatile. Thus, suitable solvents may be selected from the group consisting of ethanol having a surface tension of 22.3 mN/m, methanol having a surface tension of 23.6 mN/m, propanol having a surface tension of 23.8 mN/m, acetone having a surface tension of 23.7 mN/m, ethyl acetate having a surface tension of 23.8 mN/m, tetrahydrofuran having a surface tension of 28.8 mN/m, and mixtures of solvents, such as water/isopropanol (in a 1:1 ratio) having a surface tension of 31 mN/m. Meanwhile, the viscosity, boiling point and saturation vapour pressure of the solvent may be used to further aid the acceleration of the solvent evaporating from the substrate to produce strong capillary flow that suppresses the Marangoni flow, rendering the coffee-ring effect continuous in each droplet, thereby preventing undesired perturbation of the electrically conductive nanowires, such as AgNWs, during the assembly process.

The spray-assembly method in this disclosure differs from a "normal" coffee-ring effect, in that spraying plays an important role to accelerate the assembly. Thus, while the surface tension plays an important role in the formation of the network of connected ring structures, besides the surface tension, the formation may be modified by other factors, such as the saturated vapor pressure of the solvent and the spraying parameters.

The electrically conductive nanowires may be comprised of carbon nanowires or carbon nanofibers, or metallic nanowires or combination thereof. The metallic nanowires may comprise silver nanowires, copper nanowires, gold nanowires, or nanowires composed of a metal alloy, according to various embodiments. In various embodiments, the electrically conductive nanowires may comprise an average diameter ranging from 20 nm to 120 nm, such as 20 nm to 110 nm, 20 nm to 100 nm, 20 nm to 90 nm, 20 nm to 80 nm, 20 nm to 70 nm, 20 nm to 60 nm, 20 nm to 50 nm, 20 nm to 40 nm, or 20 nm to 30 nm, etc. These diameters advantageously aid in the migration of electrically conductive nanowires towards the periphery of each droplet, as larger diameter nanowires may limit their motion. The term "diameter" used herein refers to the maximal length of a line segment passing through the centre and connecting two points on the periphery of an object or structure. The object or structure need not be perfectly spherical or circular. The term "average diameter" refers to a diameter that may be calculated by dividing the sum of the diameter of each structure by the total number of structures.

Various embodiments of the present method involve removal of the polar solvent. Removing the polar solvent may comprise evaporating the polar solvent, or heating the polymer substrate. The evaporation and/or heating helps to ensure complete removal of any residual solvent remaining after the spraying step. Advantageously, the evaporation and heating may help to maintain the electrically conductive nanowires at the edge of each droplet and/or move any residual electrically conductive nanowires at the center towards the edge of each droplet. In instances where there is no residual solvent after spraying, this evaporation and/or heating step may not be needed.

Evaporating the polar solvent differs from heating in that heating requires thermal energy input to the polar solvent that converts the solvent liquid phase to its gas phase. Meanwhile, evaporating the polar solvent does not require thermal energy input, and the polar solvent may be simply exposed to room temperature conditions for the liquid phase to convert to its gas phase. Evaporation of solvent from the droplets that are formed on the polymer substrate advantageously generates a capillary flow that drives the electrically conductive nanowires towards the edge of each droplet.

In embodiments where the polar solvent is removed by heating, the heating advantageously accelerates solvent evaporation. Accelerated evaporation of the polar solvent may enhance the capillary force that drives the electrically conductive nanowires more rapidly towards the edge of each droplet, suppressing the Marangoni effect to a greater extent, hence enhancing the coffee-ring effect. In embodiments where the polymer substrate is to be heated, heating the polymer substrate may comprise exposing the polymer substrate to a temperature ranging from 10° C. to 100° C. For example, heating the polymer substrate may be carried out at 10° C. to 100° C. for more than 0 mins and up to 10 mins. The exposure may alternatively range from 20° C. to 100° C., 30° C. to 100° C., 40° C. to 100° C., 50° C. to 100° C., 60° C. to 100° C., 70° C. to 100° C., 80° C. to 100° C., 90° C. to 100° C., etc. for more than 0 mins and up to 10 mins, e.g. 1 min to 10 mins, 2 mins to 10 mins, 3 mins to 10 mins, 4 mins to 10 mins, 5 mins to 10 mins, 6 mins to 10 mins, 7 mins to 10 mins, 8 mins to 10 mins, 9 mins to 10 mins.

In various embodiments, the method may further comprise sintering the metallic nanowires of the micromesh. Sintering may help to compact the metallic nanowires into a tighter arrangement without the nanowires entirely melting and/or merge the metallic nanowires together into a single nanowire without entirely melting the nanowires. Sintering in the present method does not alter the network of connected ring structures. The sintering is carried out at a temperature sufficient to just melt the surface of the metallic nanowires to form welded junctions between adjacent nanowires. Said differently, sintering helps to form permanent contact points between the metallic nanowires, that can help to lower resistance and improve electrical conductivity. Sintering the metallic nanowires may comprise exposing the micromesh to a temperature ranging from 50° C. to 200° C. for more than 0 mins and up to 10 mins. The exposure may alternatively range from 100° C. to 200° C., 100° C. to 150° C., 150° C. to 200° C., etc. for more than 0 mins and up to 10 mins, e.g. 1 min to 10 mins, 2 mins to 10 mins, 3 mins to 10 mins, 4 mins to 10 mins, 5 mins to 10 mins, 6 mins to 10 mins, 7 mins to 10 mins, 8 mins to 10 mins, 9 mins to 10 mins.

Various embodiments of the present method may further comprise or optionally comprise transferring the micromesh to a flexible transparent substrate. In various embodiments, transferring of the micromesh may comprise forming the flexible transparent substrate on the micromesh. As already mentioned above, the flexible transparent substrate enhances and/or imparts flexibility to the micromesh. This means that the micromesh, when coated on or embedded in the flexible transparent substrate, becomes at least stretchable, foldable, and can be subjected to any contortion.

Forming the flexible transparent substrate may comprise depositing a solution adjacent to the micromesh. The solution may comprise cellulose, silk protein, chitosan, gelatin, starch, polydimethylsiloxane, polyvinyl alcohol, polyvinyl pyrrolidone, polyvinyl butyral, ethylene-vinyl acetate, polyurethane, styrene ethylene butylene styrene, ecoflex, amorphous copolyester, liquid silicone rubber, cyclic olefin copolymers, ionomer resin, or derivatives thereof. The term "derivatives" refers to substances that are derived from the substances as listed above. For example, cellulose derivatives may include cellulose ester and cellulose ether. In certain embodiments, the flexible transparent substrate may comprise a cellulose-based material. Advantageously, cellulose-based material is abundant and low-cost, which renders the present method and flexible transparent conductive electrode economical.

Forming the flexible transparent substrate may comprise drying the solution to form the flexible transparent substrate. Any suitable form of drying, e.g. heating, vacuum drying, may be carried out.

The present method may further comprise separating the flexible transparent substrate with the micromesh from the polymer substrate. The ease of transferability of the micromesh from the polymer substrate to the flexible transparent substrate may be attributed to the compatibility of these two substrates, wherein these two substrates may give rise to similar surface tension, e.g. 41-44 mN/m. Due to compatibility of the two substrates, their separation can be achieved by simply peeling off one substrate from the other without delamination of the micromesh from the flexible transparent substrate. The assembly of electrically conductive nanowires are first realized and stabilized on the first polymer substrate as already described above. To transfer the micromesh to another substrate, (1) the solution of the second substrate should avoid perturbing the existing conductive micromesh and (2) the second substrate should provide enough adhesion for the micromesh to be stuck thereon without being peeled off while the micromesh leaves the first substrate (e.g. polymer substrate) without breaking apart and/or leaving behind any residue on the first substrate. Additionally, in comparison with the first substrate, the second substrate may possess a more compatible surface tension with the micromesh.

The present method may further comprise coating a transparent protective layer on the micromesh. The coating of this protective layer does not compromise the conductivity of the micromesh. The transparent protective layer may be a waterproof layer that mitigates oxidation of the electrically conductive nanowires, thereby imparting electrical conduction stability for a longer period compared to a bare micromesh. In various embodiments, the transparent protective layer may comprise a hydrophobic cellulose oleoyl ester. Coating of the protective layer (HCOE) may be performed after peeling off, for example, the EC conductor (ethyl cellulose and micromesh) from the polymer substrate.

The present disclosure also provides for a transparent conductive electrode comprising a micromesh coated on or embedded in a transparent substrate, wherein the micromesh comprises electrically conductive nanowires arranged to form of a network of connected ring structures, wherein each of the ring structures is connected to at least one other ring structure by one or more knots, wherein each of the one or more knots is defined by an entanglement of the electrically conductive nanowires extending from each of the ring structures which are connected. The transparent conductive electrode may be a flexible transparent conductive electrode.

Embodiments and advantages described in the context of the present method are analogously valid for the present transparent conductive electrode as described herein, and vice versa. As the various embodiments and advantages have already been described above, they are not iterated for brevity.

In the context of the present disclosure, the terms "ring" and "ring structure" refer to a structure that has the shape of a ring, wherein the shape may be that of a perfect ring shape or need not be a perfect ring shape. Non-limiting examples of such a shape may include those of FIG. 9A to 9C.

Each of the ring structures may have electrically conductive nanowires extending therefrom. The electrically conductive nanowires of a ring structure may become entangled with the electrically conductive nanowires extending from one or more other ring structures to form an entanglement (i.e. a knot). Such a knot serves as a connection between the ring structures. A non-limiting example of such a knot is illustrated in FIG. 1C. As the knot comprises various electrically conductive nanowires entangled together to establish a permanent electrical connection, the entangled electrically conductive nanowires (i.e. the knot) suppresses junction resistance to create a more conductive network. As the knot forms a permanent connection between the various ring structures, the knot also serves as a conductive path for electricity between the various ring structures, and this improves electrical stability compared to random networks of nanowires, where the electrically conductive nanowires temporarily contact each other or where a junction of such a random network is solely a point of contact between two electrically conductive nanowires that is easily broken off when the random network is subjected to any folding, stretching and/or contortion.

In various embodiments, each of the ring structures may be comprised of a bundle of electrically conductive nanowires shaped to form a ring, wherein the bundle of electrically conductive nanowires has a first cross-sectional diameter, wherein the entanglement defining each of the one or more knots has a second cross-sectional diameter, wherein the first cross-sectional diameter is smaller than the second cross-sectional diameter.

As the electrically conductive nanowires accumulate at the periphery of the droplets in the method disclosed herein, they arranged themselves into a bundle of electrically conductive nanowires. In forming the bundle, the electrically conductive nanowires adhere to each other due to electrostatic charges on each of the electrically conductive nanowires. The electrically conductive nanowires may be randomly arranged in the bundle (see inset of FIG. 2G) or form a concentric bundle as shown in that the rightmost of FIG. 2N. Both configuration may be observed from the cross-section of a ring structure.

The cross-section of the bundle has a diameter that is smaller than that of the entanglement (i.e. knot). This implies that the electrically conductive nanowires may be more compacted in arrangement compared to a network of randomly arranged electrically conductive nanowires, hence the better transmittance and lower haze. The compact arrangement also means the entire network of connected ring structures has more holes in the network compared to the network of randomly arranged nanowires, giving rise to better transmittance. Advantageously, the compacted bundle also acts as an electrical conductive path that has better conductivity over a random network of electrically conductive nanowires for the same amount of electrically conductive nanowires used or present. The diameter of the bundle's cross-section may be referred to as the first cross-sectional diameter.

When viewed from its cross-section, the knot has a diameter that is larger than that of the bundle. This diameter may be referred to as the second cross-sectional diameter. The second cross-sectional diameter may be larger as it is an entanglement of various electrically conductive nanowires extending from more than one ring structure. In other words, more nanowires may be observed from a cross-section of the knot compared to a cross-section of the bundle. Advantageously, the more electrically conductive nanowires in a knot help to lower junction resistance and improve conductivity between the ring structures, thereby lowering sheet resistance of the micromesh.

The first and second cross-sectional diameters may be measured from two of the outermost electrically conductive nanowires of the cross-section and passing through the center of the cross-section.

In various embodiments, the electrically conductive nanowires may comprise an average diameter ranging from 20 nm to 120 nm. Other diameters of the electrically conductive nanowires and advantages of the various diameters have already been discussed above and shall not be iterated for brevity.

In various embodiments, the electrically conductive nanowires may comprise carbon nanowires, carbon nanofibers, metallic nanowires, or a combination thereof. The metallic nanowires may comprise silver nanowires, copper nanowires, gold nanowires, or nanowires composed of a metal alloy. In various embodiments, the transparent substrate may comprise cellulose, silk protein, chitosan, gelatin, starch, polydimethylsiloxane, polyvinyl alcohol, polyvinyl pyrrolidone, polyvinyl butyral, ethylene-vinyl acetate, polyurethane, styrene ethylene butylene styrene, ecoflex, amorphous copolyester, liquid silicone rubber, cyclic olefin copolymers, ionomer resin, or derivatives thereof. The transparent substrate may be a flexible transparent substrate. Other embodiments of the electrically conductive nanowires and transparent substrate, and advantages of the electrically conductive nanowires and transparent substrate have already been discussed above and shall not be iterated for brevity.

The present transparent conductive electrode may further comprise a transparent protective layer disposed on the micromesh. The transparent protective layer may comprise a hydrophobic cellulose oleoyl ester. Advantages and other embodiments of the transparent protective layer have already been discussed above and shall not be iterated for brevity.

In summary, the present disclosure provides for a method to form a transparent conductive electrode, comprising providing a dispersion of electrically conductive nanowires in a polar or weak polar solvent, wherein the electrically conductive nanowire dispersion has a concentration of about 1 µg/mL to about 2 mg/mL, spraying the dispersion of electrically conductive nanowire dispersion on a first polymeric film under 10 to 200° C., wherein the first polymeric film may have a low surface energy, optionally evaporating or heating the solvent at a controlled rate based on a temperature range of 10 to 100° C. for more than 0 and up to 10 mins, then sintering at 50 to 200° C. for more than 0 and up to 10 mins, to form a electrically conductive nanowire covered polymeric film.

The present method may further comprise transferring the electrically conductive nanowire covered polymeric film onto a receiving substrate. The receiving substrate may be a flexible substrate, preferably a glass substrate or a stretchable elastomer substrate.

Transferring the electrically conductive nanowire covered polymeric film onto a receiving substrate may further comprise coating the electrically conductive nanowire covered polymeric film with a solution of a second polymer with thickness of 1 µm to 1 cm, curing the solution of the second polymer, which can be cured into a transparent film/paper, and peeling off the cured second polymer film to form a transparent film/paper electrode embedded with the electrically conductive nanowire ring network.

The electrically conductive nanowires may comprise carbon nanowires, carbon nanofibers, metallic nanowires, or a combination thereof. The metallic nanowires may be silver nanowires (AgNWs), copper nanowires (CuNWs), gold nanowires (AuNWs), or any other metal alloy nanowires.

The polar or weak polar solvent may be water, methanol, aniline, acetone, chloroform, i-propanol, ethyl acetate, ethanol, or tetrahydrofuran.

The first polymeric film may be polyethylene terephthalate, polypropylene, polyester, nylon, polyvinyl chloride (PVC), polycarbonate (PC), polytetrafluoroethylene (PTFE), polyethylene, polyhexafluoropropylene, fluorinated ethylene propylene, polytrifluoroethylene, chlorotrifluoroethylene, polydimethyl siloxane, natural rubber, paraffin, polyvinylidene fluoride, polyvinyl fluoride, polychlorotrifluoroethylene, poly butylene terephthalate, nylon-11 (polyundecanamide), surlyn ionomer, polystyrene, polyacrylate, polyvinyl alcohol, polyphenylene sulfide, cellulose acetate, polyvinylidene chloride, polyimide, polysulfone, polymethylmethacrylate, nylon-6 (polycaprolactam), or any other polymer film with low surface energy.

The method of coating the electrically conductive nanowire covered polymeric film may be bar-coating, roll-coating, knife-coating, dip-coating, spray-coating, drop-casting, or slot-die coating.

The solution of the second polymer for coating the AgNWs may comprise a solution of natural polymer and/or synthetic polymer, including cellulose, silk protein, chitosan, gelatin, starch, or derivatives thereof. The solution of the second polymer may also comprise polydimethylsiloxane (PDMS), polyvinyl alcohol (PVA), polyvinyl pyrrolidone (PVP), polyvinyl butyral (PVB), ethylene-vinyl acetate (EVA), polyurethane (PU), styrene ethylene butylene styrene (SEBS), ecoflex, amorphous copolyester, liquid silicone rubber, cyclic olefin copolymers, ionomer resin, or any other polymer that can be cured into transparent film.

In the method disclosed herein, the cellulose may be cellulose nanofiber (CNF) and/or cellulose nanocrystalline (CNC). The cellulose may be a cellulose ester and/or cellulose ether, including nitrocellulose, cellulose acetate, cellulose acetate butyrate, cellulose xanthate, methylcellulose, ethyl cellulose, hydroxyethyl cellulose, cyanoethyl cellulose, hydroxypropyl cellulose, and/or hydroxypropyl methyl cellulose.

The method for curing the solution of second polymer may comprise heating, exposing the solution to air, and/or ultraviolet light.

In the present method, by tuning the surface energy of the substrate and electrically conductive nanowires, and surface tension of the solvent, conductive ring network of the electrically conductive nanowires of various dimensions may be fabricated, thereby achieving a transparent conductor with tunable electrical conductivity and optoelectronic performance.

A transparent conductive electrode is also disclosed herein. The transparent conductive electrode may comprise electrically conductive nanowires coated on or embedded in a polymeric film, wherein the electrically conductive nanowires form ring networks, wherein the electrically conductive nanowires may be carbon nanowires, carbon nanofibers or metallic nanowires selected from silver nanowires (AgNWs), copper nanowires (CuNWs), gold nanowires (AuNWs), any suitable alloy nanowires, or a combination thereof, wherein the electrically conductive nanowires may have diameters ranging from 20 nm to 120 nm, such as 20 nm to 100 nm, and wherein the polymeric film may comprise nanocellulose paper. The transparent conductive electrode may be flexible and foldable.

In the present disclosure, the word "substantially" does not exclude "completely" e.g. a composition which is "substantially free" from Y may be completely free from Y. Where necessary, the word "substantially" may be omitted from the definition of the invention.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Unless specified otherwise, the terms "comprising" and "comprise", and grammatical variants thereof, are intended to represent "open" or "inclusive" language such that they include recited elements but also permit inclusion of additional, unrecited elements.

While the methods described above are illustrated and described as a series of steps or events, it will be appreciated that any ordering of such steps or events are not to be interpreted in a limiting sense. For example, some steps may occur in different orders and/or concurrently with other steps or events apart from those illustrated and/or described herein. In addition, not all illustrated steps may be required to implement one or more aspects or embodiments described herein. Also, one or more of the steps depicted herein may be carried out in one or more separate acts and/or phases.

EXAMPLES

The present disclosure relates to a scalable spray-assisted self-assembling process, providing a much stronger capillary flow for the silver nanowires (AgNWs) droplets to suppress a Marangoni effect, achieving hierarchical AgNWs ($\approx$20 nm) bundle micromesh conductor with high transparency, foldability, and stretchability. This process is a single-step technique without use of additional organic binder, and has advantages from the combination of spraying (high efficiency, uniformity, and scalability) and solution processing (simple equipment and room temperature operation). The process of generating a micromesh having high conductivity and transmittance, from the AgNWs, while consuming lesser AgNWs, may suppress junction resistance owing to the explicit conductive paths of the AgNWs bundle with reduced optical extinction cross-sections. The conductive micromeshes can be readily fabricated on various polymer substrates, followed by soft sintering, and further transferred onto a deformable substrate, depending on needs.

Cellulose, an almost inexhaustible and biodegradable biomass with abundant derivatives, demonstrates great potential as a transparent flexible substrate for transparent conductive electronics. Considering the mechanical durability and chemical reliability of the micromesh conductors for long term use, ethyl cellulose (EC), as one example, was employed as a substrate for use in fabricating a bendable and foldable transparent conductor. Such a low cost chemically modified cellulose derivative provides for unique properties such as being waterproof, having low air permeability, desirable flexibility, rendering a dense film with high transparency. Hence, it is an excellent material for supporting electrically conductive networks to sustain various mechanical deformations and chemical degradations. A scalable ethyl cellulose conductor with embedded AgNWs micromesh that possesses a low sheet resistance ($R_s$) of 25 $\Omega\square^{-1}$, ultrahigh transmittance of 97% and low haze of 2.6%. The optoelectronic performance can be controlled via changing of the AgNWs density and spraying velocity, rendering the present method and transparent conductor better than conventional methods, conventional random AgNWs network, and conventional transparent conductors. The lower extinction cross-section can be verified by optical simulation. The embedded AgNWs micromesh with low surface roughness suppresses the scattering effects, and supports the ultrahigh foldability of the ethyl cellulose conductor, and even the stretchability, with the aid of poly(dimethylsiloxane) (PDMS) substrate. Furthermore, the long term reliability of AgNWs micromesh was attained with coating of a cellulose-derived transparent hydrophobic layer. Waterproof coating and intrinsic water resistance of EC make the conductor stable regardless of washing, rendering it suitable for use in forming a deformable and waterproof touch panel.

Details of the present method and transparent conductor, are discussed, by way of non-limiting examples set forth below.

Example 1A

Present Fabrication of AgNWs Bundle Micromesh and Ethyl Cellulose Conductor Ethyl cellulose conductor was prepared by self-assembled spraying and transferring. First, AgNWs (Novarials, USA) suspension (0.05-1 mg mL$^{-1}$) was sprayed on a polymer substrate to achieve the self-assembled AgNWs mesh, followed by heating at 80-150° C. for a few minutes for AgNWs welding. The solvent of AgNWs dispersion can be ethanol, isopropyl alcohol, water, hexane, or mixtures thereof. The polymer substrates can be polyethylene terephthalate (PET), polytetrafluoroethylene (PTFE), polyvinyl chloride, etc. The solvent and polymer substrate used may depend on the relative surface tension between the solvent and substrate. Then, an ethyl cellulose solution (1-20 wt %) was coated on the AgNWs, followed by drying at a controlled temperature, and subsequently peeling off to obtain the ethyl cellullose conductor (thickness 5-120 μm) with embedded AgNWs micromesh.

A random AgNWs network was prepared on a glass substrate with the same transfer process for comparing optoelectronic performance.

An unembedded AgNWs micromesh for comparison of conductive stability was fabricated on PET substrate with the same spraying method.

Example 1B

Present Method Based on AgNWs and Cellulose Nanofiber (CNF)

AgNWs with diameter of 20 nm and length of 20 μm was dispersed in deionized (DI) water to form a 0.5 mg/mL solution, which was ultrasonically treated to obtain a fully dispersed AgNWs solution. The solution was injected into the spray coater, and sprayed onto PVC as the substrate, which was heated at 50° C. for the spray coating process. After successive heating at 70° C. for 5 mins and 120 for 6 mins, AgNWs ring network supported by PVC was obtained. Next, a CNF solution of 5 wt % was cast on the AgNWs network to a thickness of 400 μm, wherein the thickness includes the AgNWs that are embedded into the cast CNF layer, followed by drying at 60° C. to obtain a transparent conductive CNF paper.

Example 1C

Present Method Based on CuNWs and PTFE

CuNWs with diameter of 30 nm and length of 20-60 μm was dispersed in pure ethanol to form a 0.33 mg/mL solution. The solution was ultrasonically treated to obtain a fully dispersed CuNWs. A spray gun was used to spray the weighed CuNWs on a PTFE substrate at room temperature. After successive heating at 45° C. for 3 mins and 130° C. for 5 mins, the CuNWs ring network supported by PTFE film was obtained. Then, a PDMS solution diluted 4 times was bar-coated on the CuNWs network to a thickness of 580 μm, wherein the thickness includes the CuNWs that are embedded in the cast PDMS layer, followed by drying at 80° C. for 2 hrs to obtain a transparent PDMS conductive film with high stretchability.

Example 1D

Present Method Based on AuNWs and Ethylene-Vinyl Acetate (EVA)

AuNWs with diameter of 20 nm and length of 20 μm was dispersed in pure isopropyl alcohol to form a 1.0 mg/mL solution. The solution was ultrasonically treated to obtain a fully dispersed AuNWs. A spraying system was used to spray the weighed AuNWs onto a PC substrate at 60° C. After successive heating at 80° C. for 5 mins and 120° C. for 8 mins, a AuNWs ring network coated PC film was obtained. Thereafter, an EVA solution of 8 wt % was cast on the AuNWs network to a thickness of 800 μm, wherein the thickness includes the AuNWs that are embedded in the cast EVA layer, followed by drying at 60° C. for 30 mins to obtain a highly transparent and stretchable EVA electrode.

Example 1E

Present Method Based on AgNWs and Polyethylene Terephthalate (PET)

Using the method disclosed herein, the AgNWs ring network can also be fabricated on a PET film, which is a frequently used substrate for flexible transparent conductor. As shown in FIG. 12A, the SEM images reveal the uniform network of AgNWs coiled rings on the PET substrate. A resultant conductor with areal density of 24 μg/cm$^2$ AgNWs possesses a sheet resistance of 26-33 Ω/□. The AgNWs conductive network shows a high transparency of 95.8%. This demonstrates that the present method and ring conductive network are universally applicable and compatible with a myriad of substrates.

Example 1F

Present Method Based on AgNWs of Different Dimensions

Using the present method, by tuning surface energy of the substrates and nanowires, and surface tension of the solvent, transparent conducting ring network also can be fabricated from AgNWs of various dimensions. As shown in FIG. 13, AgNW ring networks of various ring sizes are attainable from AgNWs of different diameters (30 nm to 120 nm) and lengths (30 μm to 200 μm). The nanowire amount and ring size can be tuned by controlling the feeding density of the nanowire and the spraying parameters, resulting in a conductive ring network with tunable conductivity and optoelectronic performance. While it is observed that the obtained ring networks are more ordered and bundled when the diameters are smaller (also see FIG. 2A), it is worth noting that the formation of ordered and bundled ring networks also depends on the surface energy of nanowires and substrates, and the surface tension of solvent. Nonetheless, smaller AgNWs with lighter weight can be more easily perturbed by the spraying air flow and create high surface electrostatic charges, leading to formation of more ordered and bundled ring network.

Example 2

Evaluation of Mechanical Stability and Chemical Durability

The foldability of the conductors, including ethyl cellulose conductors, were evaluated by SEM and $R_s$ monitoring versus folding cycles. SEM was used for showing the extreme folding radius and the corresponding morphologies of AgNWs micromesh. $R_s$ monitoring was performed with repeated folding to a radius of 0.5 mm at 180° and −180°. The stretchability evaluation was achieved on a PDMS conductor (200 μm) while monitoring resistance, the AgNWs micromesh was transferred from a PTFE substrate. The adhesion test was carried out by monitoring $R_s$ of the same location that had undergone repeated adhesion-peeling off using 3M VHB tape (thickness 1 mm). Hydrophobic cellulose oleoyl ester protected ethyl cellulose conductors (HEC) was washed with tap water, acidic solution (pH=2) and alkaline solution (pH=12.0), respectively, to evaluate its washability and reliability in harsh environments. The processes were performed by continuous high speed stirring (600 rpm) for 7 days with monitoring of $R_s$ every day.

Example 3

Characterization and Optical-Electrical Measurement

Field emission SEM (JEOL 7600) was employed to reveal the morphologies of AgNWs micromesh. AFM system (Asylum Research, Cypher S) was conducted to evaluate the surface morphology and roughness of conductors. Static contact angle of conductor was measured by a video-based optical contact angle measuring system (Dataphysics OCA15 Pro) with droplets of 6 μL. The transmittance measurement was performed on an UV-vis-NIR Lambda 950 with reference of bare EC film or air. The samples were placed in front of the integrating sphere to include the specular light, diffuse light and haze. $R_s$ of conductors were measured using a portable four-probe meter (M-3 portable four-probe meter, China). Resistance was measured with Fluke Multimeter. The capacitive-touch-panel was fabricated based on a HEC (12×18 cm$^2$), which was bar-coated by hydrophobic cellulose oleoyl ester and attached on a glass substrate, followed by integrating with the controller and computer for touch operation.

Example 4A

Summary on Present Method

As demonstrated through the above non-limiting examples, various electrically conductive nanowires ring network can be developed through the present method, to obtain an outstanding cellulose transparent conductive paper (CTCP) with remarkable foldability.

FIG. 1A schematically illustrates the fabrication process of CTCP.

Small electrically conductive nanowires dispersion in a particular solvent was sprayed on a first polymeric film with low surface energy. With the assistance of spraying and interfacial energy difference under a controlled heating treatment, a controlled solvent evaporation occurred on the electrically conductive nanowires to induce their assembly into a ring network, which can then be transferred to many other polymer substrates to form an embedded electrically conductive nanowire ring network with a flexible substrate.

Alternatively, the obtained electrically conductive nanowire ring network on the first polymeric film may be directly used. The present electrically conductive nanowire ring network has an improved optoelectronic performance and lower haze compared to conventional random AgNWs network. This is not easily achieved as there is a combination of several factors that may affect the assembly of electrically conductive nanowires ring network. For instance, while the thickness of a foldable CTCP may be controlled by casting cellulose solution on the AgNWs ring network, there are various parameters that has to be considered such that the resultant CTCP not only demonstrates advanced optoelectronic performance but also has lower haze compared to conventional random AgNWs network. In the present disclosure, AgNWs may be applied to form an optimized ring network and for studying performance of the resultant transparent conductive electrode.

Example 4B

Discussion on Present Method

Spray-assisted self-assembly for fabricating the micromesh conductor is schematically illustrated in FIG. 1A, small AgNWs (diameter≈30 nm, average length 20 μm) (also see FIG. 1H to 1J) volatile suspension was sprayed on the polymer film (part (i) of FIG. 1A). Due to the difference in surface tension of the solvent and substrate used, a strong capillary flow arises in the rapidly evaporating droplets owing to the assistance of spraying, which effectively suppresses the Marangoni flow to enable the continuous coffee-ring effect in each droplet, giving rise to the AgNWs assembly at edges of each droplet to form an AgNWs-bundled micromesh (see part (ii) of FIG. 1A and enlarged schematic of part (i) of FIG. 1A)). This immediate forming mechanism was confirmed by the image-recorded motion of AgNWs droplet under evaporation and its morphologies after spraying (FIG. 1K to 1N). This spray-assembled AgNWs micromesh can be readily fabricated on various polymer substrates with appropriate nanowires suspension (FIG. 1O).

The transfer of micromesh can be easily carried out using various substrates, depending on the requirements of transparency, flexibility and stretchability (FIG. 1P). In FIG. 1P, EC as a highly transparent substrate (93%, also see FIG. 1Q) was used to support the conducting micromesh via transfer method (see part (iii) of FIG. 1A). Inset of FIG. 1B illustrates a prepared scalable EC conductor with polyethylene terephthalate (PET) roll that can be readily peeled off to form a freestanding transparent conductor with firmly embedded AgNWs bundle micromesh (see part (iv) of FIG. 1A and FIG. 1B to 1E). The continuous AgNWs bundles are randomly coiled into three main types of knots with dimension of 3±2 μm (FIG. 1C), the bundles with diameter of 400±100 nm (FIG. 1D) spread out to form a conductive mesh with firm interconnection. Size distribution analysis indicated that the mesh has a typical optimized ring size of 16±6 μm (FIG. 1R). The knots are the main cross points of AgNWs, which can effectively reduce the nanowire junctions for enhancing both electrical and mechanical interconnections of AgNWs. The present micromesh construction has the unique advantages of requiring low amount AgNWs to achieve a high quality conductor with explicit conductive paths, high transparency and low haze. FIG. 1F presents a representative micromesh conductor (15 cm×25 cm) with uniform $R_s$ of 25.4±1 $\Omega\square^{-1}$, ultrahigh transmittance of 97% and low haze of 2.6% (FIG. 1G), rendering the present conductor a scalable and improved transparent conductor for a wide range of flexible applications.

Example 5

Effect of AgNWs Size on AgNWs Network

During the spraying process, an accelerated spreading occurs in the droplets to enable the AgNWs assembly. Therefore, the motion of AgNWs depends on their dimensions due to the limited driving force of spreading even with additional spraying airflow. To confirm this, AgNWs (length 20 μm) with various diameters from 20 to 100 nm were sprayed on PET film to fabricate EC conductors. As shown in FIG. 2A, AgNWs embedded in the EC film changed from a neat mesh to random networks with an increase of AgNWs diameter, of which, the 30 nm AgNWs formed a semiorder network. Conductive networks with similar $R_s$ based on varying diameters of AgNWs (as shown in FIG. 2B) were systematically fabricated to compare their optoelectronic performance.

FIG. 2C to 2E indicate that the micromesh of 20 nm AgNWs has the best transmittance (97%) and haze (2.6%) in visible light wavelengths. It is reasonable that the haze increases due to a higher extinction coefficient of bigger AgNWs. Thus, only smaller AgNWs (diameter≈30 nm) was demonstrated to assemble into micromesh via the aforementioned process, owing to the lighter weight and higher surface energy of smaller nanowires that can be easily perturbed by capillary flow to create high surface electrostatic charges, leading to the formation of mesh network.

Example 6

Transferability of AgNWs Micromesh

A typical micromesh constructed of 20 μg cm$^{-2}$ AgNWs (diameter 20 nm, length 20 μm) was completely transferred onto an EC film from a PET substrate. The excellent transferability of AgNWs micromesh can be attributed to the matching surface tension (41-44 mN m$^{-1}$) of the PET and EC substrates, which was confirmed on a half bare PET substrate after peeling of the EC film with retention of half the AgNWs micromesh (FIG. 2F).

FIG. 4A also shows the surface morphology of the PET film that was coated with the AgNWs ring network, the left bare substrate is the morphology after peeling off the cellulose film, which indicates AgNWs ring network can be fully transferred and embedded into the cellulose paper as shown in FIG. 4C, which is a nice conductive pattern compared with the bare cellulose paper (FIG. 4B). Owing to the favorable transferability, this AgNWs ring network would be a universal conductive network for all the flexible/foldable polymer substrates with good processing performance.

Example 7

Effect of AgNWs Densities on Optoelectronic Performance

FIG. 3A to 3I demonstrate that micromesh with varying ring size (4-45 μm) can be attained by tuning the droplet size, by controlling the spraying velocity. Furthermore, various dosages of AgNWs can be applied to fabricate conductive micromeshes with different transmittance (86.2-99.6%), indicating that subsequent AgNWs preferentially accumulate on the preceding AgNWs via a continuous coffee-ring effect to maintain the ring structure, a mesh network remains prevalent even with high content of AgNWs (96 μg cm$^{-2}$) (FIGS. 3J and 3K). Compared to conventional transparent conductive electrodes, the present electrode (e.g. the present CTCP) shows better optoelectronic performance as a whole. Particularly, when the sheet resistance is reduced by increasing the amount of AgNWs, the improved transmittance is still maintained due to the open ring structure of the present electrode, thus demonstrating better optoelectronic performance compared to those with random AgNWs network.

FIG. 2I indicates that the present micromesh conductors satisfy both requirements of low $R_s$ (5.2-40 $\Omega\square^{-1}$) and high transmittance (90.5-98.3%), thereby achieving customizable conductive micromesh with optoelectronic performances for different requirements.

Example 8A

Comparison of Optoelectronic Performance of Different AgNWs Network

Conventional random AgNWs network requires high coverage of the whole substrate with nanowires for low transparency and high junction resistance. On the other hand, AgNWs bundles of the present micromesh conductor (which has a ring network of AgNWs) provide for explicit conductive paths with abundant open areas, and advantages on optoelectronic performance was revealed by comparing with the random AgNWs network (FIG. 2J). FIG. 2K shows their $R_s$ based on various AgNWs density. The present micromesh possesses much better conductivity over random network with the same amount of AgNWs, which is attributed to the AgNWs ring structure that can generate a more effective conductive network with the same amount of AgNWs used and having AgNWs bundles mainly intersecting at the knots, suppressing the junction resistance to create a more effective conductive network. As shown in FIG. 2L, with the same $R_s$, the present AgNWs micromesh provides much higher transmittance and lower haze due to the open ring network using only one third of AgNWs consumed for the random network (FIG. 3L), the improvement is particularly obvious below 200 $\Omega\square^{-1}$, which is required for transparent conductors. FIG. 2M is a plot of transmittance of AgNWs micromesh conductors based on various $R_s$. The best performance achieved was 4 $\Omega\square^{-1}$ at T=88%, 9 $\Omega\square^{-1}$ at T=93%, and 21 $\Omega\square^{-1}$ at T=97%, which are at least comparable or even better than ITO based devices and other conventional transparent conductors such as conventional AgNWs, copper nanowires (CuNWs), single-walled carbon nanotubes (SWCNTs), graphene, Ag mesh, Ag grid, and Ag nanotrough. Advantageously, the present micromesh can maintain the high transmittance with reduced $R_s$ by increasing the AgNWs density, in combination with the advanced conductive bundle and suppressed junction resistance, thereby showing remarkable improvement over traditional random AgNWs network.

Example 8B

Evaluation of Present AgNWs Micromesh's Optical Performance

To evaluate the optical performance of the present AgNWs micromesh, the transmittance was compared by optical simulation for the two types of conductive networks of the same $R_s$ (9.5±0.5 $\Omega\square^{-1}$). As shown in FIG. 2N, simulation models of the AgNWs bundle and random AgNWs network were constructed by software "FDTD solutions". The 15 μm ring (micromesh) was treated as straight rod for calculation, the cross-section of the AgNWs bundle forming the ring was assumed to be circular, having a diameter of 400 nm as estimated from SEM observation (see right image of FIG. 3M). Meanwhile, three times the amount of AgNWs were employed for the random network to ensure the same $R_s$. A grid model of the random network was constructed (three-layers) for the simulation (leftmost image of FIG. 2N). The simulation demonstrates that present micromesh has a higher transmittance in the visible range (FIG. 2O), the transmittance matches closely with the corresponding measured value (FIGS. 3O and 2O). Also, the lower extinction cross-section of the present AgNWs micromesh indicates the lower light absorption and scattering (FIG. 3P), rendering the conducting micromesh to be better than conventional random networks of nanowires and this is corroborated by the abovementioned experimental results (FIG. 2J to 2L).

Example 8C

Discussion on Present AgNWs Micromesh's Optical Performance

The purpose of the optical performance simulation, which is to prove that optical transparency of the present AgNWs micromesh is higher than that of conventional random AgNWs network, has already been discussed above and shall not be iterated for brevity.

Referring to FIG. 2Q, the AgNWs micromesh size (ring diameter) achieved are 4~45 μm, of which, AgNWs micromesh with average ring size of 15 μm shows the best optoelectronic performance. So, a diameter of 15 μm is employed for the simulation (left image of FIG. 3M). Also, the cross-section of the nanowire bundle forming this 15-μm-diameter ring is assumed to be circular, having a diameter of 400 nm as estimated from SEM image (top right image of FIG. 3M). It is assumed that the nanowires forming the bundle are parallel to each other (center and rightmost images of FIG. 2N), and a quantity of 10 nanowires are estimated to be aligned along the diameter of the bundle cross-section (rightmost image of FIG. 2N), leading to the structure shown in left image of FIG. 3M.

As shown in rightmost image of FIG. 2N, apart from the one located at the centre, the silver nanowires are aligned along 5 concentric circles, with the inner-most circle having a radius of 40 nm, and the other circles' radius being increased by a step of 40 nm with respect to its preceding inner circle so that the outer-most circle has a radius of 200 nm. Silver nanowires were aligned on each circle such that the centre-to-centre distance between 2 adjacent silver nanowires is 40 nm.

The random AgNWs network was modeled by a uniform grid (leftmost image of FIG. 2N). For the random structure shown in left image of FIG. 3M, it is observed that some places have 4 to 5 layers of AgNWs, while some places have 1 to 2 layers of AgNWs, so an estimate of 3 layers of AgNW is employed in the simulation for the random AgNWs network. The schematic of a 3-layer grid is shown in leftmost image of FIG. 2N where the 3rd layer is horizontally shifted away from the first layer by a distance of half of the grid size so that an AgNW in the 3rd layer is equally far away from the two nearest AgNWs in the 1st layer. It is to be noted that the grid is not limited to those shown in the drawings, i.e. the grid shown in leftmost image of FIG. 2N extends periodically to construct the whole map.

The next step is to compare the transmittance between the two structures shown in FIG. 2N (i.e. the random network and the AgNWs bundle forming the micromesh). The transmittance is related to extinction cross section $\sigma_{ext}(\lambda)$ per unit area through the Beer-Lambert law:

$$\frac{I_T(\lambda)}{I_0(\lambda)} = e^{-\sigma_{ext}(\lambda)} \quad (1)$$

where $I_T(\lambda)$ and $I_0(\lambda)$ are the transmitted and incident light intensity at the wavelength $\lambda$, respectively, $\sigma_{ext}(\lambda)$ is the total extinction cross section per unit area, wherein the plane of this unit area is perpendicular to the propagation of the incident light. So, from equation (1), a smaller extinction cross extinction $\sigma_{ext}(\lambda)$ per unit area results in a higher transmittance.

From the experimental results, it is found that the quantity (μg/cm$^2$) of silver nanowire used in the random structure is about 3 times of that employed in the micromesh structure at the same sheet resistance. Thus, the side length of the smallest square in the grid structure is calculated from equating the total volume of silver nanowires within the square region of 15.4 μm×15.4 μm, which is the square extended by one 15-μm-diameter ring, to 3 times of the volume of the silver nanowires in the 15-μm-diameter ring. The details of calculation of the side length of the smallest square in the grid structure is given below:

First, to calculate the total volume of the silver nanowires in the bundle, the curvature of the nanowire bending is neglected, namely, the silver nanowires forming the bundle are treated as straight rods. So, the height of the nanowire located at the centre as shown in center image of FIG. 2N has a height of 2π×7500 nm, and its volume is given by $\pi r^2 \times (2\pi \times 7500)$ nm$^3$, where r=10 nm is the radius of the nanowire. By assuming that each nanowire shown in rightmost image of FIG. 2N can find a symmetric counterpart with respect to the centre point, the average of this pair of nanowires' volume is equal to the one located at the centre, i.e.

$$1/2[\pi r^2 \times 2\pi \times (7500+\Delta r) + \pi r^2 \times 2\pi \times (7500-\Delta r)] = \pi r^2 \times (2\pi \times 7500) \text{ nm}^3$$

Since there are 95 nanowires in the bundle, the total volume is given by:

$$V_{total} = 95 \times \pi r^2 \times (2\pi \times 7500) \text{ nm}^3 \quad (2)$$

Next, in the square region extended by the 15-μm-diameter ring, having a dimension of 15.4 μm×15.4 μm, the height of a single nanowire is regarded as 15.4 μm=15400 nm, and so the number of nanowires N within this region is given by:

$$N = \frac{3 \times V_{total}}{V_{single}} = \frac{3 \times 95 \times \pi r^2 \times (2\pi \times 7500) \text{nm}^3}{\pi r^2 \times 15400 \text{ nm}^3} = 872 \quad (3)$$

Therefore, the side length of the smallest square in the 3-layer grid structure is given by:

$$L = \frac{15400 \text{ nm}}{872/\text{(layer number)}} = 53 \text{(nm)} \quad (4)$$

To calculate the extinction cross section per unit area for both ring network and random network structures, the basic region for the micromesh structure may be defined as the region 15.4 μm×15.4 μm extended by the 15-μm-diameter ring, and the formula to calculate micromesh structure's extinction cross section $\sigma_{ext,\ ring}$ per unit area (1 μm$^2$) is given below:

$$\sigma_{ext,ring} = \frac{(1000\ nm)^2}{(15400\ nm)^2} \times (\text{extinction cross section per basic region}) \quad (5)$$

while the basic region for the random structure may be defined to be the smallest square whose side length is 53 nm, containing one period of the grid shown in leftmost image of FIG. 2N. With this definition, the formula to calculate random structure's extinction cross section $\sigma_{ext,\ grid}$ per unit area (1 μm$^2$) is given below:

$$\sigma_{ext,grid} = \frac{(1000\ nm)^2}{(53\ nm)^2} \times (\text{extinction cross section per basic region}) \quad (6)$$

So, the next step is to calculate extinction cross section per basic region for the two structures ($\sigma_{ext,\ ring\ per\ basic\ region}$ and $\sigma_{ext,\ grid\ per\ basic\ region}$). For the 15-μm-diameter ring, the 2-dimensional extinction cross-section $\sigma_{ext,\ ring,\ 2D}$ (in nm) for the schematic to shown in rightmost image of FIG. 2N with the software "FDTD Solutions" is simulated first. The dielectric constants for silver can be retrieved from any known reference, and is modified to take into account effect of surface scattering of electrons:

$$\varepsilon_{AgNW} = \varepsilon_{exp} + \frac{\omega_p^2}{\omega(\omega + i\gamma_b)} - \frac{\omega_p^2}{\omega[\omega + i(\gamma_b + \gamma_s)]} \quad (7)$$

where $\varepsilon_{AgNW}$ is silver's dielectric function after taking into account effect of surface scattering of electrons, $\varepsilon_{exp}$ is silver's dielectric function based on the reference used, $\gamma_B$ is the bulk material's damping, $\gamma_S$ is the extra damping caused by surface scattering of electrons, $\omega_P$ is the plasma frequency of silver, $\omega$ is the frequency of the incident light, i is the imaginary number. In the simulation, $\omega_P$ and $\gamma_B$ are assumed to be 9.6 eV and 22.8 meV, respectively, and $\gamma_S$ is given by:

$$\gamma_s = \frac{A v_F}{r} \quad (8)$$

where $v_F$=1.39×10$^6$ m/s is the electron's Fermi velocity for silver, A is a dimensionless fitting parameter and is taken to be 0.6 here as an estimation, r is the radius of a nanosphere, which in this case, is set to be AgNW's radius to provide a rough estimation.

The propagation direction of the incident light is normal to the major axis of the silver nanowire bundle, and the polarization of incident light has equal components along and perpendicular to the major axis of the silver nanowire bundle. The maximum mesh size for the mesh override region is 1 nm. And the extinction cross section of the 15-μm-diameter ring is then obtained through multiplying $\sigma_{ext,\ ring,\ 2D}$ by the 15-μm-diameter ring's perimeter:

$$\sigma_{ext,ring\ per\ basic\ region} = \sigma_{ext,ring,2D} \times 15000\pi\ nm^2 \quad (9)$$

Equation (9) is valid under the assumption that 2 bundles of nanowires separated far away apart do not couple to each other. This is verified by the simulation result shown in FIG. 3O, where extinction cross section (in nm) for one isolated bundle of silver nanowires is compared to half of that of two bundles separated 4 μm to away from each other, which is the minimum diameter of the rings achieved via present spray-assisted self-assembly. Although wave-like feature is observed in the extinction spectrum for the two bundles, which may be due to coupling between them or simulation errors such as interference of light reflected from the boundary of the simulation region, the two spectra agree with each other well enough to validate equation (9).

For the random network, to simulate its extinction cross section per basic region, a periodic structure is set up, i.e. although the monitors only record the cross sections of one period of the grid, optical coupling effects from other periods are also included. In the simulation, the propagation direction of incident light is perpendicular to the plane defined by any two silver nanowires in the same layer, and its polarization is parallel to one of the two axes along which the silver nanowires shown in leftmost image of FIG. 2N are aligned. Dielectric constants and mesh size are the same as in the case of 15-μm-diameter ring.

Thus, with extinction cross section per basic region simulated for both structures ($\sigma_{ext,\ ring\ per\ basic\ region}$ and $\sigma_{ext,\ grid\ per\ basic\ region}$), the extinction cross section per unit area for the micromesh structure ($\sigma_{ext,\ ring}$), and for the random structure ($\sigma_{ext,\ grid}$) are calculated by equations (5) and (6), and are compared in FIG. 3P.

It is obvious that the AgNWs micromesh has a lower extinction cross section in the visible wavelength range, which means lower light absorption and scattering, reasonably rendering the lower haze and higher transmittance. To confirm the reliability of this simulation, the transmittances for the two structures were further calculated by equation (1) and compared in FIG. 2O.

By observing FIG. 2O, it is clear that the micro-mesh structure has a higher transmittance in the visible wavelength range. The simulated results matches with the measured transmittances, demonstrating the improvement provided by the present micromesh conductor that is consistent with the experimental results of FIG. 2J to 2L.

Example 9

Morphology of CTCP with Optimized AgNWs Ring Network

The resultant micromesh conductor with EC substrate was systematically characterized as shown in FIG. 2G to 2O. The SEM tilted view image (FIG. 2G) indicates that the continuous AgNWs micromesh was firmly embedded into the EC substrate, and the inset shows a well adhered AgNWs bundle maintained with aligned structure, rendering enhanced mechanical stability and explicit conductive path. EDX element mapping confirmed the micromesh patterns are composed of elements of C, O, and Ag (FIG. 2P). The AFM image further reveals a flat topography of EC conductor with low surface roughness (RMS, 6.6±4.6 nm) (FIG. 2H), which is much lower compared to the AgNWs mesh before transfer (RMS, 23.8±4.6 nm) (see bottom left image and bottom right graphs of FIG. 2F), generating low scattering with excellent transmittance and low haze (FIG. 2Q). FIG. 4D to 4E, which coincide with FIG. 2G showing the SEM tilted view image, present the CTCP with AgNW ring network at a tilt angle of 5°, specifically demonstrating that AgNW coiled ring network maintains its uniformity even on the wrinkled cellulose substrate, suggesting its embedded structure might ensure a foldable stability for the CTCP.

Example 10A

Properties Evaluation—Bendability/Foldability

The advantages of embedded AgNWs micromesh also translate into mechanical durability, including bendability, foldability, stretchability, and adhesion, which may be considered to make the transparent conductors more adaptable for deformable electronics. First, the bendability and foldability were evaluated based on an EC conductor with embedded AgNWs micromesh (FIG. 5A to 5H). An EC conductor ribbon (1.5×18 cm²) electrode can maintain the lighted LEDs with consistent brightness even after being coiled around an ink cartridge of a ballpoint pen (diameter 5 mm) (FIG. 5A), suggesting a coiled micromesh with 2.5 mm bending radius maintains a stable conductivity. Furthermore, an EC conducting paper (15×25 cm²) served as electrode to light up the LEDs, which can be rolled (bended) into a roll with diameter of 1.5 cm, following by extremely crumpling (folded) into a spitball, it can recover to a flat paper with steady conductivity, enabling the lighted LEDs with constant brightness (FIGS. 5A and 5B). SEM further revealed the micromorphologies of AgNWs micromesh conductor under extreme folding. The folding angle is defined as 180° when the micromesh is folded face to face while −180° is assigned as back to hack folding (FIG. 5C). As shown in FIG. 5D, an EC conductor (thickness 15 μm) was folded at 180° with insert of a human hair (diameter≈70 μm), no mechanical failures were observed on the EC substrate with internal folding radius of 20 μm. On the other hand, it was folded at −180° to make the AgNWs micromesh expose on the external, in this case, EC substrate possesses with external folding radius of 10 μm without breakage fracture. More importantly, AgNWs micromesh sustains the extreme folding with retainable fine open ring network, no delamination occur owing to the ductile bundled-AgNWs with firmly embedded structure (FIG. 5I) as well as the enhanced adhesion between the nanowires. Furthermore, 1000 folding cycles (180° and −180°) with a folding radius of 0.5 mm were applied to the EC conductors while measuring $R_s$, $\Delta R/R_0$ factors of 11.8% and 16.3% indicated there is no obvious degradation in electrical conductivity (FIG. 5E), evidently demonstrating that the ahovementioned EC conductor can maintain the lighted LEDs regardless of various bendable/foldable deformations.

Example 10B

Properties Evaluation—Stretchability

To evaluate stretchability of AgNWs micromesh, it was embedded into a PDMS substrate via transferring from the polytetrafluoroethylene (PTFE) film. The maximum applied strain was performed to 100%, FIG. 6A shows the resistance variation $\Delta R/R_0$ of AgNWs micromesh and random AgNWs network upon stretching. Both the conductors maintain good conductivity even at 100% tensile strain. FIG. 5F shows a 420% increase of resistance occurred on the random AgNWs network with uniaxial stretching of 50% strain. In comparison, AgNWs micromesh showed lesser increase of resistance under the same strain owing to the better deformation of ring network, its resistance increased by 46% after being stretched to 50% strain, which retained good conductivity to maintain the lighted LEDs (insets of FIG. 5F). SEM images confirm there are no defects on the stretched (50% strain) micromesh and the corresponding AgNWs bundles (FIG. 6B to 6F).

Example 10C

Properties Evaluation—Tensile Strain

Tensile strain est was performed on the EC conductor before examining the adhesion of AgNWs micromesh. FIG. 5G indicates the EC conductor (thickness 10 μm) possesses high strength and a comparable Young modulus to that of a commercial polyimide (PI) film (1675.6 MP). Excellent tensile strength and tensile strain (19.3%) make EC film an ideal protective substrate for conductive mesh, rendering the EC conductor a glorious candidate for sustaining the adhesion evaluation of AgNWs micromesh. 3M VHB tape (width 2 cm) was pre-adhered on an EC conductor ribbon (1.5 cm×18 cm) with a series connection of lighted LEDs, followed by peeling it off to remove the conductive micromesh. Unchanged LEDs brightness indicates the excellent adhesion of AgNWs micromesh (FIG. 5H). 100 testing cycles of adhesion test were applied to the EC conductors while measuring $R_s$, there is no obvious degradation in electrical conductivity (FIG. 5H). SEM confirms that the AgNWs micromesh retains the fine coiled ring network even after 100 cycles of testing, peeled AgNWs cannot be found on the tested 3M tape (FIGS. 6G and 6H). Improved mechanical durability of AgNWs micromesh to substrate is attributed to the neat embedded structure, providing a fixed conducting network with stable interconnection to accommodate various extreme mechanical deformations and external damages.

Example 10D

Properties Evaluation—Chemical Reliability

Chemical reliability is another particular concern for transparent conductors, which are evaluated by examining their long-term stability and washability in extreme conditions. As shown in FIG. 7A, comparison of the electrical stability of the three AgNWs micromesh conductors under various environmental exposure was carried out. Curve (i) is a PET conductor with unembedded AgNWs micromesh, which experienced accelerated degradation as the unembedded AgNWs were exposed to moisture, oxygen, sulfide and light, all of which have been recognized as failure factors of metal nanowires. In comparison, the EC conductor with embedded AgNWs micromesh (curve (ii)) shows a much better durability, $\Delta R/R_0$ increased to 0.6 after exposure of four months. Hence, the present embedded AgNWs electrode is considerably chemically durable compared to conventional electrodes, owing to the embedded protection of EC substrate. Better conductivity reliability may be pursued for more practical applications.

Example 11

Coating with Hydrophobic Cellulose Oleoyl Ester (HCOE)

A transparent coating of HCOE (FIG. 8A to 8C), which can be fabricated as a dense waterproof layer and have different thickness depending on needs, provides effective protection for various sensitive micro/nanomaterials, such as the present AgNWs transparent conductor disclosed herein.

As shown in FIG. 7A, an EC conductor embedded AgNWs micromesh was coated with HCOE (i.e. to form HEC), showing excellent conducting stability even after exposure to air for six months (curve (iii)), and no oxidized particles can be observed in SEM image, confirming its significantly improved reliability compared to bare micromesh conductor (FIGS. 9A to 9C). This is because the AgNWs is encapsulated within the EC substrate and the HCOE, and such durability may also be demonstrated by a PET substrate having AgNWs coated thereon and covered over by HCOE as the AgNWs get entirely encapsulated between the PET substrate and HCOE. Hence, the HCOE serves as a protective layer.

More interestingly, HCOE can improve the transmittance and lower the haze of conductor without compromising sheet resistance (FIGS. 9D and 9E). This can be explained by the SEM and AFM measurements (FIGS. 7B and 7C). A HEC (thickness 16 μm) was folded to internal radius of 5 μm at −180°, the enlarged folded area has a well maintained AgNWs ring network at the external radius (i.e. 16 μm), the HCOE thin layer protected the clear micromesh pattern against environmental degradation, giving rise to the unchanged conductivity (FIG. 7A). The surface topography was further revealed by AFM. A flatter surface with a roughness of 3.6±2.7 nm is obtained by means of HCOE coating (FIG. 7C), rendering a lower interface scattering to improve the optical property.

More importantly, HCOE protecting layer brings about a washable EC conductor with reliable conductivity. FIG. 7D demonstrates severe washing with 600 rpm of stirring on the conductor (15×25 cm$^2$) for 24 hrs, and the conductor remains unbroken without any change in sheet resistance (25.58 $\Omega\square^{-1}$). Even when the conductors were washed in harsh conditions of acidic solution (pH=2) and/or alkaline solution (pH=12.0), there were no deterioration of their sheet resistance, and $\Delta R/R_0$ recorded from the acidic and alkaline washing conditions are 0.21 and 0.07 after continuous washing for 7 days (FIG. 7E). SEM confirmed there are no failures of EC substrate and HCOE coating (FIGS. 10A and 10B), which is attributed to the stability of HCOE coating in the water-based conditions, enabling a reliable AgNWs conductor for practical usage.

Example 12

Commercial and Potential Applications

The fabricating process of the present electrically conductive nanowires ring network is straightforward, controllable, scalable and compatible for large-scale manufacturing.

Compared to conventional materials, the present electrically conductive nanowires ring network possesses more explicit conductive paths, which reduces use of raw materials to achieve effective conductivity and high optoelectronic performance simultaneously, thereby saving costs.

The present electrically conductive nanowires ring network is compatible with various polymer substrates by spraying, and can be easily transferred to any other flexible and/or foldable substrates via solution casting, to obtain electrically conductive nanowires embedded flexible and/or foldable electrode with good adhesion and conductivity, thus providing many choices, depending on needs of its application.

The AgNW ring network/ethyl cellulose as disclosed herein, demonstrated excellent optoelectronic performance, possesses higher transmittance and lower haze compared to conventional random AgNWs network. The AgNW ring network/ethyl cellulose as disclosed herein also shows better performance compared to conventional transparent conductive electrodes. The AgNW ring network/ethyl cellulose as disclosed herein is of an even higher quality than ITO film.

The present method is a feasibly low cost technique for large scale manufacturing of transparent conductive electrodes, and the present AgNW ring networks is a promising replacement of ITO for next generation flexible and/or foldable electronics.

The present scalable and facile micromesh conductor, with or without encapsulation of the micromesh (i.e. covered over) by HCOE, has many advantages that are not affected by how it is folded, bent, or stretched. Such advantages include, but are not limited to, high transparency, improved foldability, considerable stretchability and durable conductivity. Encapsulation of the micromesh by HCOE further decreases its susceptibility to oxidation, making it sufficiently robust for prolonged environmental exposure. Thus, the present conductor, including a micromesh that is simply coated on a PET substrate, is promising for use in various applications that require deformable optoelectronic device, such as capacitive touch-sensing which has become popular in touch electronics. A deformable and waterproof capacitive-touch-panel based on the present transparent HEC has been used to demonstrate the advantages and its application.

FIG. 11A schematically illustrates the configuration of the touch panel, it was integrated with computer and a controller of capacitive touch panel (FIG. 11B), which can be operated with a human finger to write words voluntary (FIG. 11C). Furthermore, it maintains normal touch functions after being subjected to extreme deformations and even after a coffee spill (FIG. 11D to 11F). This indicates the excellent mechanical and electrical durability of the present transparent conductor, rendering it suitable for a wide variety of applications in flexible optoelectronic devices.

In conclusion, by using the spray-assisted interface self-assembly, a scalable and customizable electrically conductive nanowires bundle micromesh can be developed for constructing high-quality transparent electrode. The conductive nanowires micromesh, where its ring size is controllable, can be realized on various substrates for subsequent transfer to another highly deformable/foldable substrate, depending on requirements of its application. With a rich choice of substrates, coupled with the AgNWs mesh that is, for example, embedded in the substrate or covered with a protective layer such as HCOE, the resultant transparent conductor provides for competitive advantages on optoelectronic performance, mechanical durability and chemical reliability over those conventionally composed of random AgNWs networks. Facile fabrication of this innovative AgNWs micromesh conductor enables a feasible low-cost technique for large-scale manufacturing of transparent conductors, making the present conductor a promising replacement of ITO used in various applications of flexible electronics.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method of producing a transparent conductive electrode, the method comprising:
spraying a suspension of electrically conductive nanowires on a polymer substrate to form droplets thereon, wherein each of the droplets has a periphery which is in contact with one or more peripheries of another droplet, wherein the suspension comprises a polar solvent, wherein the polymer substrate and the polar solvent produce a surface tension which directs the electrically conductive nanowires to arrange at the periphery of each of the droplets to form a network of connected ring structures;
removing the polar solvent from the polymer substrate to form a micromesh comprising the electrically conductive nanowires which are retained in the form of the network of connected ring structures; and
coating a transparent protective layer on the micromesh, wherein the transparent protective layer comprises a hydrophobic cellulose oleoyl ester.

2. The method of claim 1, wherein spraying the suspension comprises dispersing the electrically conductive nanowires in the polar solvent, wherein the polar solvent comprises water, methanol, aniline, acetone, chloroform, propanol, ethyl acetate, ethanol, or tetrahydrofuran.

3. The method of claim 1, wherein the electrically conductive nanowires are (i) comprised of carbon nanowires, carbon nanofibers, or metallic nanowires comprising silver nanowires, copper nanowires, gold nanowires, or nanowires composed of a metal alloy, and/or (ii) comprise an average diameter ranging from 20 nm to 120 nm.

4. The method of claim 3, further comprising sintering the metallic nanowires of the micromesh, wherein sintering the metallic nanowires comprises exposing the micromesh to a temperature ranging from 50° C. to 200° C.

5. The method of claim 4, wherein exposing the micromesh to a temperature ranging from 50° C. to 200° C. is carried out for more than 0 mins and up to 10 mins.

6. The method of claim 1, wherein the polymer substrate comprises polyethylene terephthalate, polypropylene, polyester, nylon, polyvinyl chloride, polycarbonate, polyethylene, polyhexafluoropropylene, fluorinated ethylene propylene, polytrifluoroethylene, chlorotrifluoroethylene, polydimethyl siloxane, natural rubber, paraffin, polyvinylidene fluoride, polyvinyl fluoride, polychlorotrifluoroethylene, poly butylene terephthalate, nylon-11 (polyundecanamide), surlyn ionomer, polystyrene, polyacrylate, polyvinyl alcohol, polyphenylene sulfide, cellulose acetate, polyvinylidene chloride, polyimide, polysulfone, polymethylmethacrylate, nylon-6 (polycaprolactam) or polytetrafluoroethylene.

7. The method of claim 1, wherein spraying the suspension comprises spraying the suspension at a spraying rate ranging from 1 μL/min to 100 mL/min.

8. The method of claim 1, wherein spraying the suspension is carried out at a temperature ranging from 10° C. to 200° C.

9. The method of claim 1, wherein removing the polar solvent comprises:
evaporating the polar solvent; or
heating the polymer substrate, wherein heating the polymer substrate comprises exposing the polymer substrate to a temperature ranging from 10° C. to 100° C.

10. The method of claim 1, further comprising transferring the micromesh to a flexible transparent substrate, wherein transferring the micromesh comprises forming the flexible transparent substrate on the micromesh.

11. The method of claim 10, wherein forming the flexible transparent substrate comprises depositing a solution adjacent to the micromesh and drying the solution to form the flexible transparent substrate, wherein the solution comprises cellulose, silk protein, chitosan, gelatin, starch, polydimethylsiloxane, polyvinyl alcohol, polyvinyl pyrrolidone, polyvinyl butyral, ethylene-vinyl acetate, polyurethane, styrene ethylene butylene styrene, ecoflex, amorphous copolyester, liquid silicone rubber, cyclic olefin copolymers, ionomer resin, or derivatives thereof.

12. The method of claim 10, further comprising separating the flexible transparent substrate with the micromesh from the polymer substrate.

13. The method of claim 1, wherein the network of connected ring structures is a network of continuously connected ring structures.

14. A transparent conductive electrode comprising:
a micromesh coated on or embedded in a transparent substrate, wherein the micromesh comprises electrically conductive nanowires arranged to form of a network of connected ring structures, wherein each of the ring structures is connected to at least one other ring structure by one or more knots, wherein each of the one or more knots is defined by an entanglement of the electrically conductive nanowires extending from each of the ring structures which are connected; and
a transparent protective layer disposed on the micromesh, wherein the transparent protective layer comprises a hydrophobic cellulose oleoyl ester.

15. The transparent conductive electrode of claim 14, wherein the electrically conductive nanowires comprise (i) an average diameter ranging from 20 nm to 120 nm, and/or (ii) carbon nanowires, carbon nanofibers or metallic nanowires comprising silver nanowires, copper nanowires, gold nanowires, or nanowires composed of a metal alloy.

16. The transparent conductive electrode of claim 14, wherein the transparent substrate comprises cellulose, silk protein, chitosan, gelatin, starch, polydimethylsiloxane, polyvinyl alcohol, polyvinyl pyrrolidone, polyvinyl butyral, ethylene-vinyl acetate, polyurethane, styrene ethylene butylene styrene, ecoflex, amorphous copolyester, liquid silicone rubber, cyclic olefin copolymers, ionomer resin, or derivatives thereof.

17. The transparent conductive electrode of claim 14, wherein each of the ring structures is comprised of a bundle of electrically conductive nanowires shaped to form a ring, wherein the bundle of electrically conductive nanowires has a first cross-sectional diameter, wherein the entanglement defining each of the one or more knots has a second cross-sectional diameter, wherein the first cross-sectional diameter is smaller than the second cross-sectional diameter.

18. The transparent conductive electrode of claim 14, wherein the network of connected ring structures is a network of continuously connected ring structures.

* * * * *